(12) United States Patent
Zhang et al.

(10) Patent No.: US 12,363,990 B2
(45) Date of Patent: Jul. 15, 2025

(54) UPPER AND LOWER GATE CONFIGURATIONS OF MONOLITHIC STACKED FinFET TRANSISTORS

(71) Applicant: International Business Machines Corporation, Armonk, NY (US)

(72) Inventors: Chen Zhang, Guilderland, NY (US); Junli Wang, Slingerlands, NY (US); Ruilong Xie, Niskayuna, NY (US); Dechao Guo, Niskayuna, NY (US); Sung Dae Suk, Watervliet, NY (US)

(73) Assignee: International Business Machines Corporation, Armonk, NY (US)

( * ) Notice: Subject to any disclaimer, the term of this patent is extended or adjusted under 35 U.S.C. 154(b) by 679 days.

(21) Appl. No.: 17/569,846

(22) Filed: Jan. 6, 2022

(65) Prior Publication Data
US 2023/0215949 A1    Jul. 6, 2023

(51) Int. Cl.
| H10D 84/01 | (2025.01) |
| H10D 30/62 | (2025.01) |
| H10D 84/03 | (2025.01) |
| H10D 84/85 | (2025.01) |
| H10D 88/00 | (2025.01) |

(52) U.S. Cl.
CPC ..... *H10D 84/0193* (2025.01); *H10D 30/6215* (2025.01); *H10D 84/038* (2025.01); *H10D 84/853* (2025.01); *H10D 88/00* (2025.01); *H10D 88/01* (2025.01)

(58) Field of Classification Search
CPC ........... H10D 30/6215; H10D 30/0241; H10D 30/0245; H10D 84/0158; H10D 84/0193; H10D 84/038; H10D 84/834; H10D 84/853; H10D 88/00; H10D 88/01
See application file for complete search history.

(56) References Cited

U.S. PATENT DOCUMENTS

| 9,356,027 | B1 * | 5/2016 | Cheng | H10D 86/011 |
| 9,627,270 | B2 * | 4/2017 | Cheng | H10D 84/0172 |
| 10,236,217 | B1 * | 3/2019 | Ando | H10D 62/121 |
| 10,297,513 | B1 * | 5/2019 | Yamashita | H10D 84/0172 |

(Continued)

FOREIGN PATENT DOCUMENTS

| CN | 110945664 A | 3/2020 |
| CN | 112151609 A | 12/2020 |

OTHER PUBLICATIONS

International Search Report and Written Opinion dated Mar. 22, 2023, for International Application No. PCT/CN2023/070641, filed Jan. 5, 2023.

*Primary Examiner* — Earl N Taylor
(74) *Attorney, Agent, or Firm* — Matthew Zehrer

(57) ABSTRACT

A semiconductor device includes a FinFET fin. The same FinFET fin is associated with a bottom FinFET and a top FinFET. The FinFET fin includes a lower channel portion, associated with the bottom FinFET, a top channel portion, associated with the top FinFET, and a channel isolator between the bottom channel portion and the top channel portion. A lower gate includes a vertical portion that is upon a sidewall of the bottom channel portion. An isolation layer may be formed upon the lower gate if it is desired for the top FinFET fin and the bottom FinFET fin to not share a gate. An upper gate is upon the top channel portion and is further upon the isolation layer, if present, or is upon the lower gate.

20 Claims, 40 Drawing Sheets

(56) References Cited

U.S. PATENT DOCUMENTS

| | | | |
|---|---|---|---|
| 10,304,844 B1* | 5/2019 | Balakrishnan | H10D 30/684 |
| 10,636,804 B1* | 4/2020 | Reznicek | H10B 43/30 |
| 10,818,674 B2* | 10/2020 | Mann | H10D 30/62 |
| 10,833,078 B2* | 11/2020 | Smith | H10D 30/6735 |
| 11,164,870 B2* | 11/2021 | Wu | H10D 88/01 |
| 11,404,319 B2* | 8/2022 | Lilak | H10D 64/017 |
| 2010/0219479 A1* | 9/2010 | Nuttinck | H10D 30/6217 |
| | | | 257/E29.264 |
| 2018/0277540 A1* | 9/2018 | Jagannathan | H10D 84/0167 |
| 2018/0323195 A1* | 11/2018 | Mehandru | H10D 30/60 |
| 2020/0006331 A1* | 1/2020 | Lilak | H10D 62/235 |
| 2020/0161323 A1* | 5/2020 | Reznicek | H10D 84/038 |
| 2020/0235013 A1* | 7/2020 | Lilak | H10D 30/0241 |
| 2020/0259013 A1* | 8/2020 | Reznicek | H10D 84/0158 |
| 2020/0411511 A1* | 12/2020 | Rachmady | H10D 84/834 |
| 2021/0091079 A1* | 3/2021 | Wu | H10D 84/0184 |
| 2021/0111028 A1* | 4/2021 | Xie | H10D 30/0215 |
| 2021/0202500 A1* | 7/2021 | Chanemougame | H10D 84/85 |

\* cited by examiner

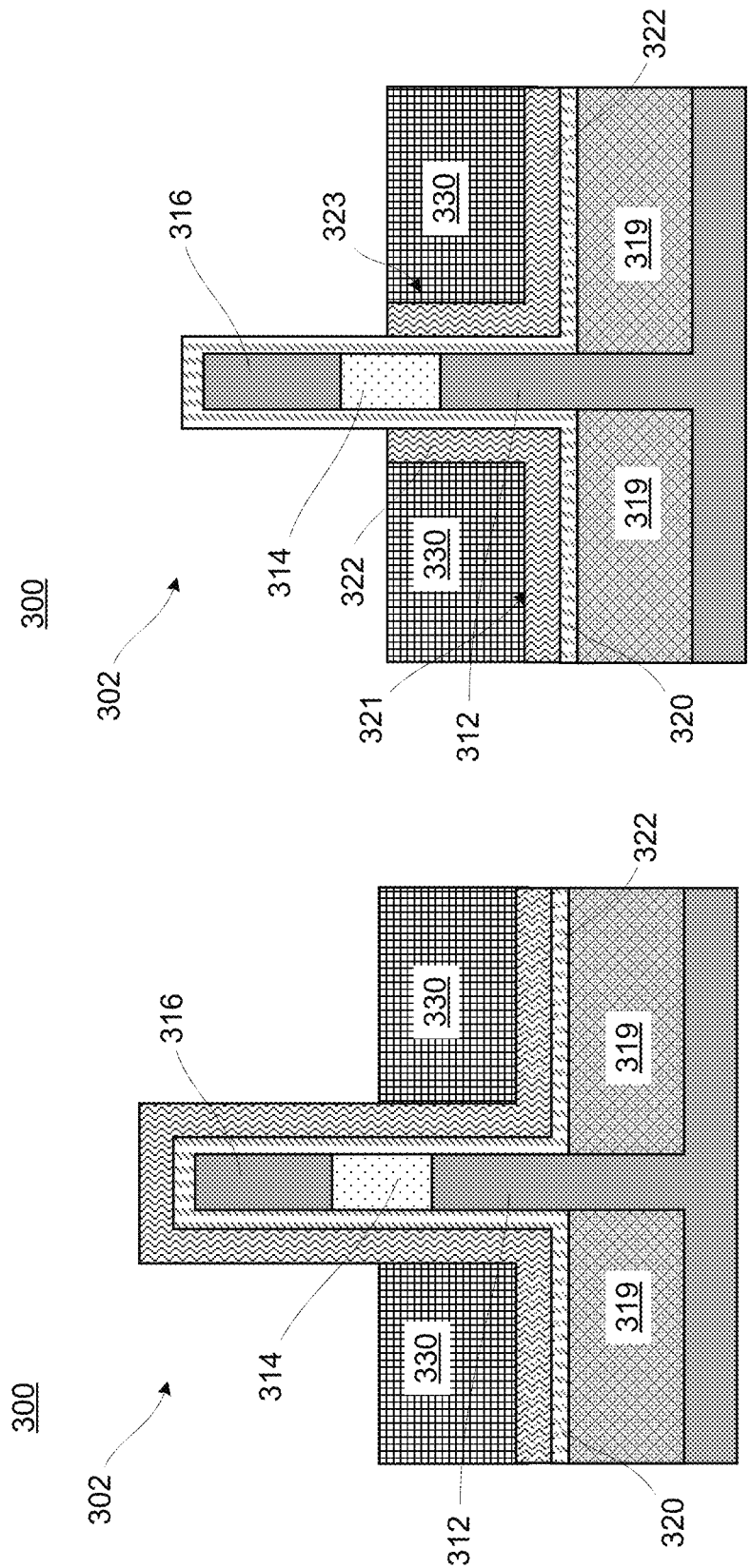

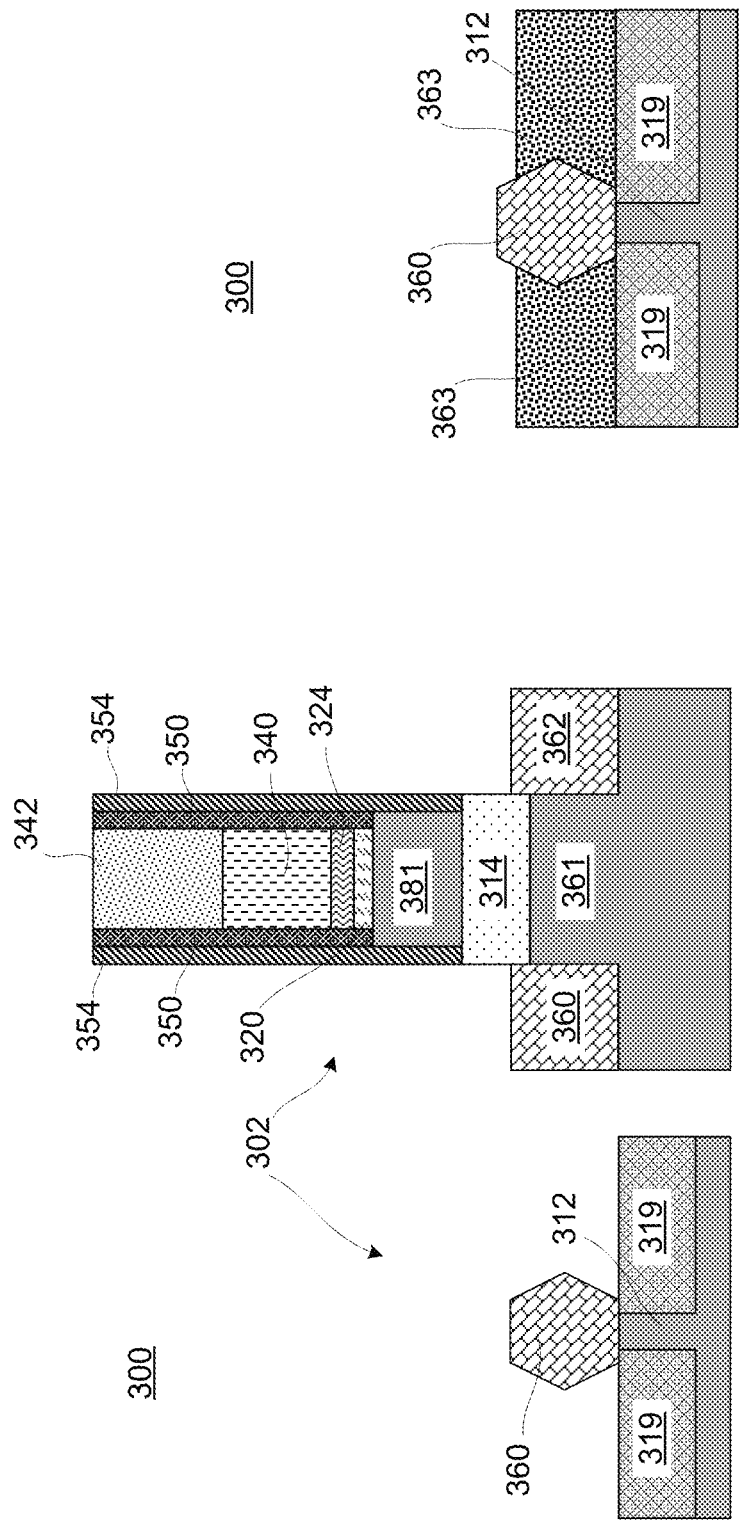

UPPER AND LOWER GATE CONFIGURATIONS OF MONOLITHIC STACKED FinFET TRANSISTORS

BACKGROUND

Various embodiments of the present application generally relate semiconductor device fabrication methods and resulting structures. More specifically the various embodiments relate to monolithically stacked FinFETs with shared and/or non-shared lower gate(s) and a shared and/or non-shared upper gate.

SUMMARY

In an embodiment of the present invention, a semiconductor device is presented. The semiconductor device includes a first fin, a second fin, a first lower gate, a second lower gate, a isolation layer, and an upper gate. The first fin includes a first bottom channel portion, a first top channel portion, and a first channel isolator between the first bottom channel portion and the first top channel portion. The second fin includes a second bottom channel portion, a second top channel portion, and a second channel isolator between the second bottom channel portion and the second top channel portion. The first lower gate includes a first vertical portion upon the first bottom channel portion and upon the first channel isolator. The second lower gate includes a second vertical portion upon the second bottom channel portion and upon the second channel isolator. The isolation layer is upon the second lower gate and upon the second channel isolator. The upper gate is upon the first lower gate, upon the first channel isolator, upon the first top channel portion, upon the isolation layer, and upon the second top channel portion.

In an embodiment of the present invention, another semiconductor device includes a fin, a first lower gate, a second lower gate, an isolation layer, and an upper gate. The fin includes a bottom channel portion, a top channel portion, and a channel isolator between the bottom channel portion and the top channel portion. The first lower gate includes a first vertical portion upon the bottom channel portion and upon the channel isolator. The second lower gate includes a second vertical portion upon the bottom channel portion and upon the channel isolator. The isolation layer is upon the first lower gate, upon the second lower gate, and upon the channel isolator. The upper gate is upon the isolation layer, upon the channel isolator, and upon the top channel portion.

In another embodiment of the present invention, a semiconductor device fabrication method is presented. The method includes forming a first fin, forming a second fin, forming a shallow trench isolation region, forming a lower gate layer, separating the lower gate layer and forming a first lower gate and a second lower gate, forming fill material, forming an isolation layer, and forming an upper gate. The first fin includes a first bottom channel portion, a first top channel portion, and a first channel isolator between the first bottom channel portion and the first top channel portion. The second fin includes a second bottom channel portion, a second top channel portion, and a second channel isolator between the second bottom channel portion and the second top channel portion. The shallow trench isolation region is formed between the first fin and the second fin. The lower gate layer is formed upon the first fin, upon the shallow trench isolation region, and upon the second fin. The lower gate layer is separated thereby forming the first lower gate that includes a first vertical portion upon the first bottom channel portion and a first horizontal portion upon the shallow trench isolation region and thereby forming a second lower gate that includes a second vertical portion upon the second bottom channel portion and a second horizontal portion upon the shallow trench isolation region. The fill material is formed upon the shallow trench isolation layer between the first lower gate and the second lower gate. The isolation layer is formed upon the second lower gate and upon the fill material. The upper gate is formed upon the first lower gate, upon the first top channel portion, upon the isolation layer, and upon the second top channel portion.

These and other embodiments, features, aspects, and advantages will become better understood with reference to the following description, appended claims, and accompanying drawings.

BRIEF DESCRIPTION OF THE DRAWINGS

FIG. 19 through FIG. 45 depicts cross-sectional views of a semiconductor device shown after respective fabrication operations, in accordance with one or more embodiments.

DETAILED DESCRIPTION

Figure 1:
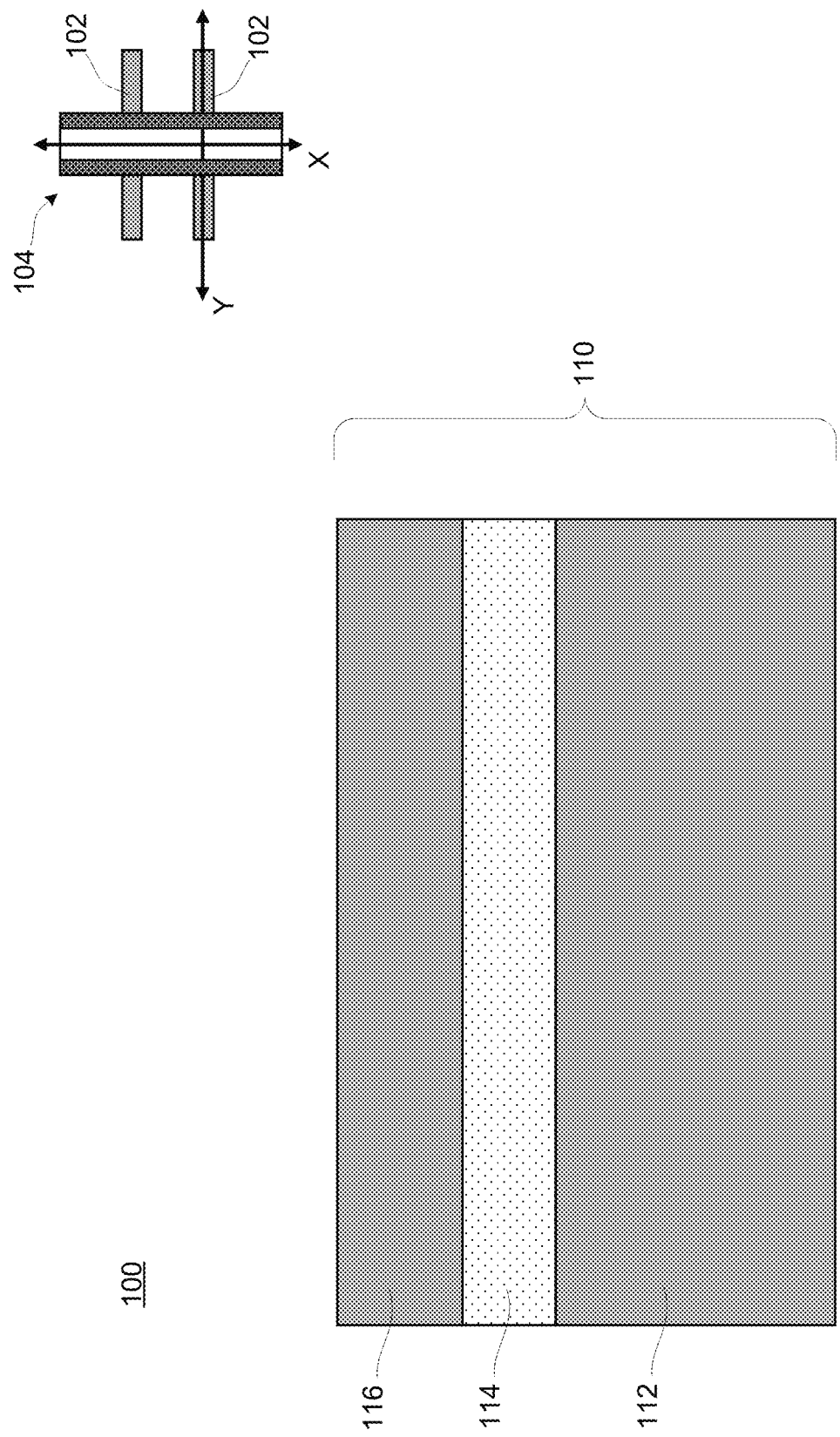
FIG. 1 through FIG. 17 depicts cross-sectional views of a semiconductor device shown after respective fabrication operations, in accordance with one or more embodiments.

Three-dimensional (3D) monolithic integration in which transistors are stacked on top of each other is a promising approach for continue transistor density scaling. In a 3D stacked fin CMOS device, a self-aligned stack of fins can be formed where the top tier and bottom tier fins are used for devices with opposite conductivity types (i.e., p-type and n-type), respectively. Such an approach not only allows smaller footprint by stacking one type of fin field effect transistors (FinFETs) (e.g., p-type FinFETs) on top of a complementary type of FinFETs (e.g., n-type FinFET), but also permits use of different channel materials for two types of FinFETs simply by bonding appropriate device layers. In a stacked fin CMOS device, the n-type FinFET and the p-type FinFET may or may not share a common gate electrode. Because a threshold voltage of a FinFET is primarily determined by the work function of the gate metal used, and in order to obtain a desired threshold voltage for either n-type or p-type FinFET, two metal gate structures having different work functions are typically used. It is challenging, however, to form independently adjustable dual work function metal gate structures in the stacked fin CMOS device due to the difficulty in selective removal of one of the metal gate structures by lithography and etching in vertically stacked devices. Therefore, there remains a need for an improved method for fabricating shared or non-shared gate structures for a stacked fin CMOS device.

It is understood in advance that although a detailed description is provided herein of an exemplary stacked FinFET architecture, implementation of the teachings recited herein are not limited to the particular FET architecture described herein. Rather, embodiments of the present invention are capable of being implemented in conjunction with any other appropriate type of FET device now known or later developed.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" upon layer "B" include situations in which one or more intermediate layers (e.g., layer "C") is between layer "A" and layer "B" as long as the relevant characteristics and functionalities of layer "A" and layer "B" are not substantially changed by the intermediate layer(s).

For purposes of the description hereinafter, the terms "upper," "lower," "right," "left," "vertical," "horizontal," "top," "bottom," and derivatives thereof relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact," or the like, means that a first element, such as a first structure, and a second element, such as a second structure, are connected without any intermediary conducting, insulating or semiconductor layers at the interface of the two elements. It should be noted that the term "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, substantial coplanarity between various materials can include an appropriate manufacturing tolerance of ±8%, ±5%, ±2%, or the like, difference between the coplanar materials.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a more detailed description of technologies that are more specifically relevant to aspects of the present invention, transistors are semiconductor devices commonly found in a wide variety of ICs. A transistor is essentially a switch. When a voltage is applied to a gate of the transistor that is greater than a threshold voltage, the switch is turned on, and current flows through the transistor. When the voltage at the gate is less than the threshold voltage, the switch is off, and current does not flow through the transistor.

Semiconductor devices can be formed in the active regions of a wafer. The active regions are defined by isolation regions used to separate and electrically isolate adjacent semiconductor devices. For example, in an integrated circuit having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the channel region is a gate. The gate and the body are spaced apart by a gate dielectric layer. The channel connects the source and the drain, and electrical current flows through the channel from the source to the drain. The electrical current flow is induced in the channel region by a voltage applied at the gate.

One or more embodiments of the invention also provide fabrication methods and resulting stacked FinFET structures that may be formed with shared or non-shared gates.

FIG. 1 depicts a cross-sectional view of a semiconductor device 100 shown after respective fabrication operations, in accordance with one or more embodiments. At the present fabrication operations, a substrate 110 is formed or otherwise provided. Substrate 110 may be a semiconductor on insulator (SOI) substrate, or the like. Substrate 110 may include a first semiconductor layer 112, a dielectric layer 114, and a second semiconductor layer 116. The first semiconductor layer 112 and the second semiconductor layer 116 are used to form semiconductor fins for a stacked fin CMOS device, as described in more detail below. The dielectric layer 114 serves as an insulator between the first semiconductor layer 112 and the second semiconductor layer 116.

The first semiconductor layer 112 may include a semiconducting material such as, for example, Si, SiC, SiGe, SiGeC, GaAs, InAs, InP as well as other III/V or II/VI compound semiconductors. In one embodiment, the first semiconductor layer 112 is composed of a single crystalline semiconductor material, such as, for example, single crystalline silicon. The first semiconductor layer 112 may be doped with p-type dopants or n-type dopants. Examples of p-type dopants for a silicon containing semiconductor material include, but are not limited to, boron, aluminum, gallium and indium. Examples of n-type dopants for a silicon containing semiconductor material, include but are not limited to, antimony, arsenic and phosphorous. The thickness of the first semiconductor layer 112 can be from 10 nm to 150 nm, although lesser and greater thicknesses can also be employed.

The dielectric layer 114 may include a dielectric material such as, for example, silicon oxide, silicon nitride, boron nitride, silicon oxynitride, or a combination thereof. In one embodiment, each of the dielectric layer 114 is composed of silicon oxide. The thickness of the dielectric layer 114 can be from about 20 nm to about 150 nm, although lesser and greater thicknesses can also be employed.

The second semiconductor layer 116 is comprised of any semiconducting material which may be the same as, or different from, that of the first semiconductor layer 112. Thus, the second semiconductor layer 116 may include, for example, Si, SiC, SiGe, SiGeC, GaAs, InAs, InP as well as other III/N or II/VI compound semiconductors. In one embodiment and when the first semiconductor layer 112 includes Si which is better suited for n-type FETs, the second semiconductor layer 116 may include SiGe which is better suited for p-type FETs. The second semiconductor layer 116 may be doped with dopants having a conductivity opposite to that of the first semiconductor layer 112. The thickness of the second semiconductor layer 116 can be from about 5 nm to about 150 nm, although lesser and greater thicknesses can also be employed.

The second semiconductor layer 116 may have a crystallographic orientation which is the same as, or different from, that of the first semiconductor layer 112. In one embodiment, the second semiconductor layer 116 has a crystal orientation different from that of the first semiconductor layer 112, which allows for fabricating FinFETs on a crystallographic orientation that provides optimal performance for each type of devices (i.e., p-type FinFETs and n-type FinFETs). For example, n-type FinFETs have an optimal performance when fabricated on a (100) crystallographic surface, while p-type Fin FETs have an optimal performance when fabricated on a (110) crystallographic surface.

The substrate 110 may be formed using process for providing an SOI wafer known in the art. For example, a layer transfer process can be used in which wafer bonding is employed. In the layer transfer process, two semiconductor wafers are bonded together. The two wafers used in fabricating the substrate 110 may include two SOI wafers, wherein one of the wafers includes a handle substrate (not shown), a handle dielectric layer (not shown) and the first semiconductor layer 112 and the other wafer includes the dielectric layer 114 and the second semiconductor layer 116. At least one of the wafer can be subjected to hydrogen implantation to provide a H2 implant region which can be used to split a portion of at least one of the wafers during bonding.

FIG. 1 also depicts a top view of semiconductor structure 100 and associated cross-sectional planes. For example, cross-sectional plane X is defined between the length of a fin 102 and cross-sectional plane Y is defined between the length of upper gate 104.

Figure 2:
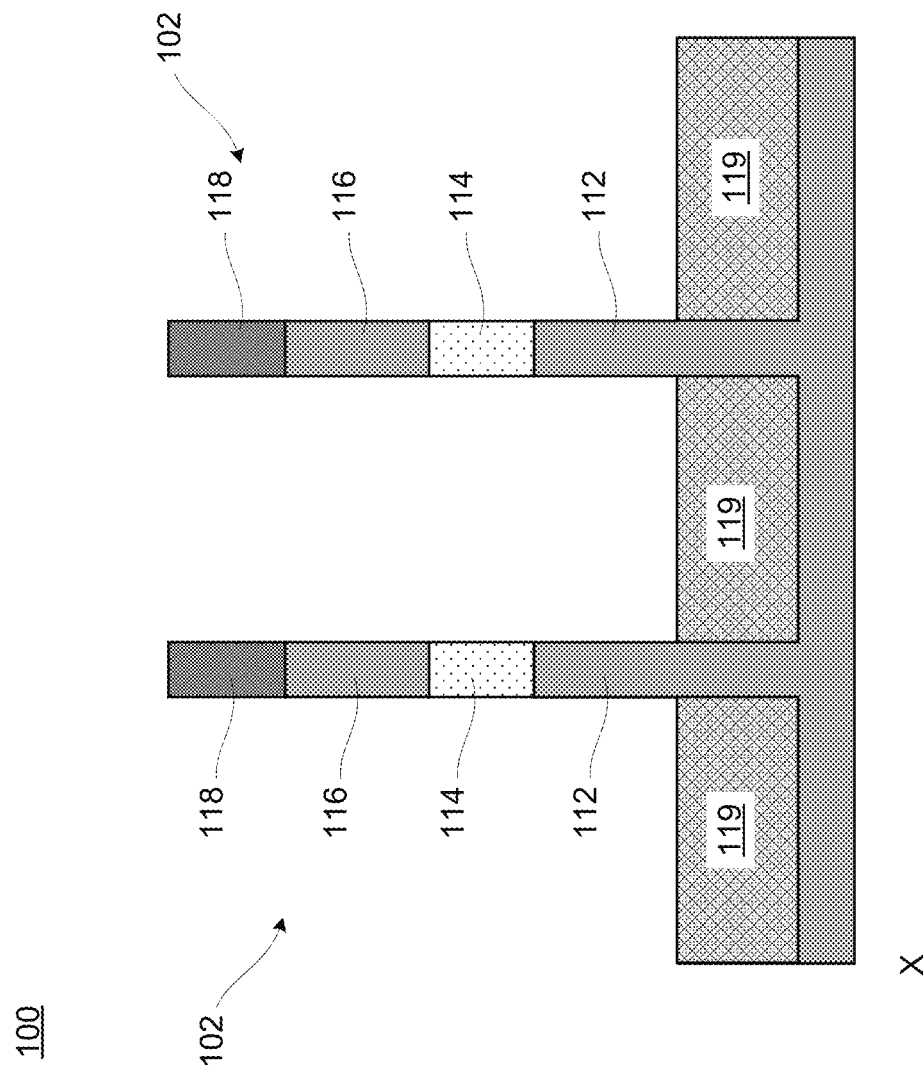

FIG. 2 depicts a cross-sectional view of a semiconductor device 100 shown after respective fabrication operations, in accordance with one or more embodiments. At the present fabrication operations, a plurality of fin stacks are formed. Each of the fin stacks, which may be referred herein as fin 102, includes, from bottom to top, a first semiconductor fin formed of a portion of first semiconductor layer 112, a dielectric fin portion formed of a portion of dielectric layer 114, and a second semiconductor fin formed of a portion of second semiconductor layer 116. As used herein, a "fin" is a structure that has a first pair of sidewalls along a lengthwise direction that is longer than a second pair of sidewalls along a widthwise direction. For example, and as shown in top view depicted in FIG. 1, each of the first semiconductor 112 fin portion, the dielectric 114 fin portion, and the second semiconductor 116 fin portion can have a length along the lengthwise direction and has a width along the widthwise direction. The length is greater than the width. In one embodiment, the width can be from 5 nm to 50 nm, the length can be from 10 nm to 50 p.m. The fins 102 may have a pitch ranging from 20 nm to 100 nm, with a pitch ranging from 30 nm to 50 nm being more typical.

Fin 102 may be formed by lithography and etching. The lithographic step includes applying a photoresist layer (not shown) atop the second semiconductor layer 116 or the pad layer, if present, exposing the photoresist layer to a desired pattern of radiation, and developing the exposed photoresist layer utilizing a conventional resist developer. The etching process may be a dry etch and/or a wet chemical etch. Illustrative examples of suitable dry etching processes that can be used in the present application include reactive ion etch (RIE), ion beam etching, plasma etching or laser ablation. Typically, a RIE process is used. The etching process transfers the pattern from the patterned photoresist layer to the stack of the second semiconductor layer 116, the dielectric 114 and the first semiconductor layer 112. Each remaining portion of the first semiconductor layer 112 constitutes the first semiconductor fin portion, each remaining portion of the dielectric layer 114 constitutes the dielectric fin portion, and each remaining portion of the second semiconductor layer 116 constitutes the second semiconductor fin portion. After forming the fins 102, the patterned photoresist layer 118 can be removed utilizing a conventional resist stripping process such as, for example, ashing. In some embodiments, a sidewall image transfer process as known in the art may be used in providing the fin 102.

STI regions 119, or portion(s) thereof, may be formed by depositing STI material(s), such as a dielectric known in the art, upon the horizontal surfaces of semiconductor layer 112 and upon and between first semiconductor portions of the fins 102. The STI regions 119 may be formed by depositing the STI material by for example, PVD, CVD, ALD, or the like. As is known in the art, STI regions 119 may, at least partially, electrically isolate neighboring FinFET components or features. Exemplary STI region 119 material(s) may be a thin layer of conformal SiN and SiO2 over fill.

Figure 3:
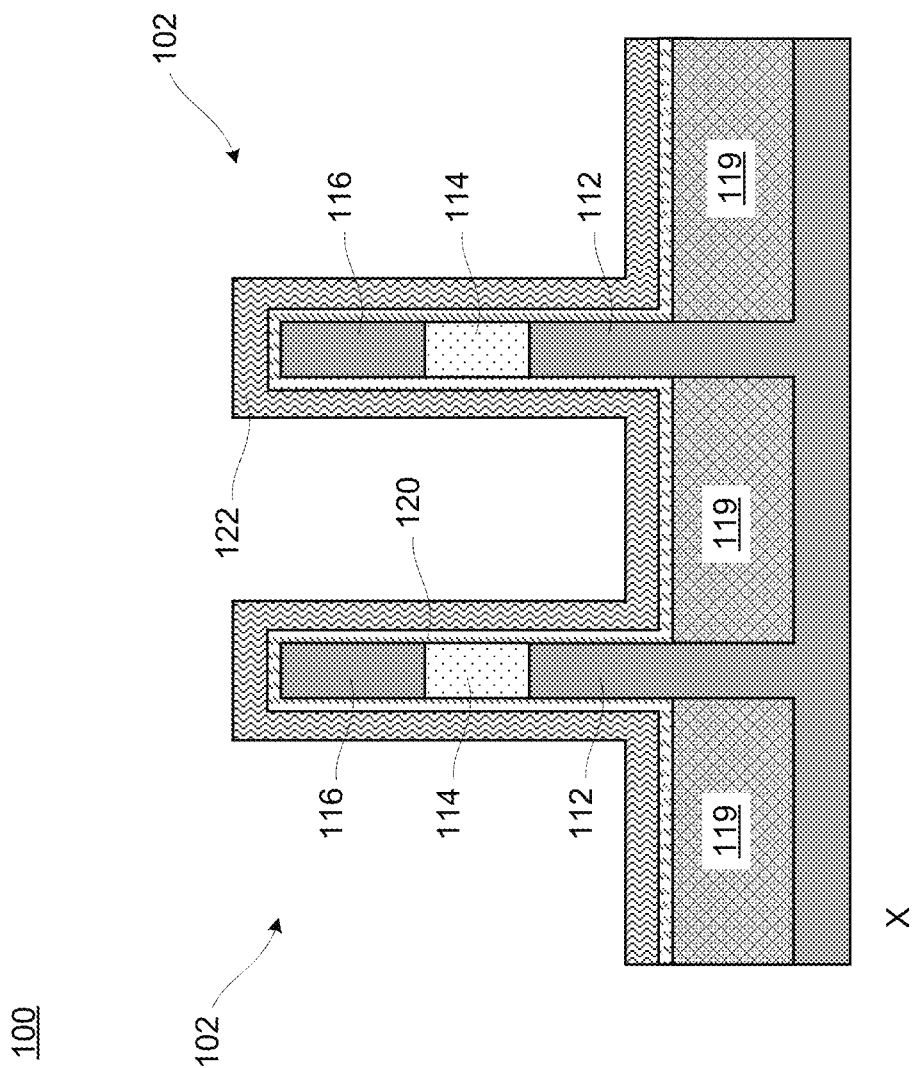

FIG. 3 depicts a cross-sectional view of a semiconductor device 100 shown after respective fabrication operations, in accordance with one or more embodiments. At the present fabrication operations, lower gate layer(s) are formed.

A gate dielectric layer 120 is formed upon STI regions 119 and upon and around fins 102. The gate dielectric layer 120 may be formed by conformally depositing a dielectric material by CVD or atomic layer deposition (ALD). In one embodiment, the gate dielectric layer 120 is composed of a high-k material having a dielectric constant greater than silicon oxide. Exemplary high-k materials include, but are not limited to, HfO2, ZrO2, La2O3, Al2O3, TiO2, SrTiO3, LaAlO3, Y2O3, HfOxNy, ZrOxNy, La2OxNy, Al2OxNy, TiOxNy, SrTiOxNy, LaAlOxNy, Y2OxNy, SiON, SiNx, a silicate thereof, and an alloy thereof. Each value of x is independently from 0.5 to 3 and each value of y is independently from 0 to 2. The gate dielectric layer 120 may have a thickness from 0.9 nm to 10 nm, with a thickness ranging from 1.0 nm to 3 nm being more typical.

Subsequently, a lower work function metal layer 122 is conformally deposited over the gate dielectric layer 120. In one embodiment and when the first semiconductor fin portion(s) are provided for n-type FinFETs, the lower work function metal layer 122 may include a first metal that effectuates an n-type threshold voltage shift. As used herein, "threshold voltage" is the lowest attainable gate voltage that will turn on a semiconductor device, e.g., transistor, by making the channel of the device conductive. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. The lower work function metal layer 122 may include TiAlC, TaAlC, TiAl, Ti, or Al. The work function of the lower work function metal layer 122 may range from 4.1 eV to 4.3 eV. The lower work function metal layer 122 may be formed by a suitable deposition process such as, for example, CVD, PVD or ALD. The lower work function metal layer 122 that is formed may have a thickness ranging from 1 nm to 10 nm, although lesser and greater thicknesses can also be employed.

Figure 4:
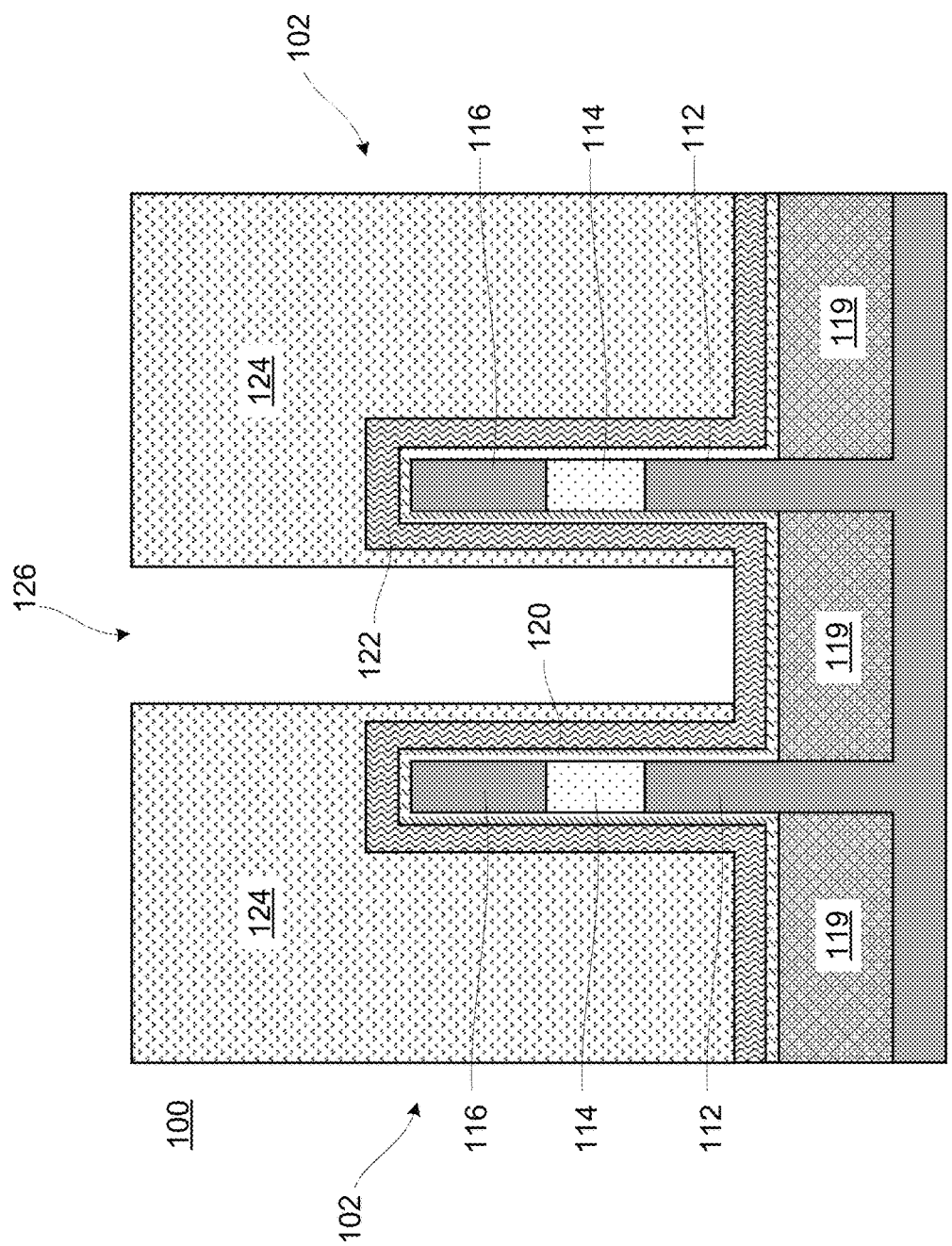

FIG. 4 depicts a cross-sectional view of a semiconductor device 100 shown after respective fabrication operations, in accordance with one or more embodiments. At the present fabrication operations, mask 124 is formed and patterned.

Mask 124 may be a photoresist layer and may be formed atop the lower work function metal layer 122. The mask 124 may be exposed to a desired pattern of radiation, the exposed mask 124 may be developed utilizing a conventional resist developer. An etching process, which may be a dry etch and/or a wet chemical etch, may remove the developed portions of mask 124 forming pattern 126. Illustrative examples of suitable dry etching processes that can be used in the present application include reactive ion etch (RIE), ion beam etching, plasma etching or laser ablation. Typically, a RIE process is used. The etching process transfers the pattern 126 from the patterned mask 124 to the lower work function metal layer 122. The pattern 126 may generally define the respective length and width of a first lower gate and second lower gate and may define a gate cut region that physically and electrically separates the first lower gate and the second lower gate. The width of the first lower gate and second lower gate may be substantially similar to the width of upper gate 106. The combined length of the first lower gate and second lower gate may be greater than the length of upper gate 106.

Figure 5:
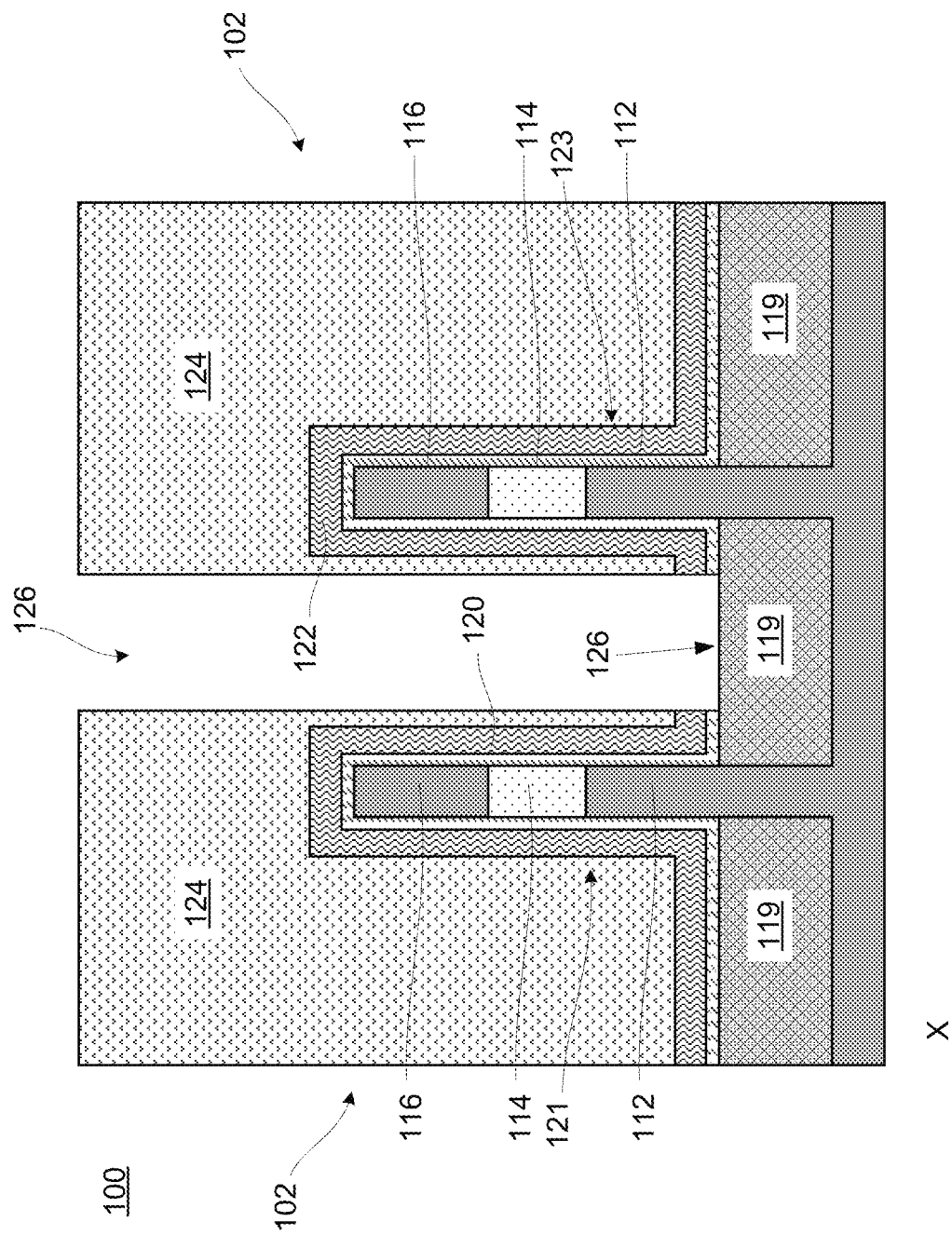

FIG. 5 depicts a cross-sectional view of a semiconductor device 100 shown after respective fabrication operations, in accordance with one or more embodiments. At the present fabrication operations, portions of the lower work function metal layer 122 and portions of the gate dielectric layer 120 are removed via the pattern 126. An etching process, which may be a dry etch and/or a wet chemical etch, may remove undesired portions of the lower work function metal layer 122 and portions of the gate dielectric layer 120.

Each remaining portion of lower work function metal layer 122 and each associated portion of the gate dielectric layer 120 may be associated with the lower gate 121 and the lower gate 123, respectively. By way of the separation of the work function metal layer 122 and gate dielectric layer 120 between fins 102, the lower gates 121, 123 may be partially formed and physically and electrically separated or isolated. For example, a portion of the lower work function metal layer 122 and portions of the gate dielectric layer 120 between fins 102 are removed and an underlying STI region 119 is exposed.

Figure 6:
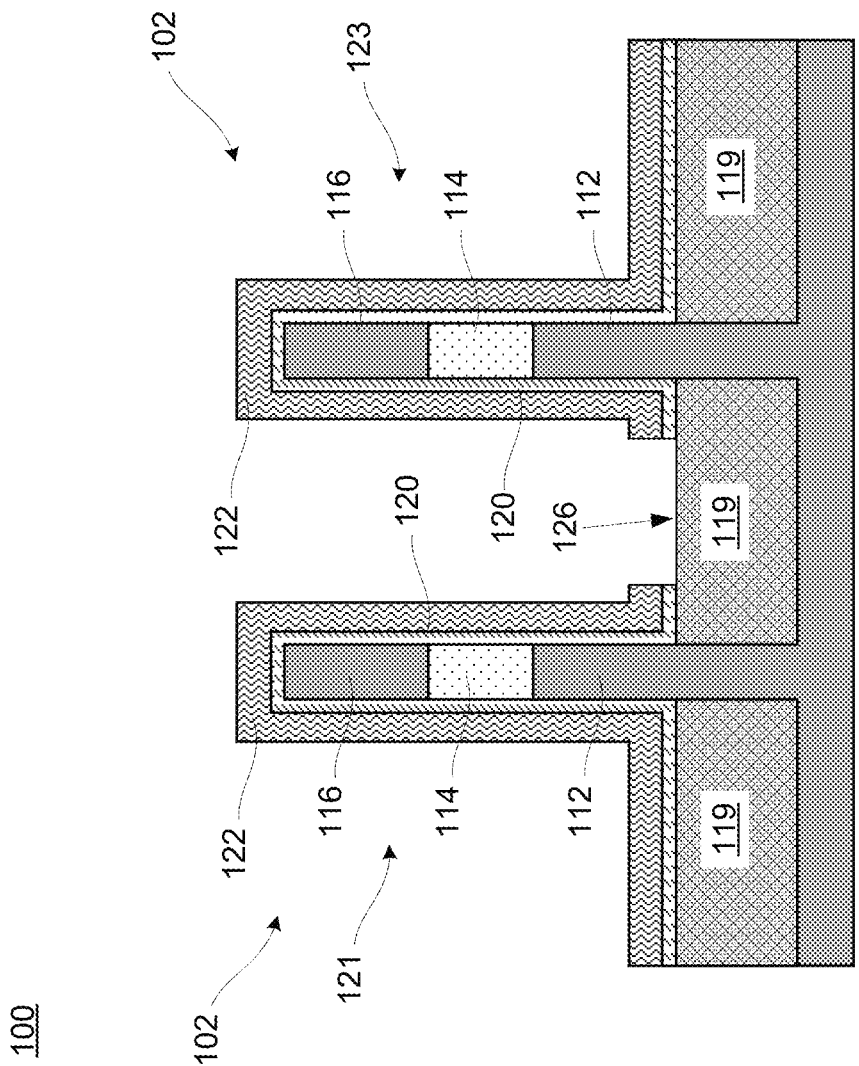

FIG. 6 depicts a cross-sectional view of a semiconductor device 100 shown after respective fabrication operations, in accordance with one or more embodiments. At the present fabrication operations, mask 124 is removed. After the partial formation of lower gates 121, 123, the patterned mask 124 can be removed utilizing a conventional resist stripping process.

Figure 7:
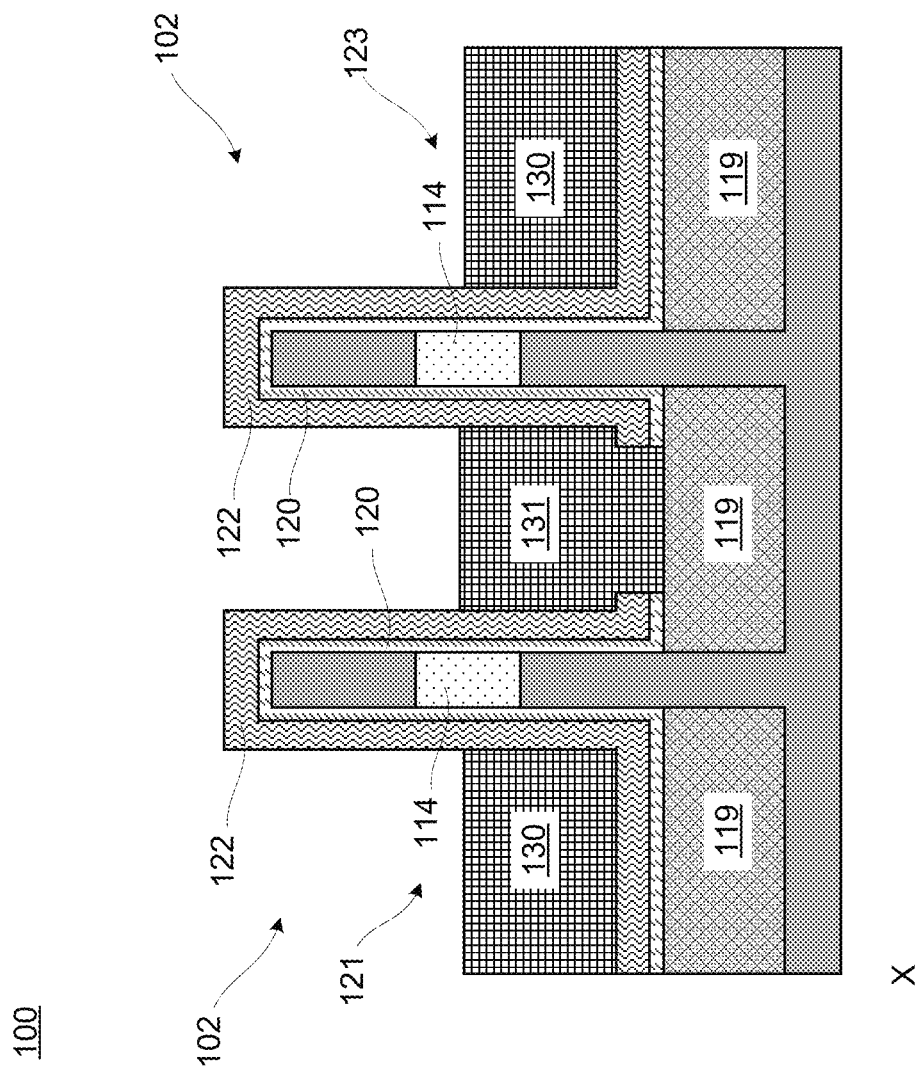

FIG. 7 depicts a cross-sectional view of a semiconductor device 100 shown after respective fabrication operations, in accordance with one or more embodiments. At the present fabrication operations, fill region 130 and fill region 131 are formed.

Fill region 130 and fill region 131 may be an interlevel dielectric (ILD) layer formed upon lower work function metal layer 122 and upon STI regions 119 and may laterally surround the lower gates 121, 123. The ILD layer may include a dielectric material such as undoped silicon oxide, doped silicon oxide, silicon nitride, porous or non-porous organosilicate glass, porous or non-porous nitrogen-doped organosilicate glass, or a combination thereof. The ILD layer may be formed by CVD, PVD or spin coating. The thickness of the ILD layer may be selected so that an entirety of the top surface of the ILD layer is formed above the top surface of the work function metal layer 122. The ILD layer may be subsequently recessed, for example, by CMP and/or a recess etch. After the planarization, the ILD layer has a topmost surface between the top and bottom surfaces of each portion of dielectric layer 114 of fins 102. Fill region 131 may be the portion of ILD layer between neighboring fins 102, may be upon an STI region 119, and at least partially electrically isolates and physically separates lower gate 121 from lower gate 123. Fill region 131 may be the portion of ILD layer outside of neighboring fins 102 and may be upon an lower work function metal layer 122 of lower gate 121 or lower gate 123, respectively.

Figure 8:
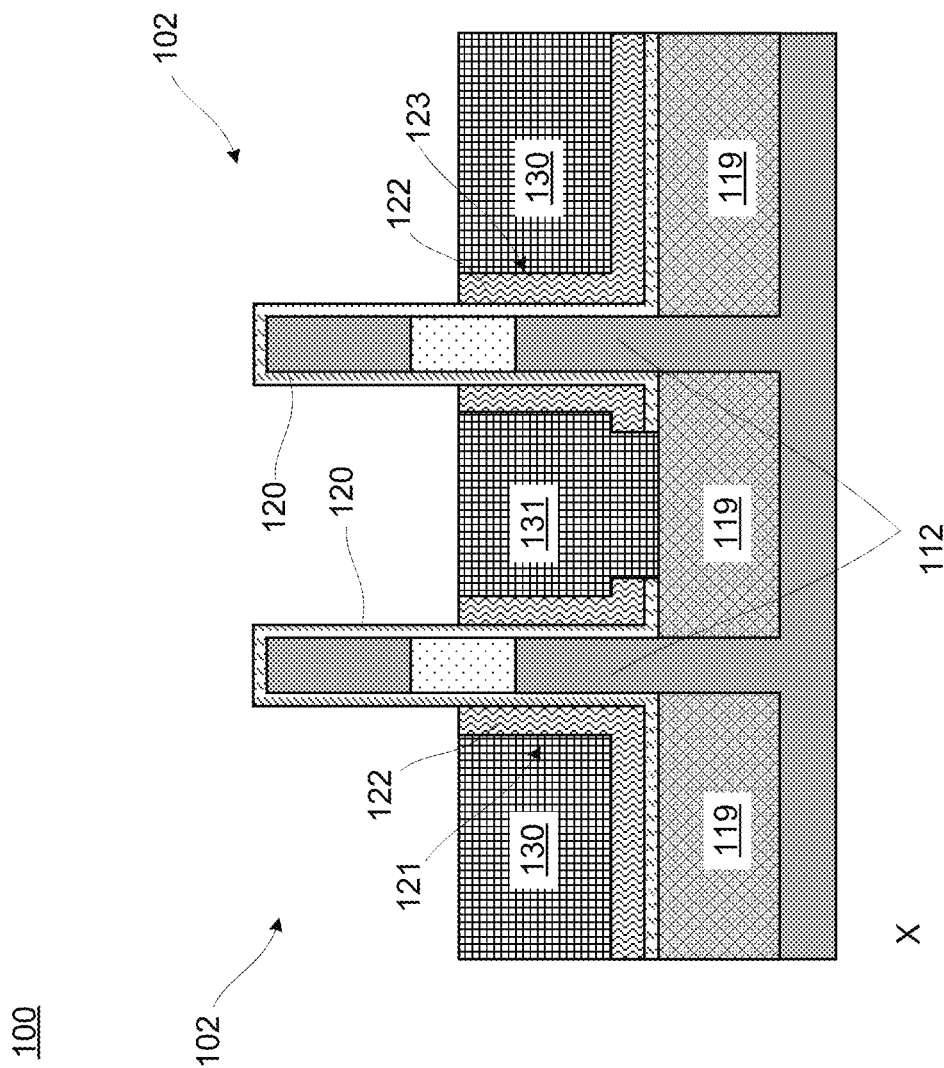

FIG. 8 depicts a cross-sectional view of a semiconductor device 100 shown after respective fabrication operations, in accordance with one or more embodiments. At the present fabrication operations, work function metal layer 122 material above fill region 130 and fill region 131 is removed and lower gate 121 and lower gate 123 are further partially formed.

Removal of the work function metal layer 122 material may be completed by known etching techniques. The etching process may be a dry etch and/or a wet chemical etch. The etching process may utilize the top surfaces of fill region 130 and fill region 131 as an etch stop.

Figure 9:
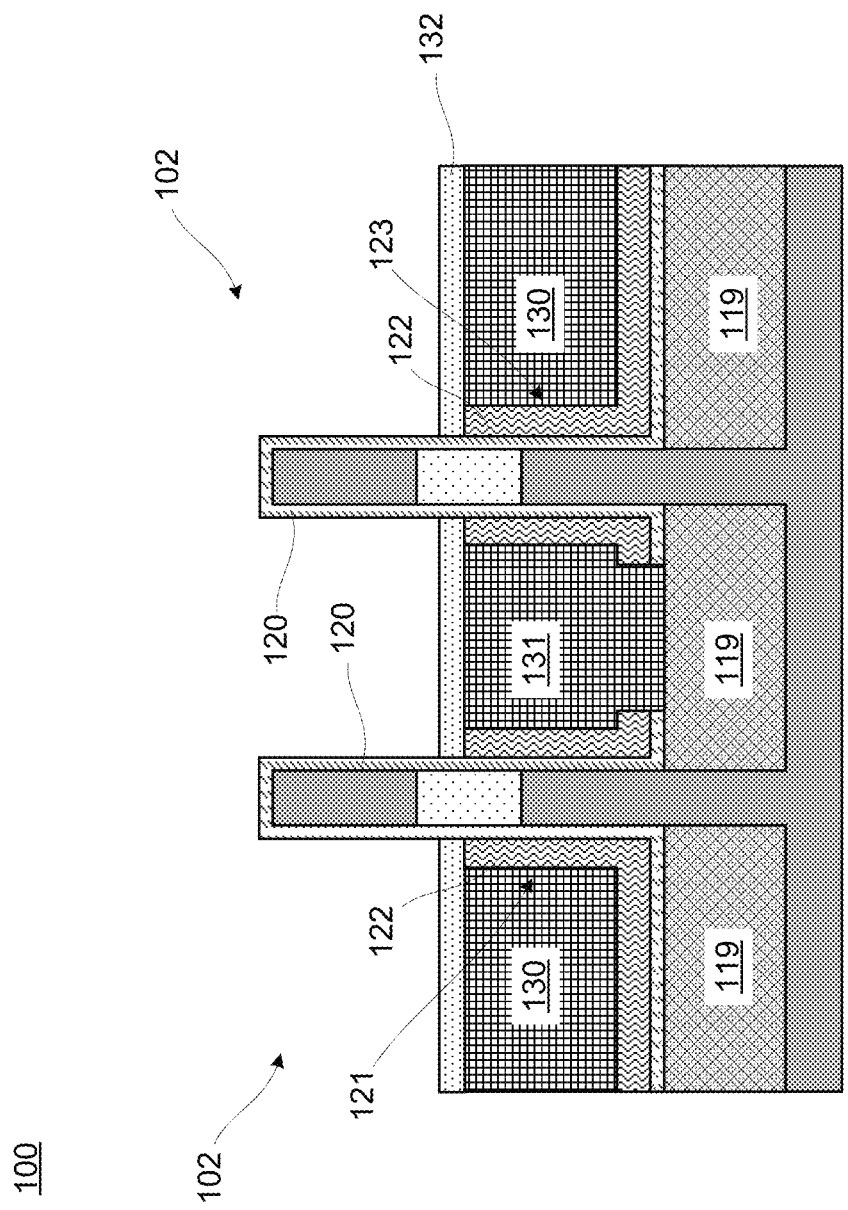

FIG. 9 depicts a cross-sectional view of a semiconductor device 100 shown after respective fabrication operations, in accordance with one or more embodiments. At the present fabrication operations, isolation layer 132 is formed upon the upper surface of the lower gates 121, 123, upon the upper surface of fill region 130, and upon the upper surface of fill region 131.

A isolation layer 132 may at least partially electrically isolate a top FET from a bottom FET with different polarities and being associated with the same fin 102. The isolation layer 132 may be formed by conformally depositing a dielectric material by CVD or atomic layer deposition (ALD). In one embodiment, the isolation layer 132 is composed of a dielectric material. Exemplary dielectric materials include, but are not limited to SiN, SiBCN, SiO2, AlOx etc., a silicate thereof, and an alloy thereof. The isolation layer 132 may have a thickness from 5 nm to 30 nm, with a thickness ranging from 10 nm to 20 nm being more typical.

Figure 10:
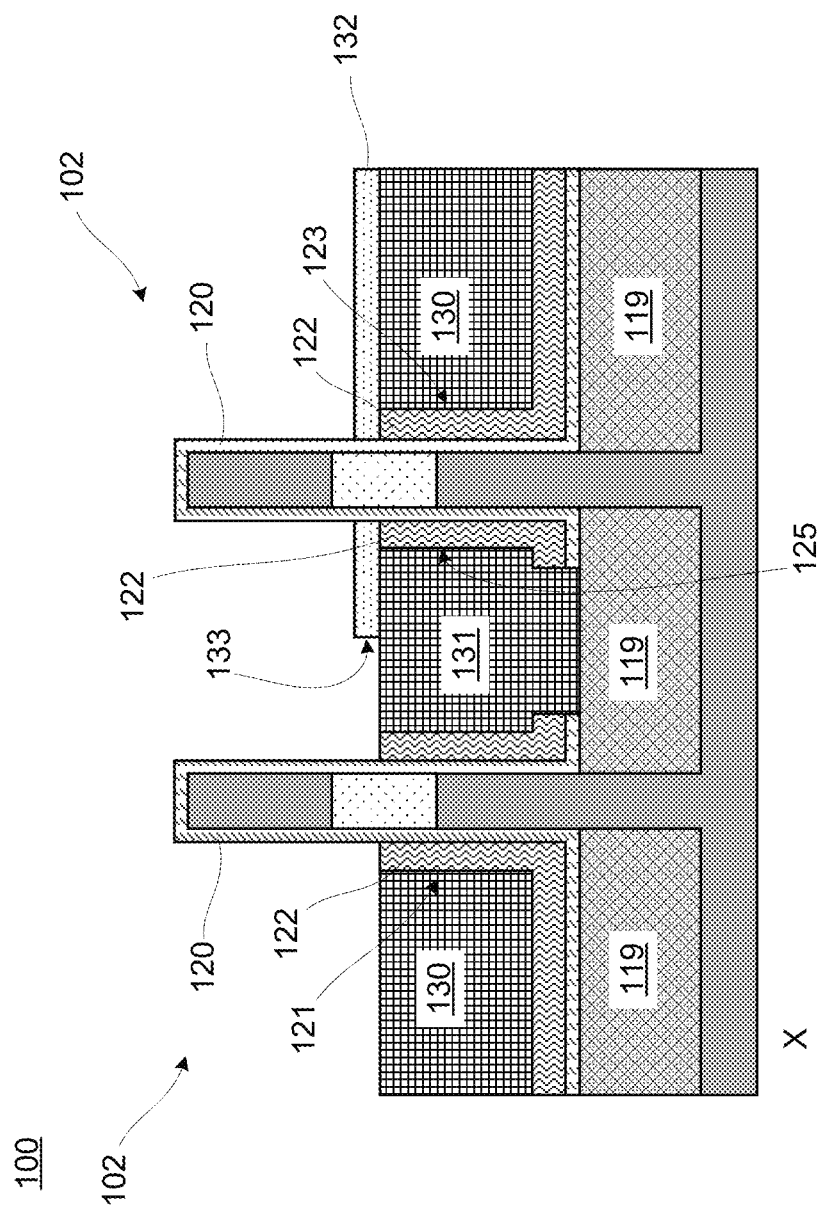

FIG. 10 depicts a cross-sectional view of a semiconductor device 100 shown after respective fabrication operations, in accordance with one or more embodiments. At the present fabrication operations, isolation layer 132 may be partially removed. In some embodiments, the present fabrication operations may be omitted. Specifically, isolation layer 132 may be retained above both lower gates 121, 123 in instances where the top FET and the bottom FET within the same 102 are to have distinct or non-shared gates. Alternatively, isolation layer 132 may be removed above a lower gate 121 and/or lower gate 123 in instances where with the top FET and the bottom FET within the same fin 102 are to have a shared gate. In the depicted example, the bottom FET of fin 102 associated with lower gate 123 is to have its own independent and non-shared gate relative to the top FET in the same fin 102. As such, a retained portion of isolation layer 132 is formed upon the lower gate 123.

Retained portions of isolation layer 132 may be formed by lithography and etching. The lithographic step includes applying a photoresist layer (not shown) atop the isolation layer 132, exposing the photoresist layer to a desired pattern of radiation, and developing the exposed photoresist layer utilizing a conventional resist developer. The etching process may be a dry etch and/or a wet chemical etch. The etching process transfers the pattern from the patterned photoresist layer to the isolation layer 132 and removes the undesired portion(s) of the isolation layer 132. The desired portion(s) of the isolation layer 132 are protected by the photoresist layer there above. After forming the retained portions of isolation layer 132, the patterned photoresist layer can be removed utilizing a conventional resist stripping process.

In some embodiments, as depicted, the retained portion of isolation layer 132, which may be referred to below simply as isolation layer 132, may have a sidewall 133 outside of the sidewall 125 of lower gate 123. In other words, sidewall 125 may be inset from the sidewall 133 of isolation layer 132. As such, the isolation layer 132 may be wider than the underlying lower gate 123, so as to reliably isolate the lower gate 123 from the to-be formed upper gate.

Figure 11:
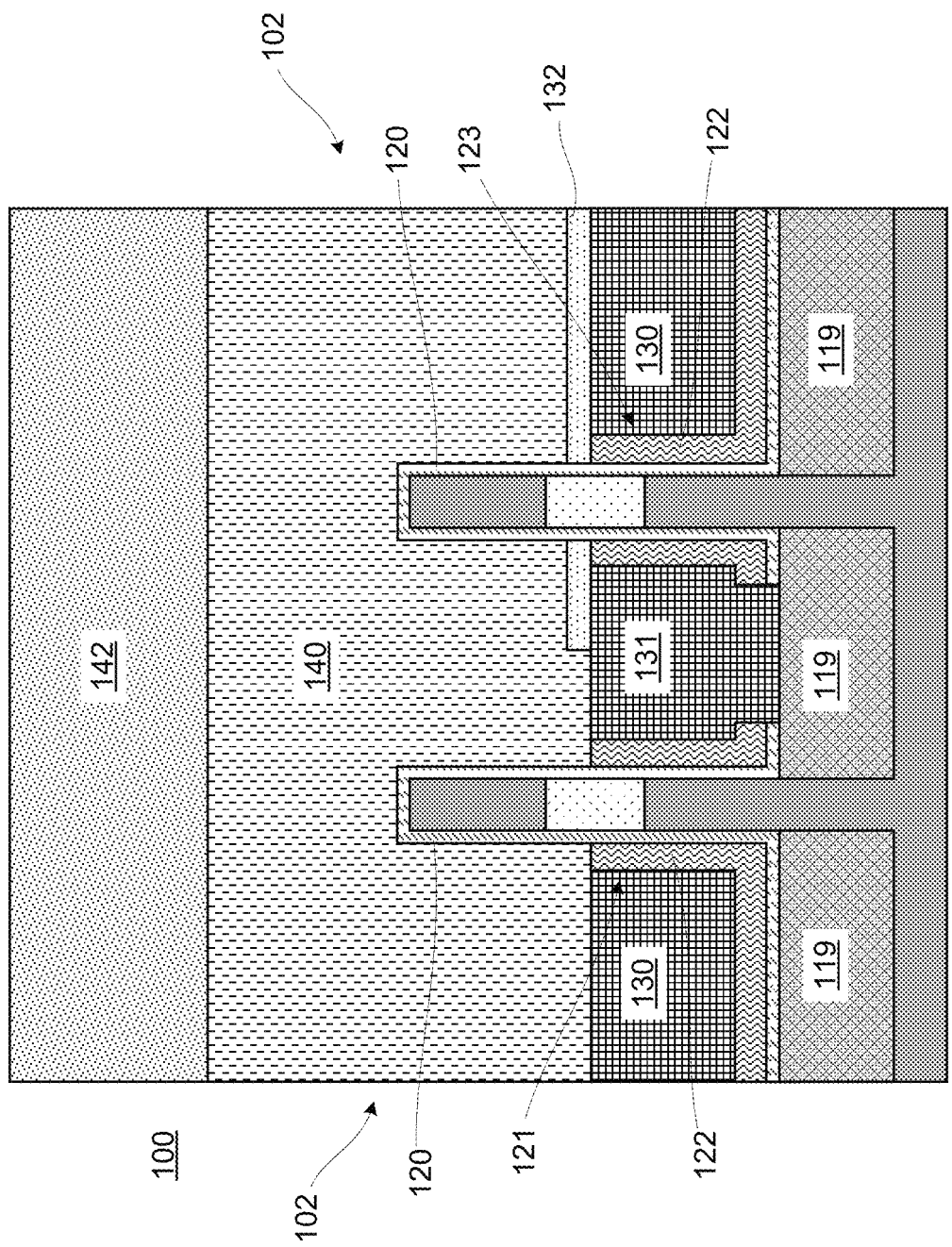

FIG. 11 depicts a cross-sectional view of a semiconductor device 100 shown after respective fabrication operations, in accordance with one or more embodiments. At the present fabrication operations, sacrificial gate layer 140 and sacrificial gate cap layer 142 are formed.

In some embodiments, a sacrificial gate dielectric layer may first be formed upon the isolation layer 132 and around fins 102. Next, the sacrificial gate layer 140 and the sacrificial gate cap layer 142 may be formed upon the sacrificial gate dielectric layer. In some embodiments, as depicted, the sacrificial gate dielectric layer can be omitted. When present, the sacrificial gate dielectric layer includes a dielectric material such as an oxide or a nitride. In one embodiment, the sacrificial gate dielectric layer may include silicon oxide, silicon nitride, or silicon oxynitride. The sacrificial gate dielectric layer that is formed may have a thickness from 1 nm to 10 nm, although lesser and greater thicknesses can also be employed.

The sacrificial gate layer 140 may include a semiconductor material such as polysilicon or a silicon-containing semiconductor alloy such as a silicon-germanium alloy. The sacrificial gate layer may be formed using chemical vapor deposition (CVD) or plasma enhanced chemical vapor deposition (PECVD). The sacrificial gate layer that is formed may have a thickness from 20 nm to 300 nm, although lesser and greater thicknesses can also be employed.

The sacrificial gate cap layer 142 may include a dielectric material such as an oxide, a nitride or an oxynitride. In one embodiment, the sacrificial gate cap layer 142 is comprised of silicon nitride. The sacrificial gate cap layer can be formed utilizing a conventional deposition process including, for example, CVD and PECVD. The sacrificial gate cap layer that is formed may have a thickness from 10 nm to 200 nm, although lesser and greater thicknesses can also be employed.

Figure 12:
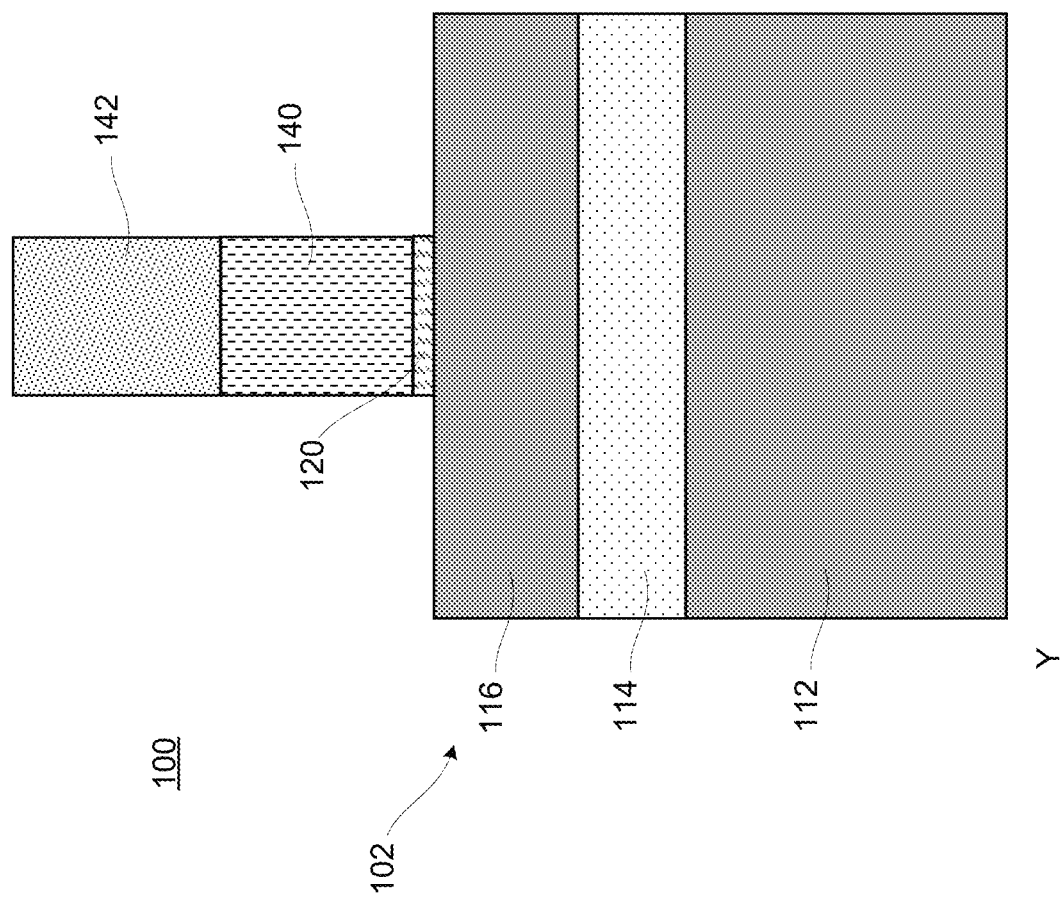

FIG. 12 depicts a cross-sectional view of a semiconductor device 100 shown after respective fabrication operations, in accordance with one or more embodiments. At the present fabrication operations, the sacrificial gate is formed and the lower gates 121, 123 are formed by patterning the associated gate material(s).

The sacrificial gate may be formed by lithography and by etching. Specifically, a photoresist layer (not shown) is applied over the topmost surface of the sacrificial gate cap layer 142 and is lithographically patterned by lithographic exposure and development. The pattern in the photoresist layer is transferred into the sacrificial gate material stack by an etch, which can be an anisotropic etch such as RIE. The remaining portions of the material stack after the etch may effectively form the sacrificial gate. The patterned photoresist layer may be subsequently removed. The sacrificial gate structure may include the gate dielectric 120, the sacrificial gate 140, and the gate cap 142. In some embodiments, the sacrificial gate cap 142 may be omitted. The width of the sacrificial gate structure is exemplarity depicted.

The lower gate 121, 123 may be formed by lithography and by etching. Specifically, the photoresist layer (not shown) is applied over the topmost surface of the work function metal layer 122 of the lower gate 121, 123 and is lithographically patterned by lithographic exposure and development. The pattern in the photoresist layer is transferred into the lower gate 121, 123 by an etch, which can be an anisotropic etch such as RIE. The remaining portions of the lower gate 121, 123 after the etch may effectively form the lower gates 121, 123, respectively. The patterned photoresist layer may be subsequently removed. In some embodiments, lower gate 121, 123 may have a substantially similar width relative to the sacrificial gate structure there above. Each lower gate 121, 123 stack may consist of a portion of the gate dielectric layer 120 and a portion of the work function layer 122 thereupon. The lower gate 121, 123 may have a substantially similar width and may be vertically in-line relative to the sacrificial gate structure there above. For clarity, the lower gate 121, 123 stack and the sacrificial gate structure stack may include a gate dielectric 120 material portion formed of the same gate dielectric layer.

Figure 13:
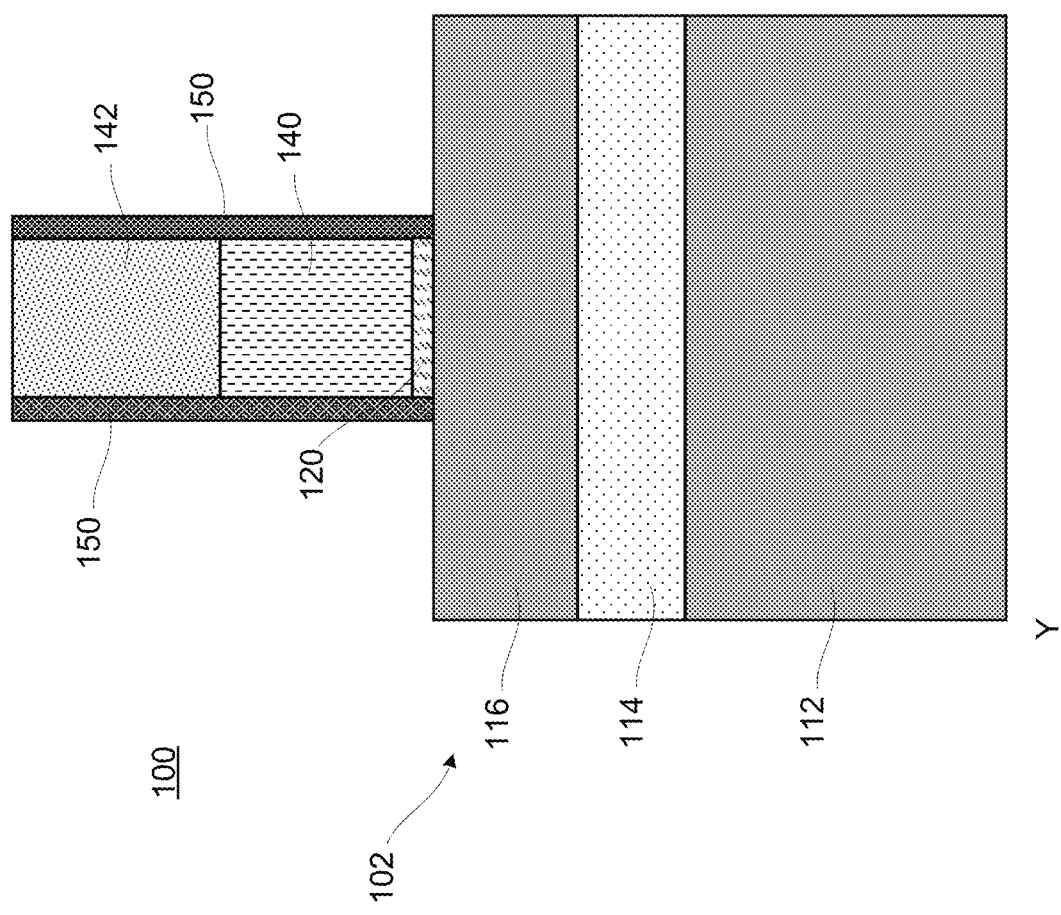

FIG. 13 depicts a cross-sectional view of a semiconductor device 100 shown after respective fabrication operations, in accordance with one or more embodiments. At the present fabrication operations, gate spacer 150 is formed around the sacrificial gate structure.

The gate spacer 150 may include a dielectric material such as, for example, an oxide, a nitride, an oxynitride, or any combination thereof. For example, the gate spacer 150 may be composed of silicon nitride, silicon boron carbon nitride, or silicon carbon oxynitride. The gate spacer 150 can be formed by first providing a conformal gate spacer material layer (not shown) on exposed surfaces of the sacrificial gate structure and then etching the conformal gate spacer material layer to remove horizontal portions of the conformal gate spacer material layer. The conformal gate spacer material layer can be provided by a deposition process including, for example, CVD, PECVD, or physical vapor deposition (PVD). The etching of the conformal gate spacer material layer may be performed by a dry etch process such as, for example, RIE. The remaining portions of the conformal gate spacer material layer may constitute the gate spacer(s) 150. The width of each gate spacer 150, as measured at the vertical base of the gate spacer 150 directly upon the gate structure can be from 5 nm to 100 nm, although lesser and greater widths can also be employed.

Figure 14:

FIG. 14 depicts a cross-sectional view of a semiconductor device 100 shown after respective fabrication operations, in accordance with one or more embodiments. At the present fabrication operations, fin 102 is recessed outside the footprint of the gate spacer 150, lower source/drain region 160 is formed, lower drain/source region 162 is formed, source drain isolation layer 170 is formed, upper source/drain region 180 is formed, upper drain/source region 182 is formed, and fill 190 is formed.

The fin 102 may be recessed outside the footprint of gate spacer 150 by etching and utilizing the top surface(s) of fill regions 130, 131 as an etch stop. The remaining portions of the fin 102 may be generally below the sacrificial gate structure. The end surface(s) of the fin 102 may be coplanar with the sidewalls of the gate spacer 150.

Lower source/drain region 160 and lower drain/source region 162 (herein collectively referred to as lower source/drain regions) are formed upon and adjacent to the recessed first semiconductor fin portion retained from semiconductor layer 112. In some embodiments, the lower source/drain regions may be formed by epitaxially growing source/drain (S/D) material from one or more exposed semiconductor layer 112 surface(s). Exemplary lower source/drain regions materials may be but are not limited to: Si, Ge, SiGe, SiC, or the like.

Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial Si, SiGe, and/or SiC can be doped during deposition (in-situ doped) by adding dopants, n-type dopants (e.g., phosphorus or arsenic) or p-type dopants (e.g., boron or gallium), depending on its inclusion within the pFET or the nFET. An activation anneal may be subsequently performed to activate the dopants in the lower source/drain regions.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments of the invention, epitaxial growth and/or deposition processes are selective to forming on semiconductor surfaces, and generally do not deposit material on exposed surfaces, such as silicon dioxide or silicon nitride surfaces.

In some embodiments of the invention, the gas source for the deposition of epitaxial semiconductor material can include a silicon containing gas source, a germanium containing gas source, or a combination thereof. For example, an epitaxial silicon layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium, and argon can be used.

S/D isolation layer 170 may be formed upon the lower source/drain regions. S/D isolation layer 170 may be formed by depositing a dielectric material, materials, or layers of material(s), by PVD, CVD, ALD, or the like. Exemplary S/D isolation layer 170 materials may be $SiO_2$, a combination of a SiN liner and $SiO_2$ liner, or the like. In some embodiments, the S/D isolation layer 170 material is chosen such that the material may electrically isolate, adequately electrically isolate, or the like, the lower source/drain regions from the upper source/drain regions. The S/D isolation layer 170 material thickness may be chosen so that the S/D isolation layer 170 material layer has a top surface and bottom surface that is coplanar, substantially coplanar, or between the respective top or bottom surfaces of the portion of dielectric layer 114 of fin 102.

Upper source/drain region 180 and upper drain/source region 182 (herein collectively referred to as upper source/drain regions) are formed upon and adjacent to the recessed second semiconductor fin portion retained from semiconductor layer 116. In some embodiments, the upper source/drain regions may be formed by epitaxially growing source/drain (S/D) material from one or more exposed semiconductor layer 116 surface(s). Exemplary upper source/drain regions materials may be but are not limited to: Si, Ge, SiGe, SiC, or the like.

For clarity, the semiconductor fin portion retained from semiconductor layer 112 may serve as a lower FET channel region 161 between lower source/drain region 160 and lower drain/source region 162 of a first lower FinFET of a first fin 102. Similarly, the semiconductor fin portion retained from semiconductor layer 116 may serve as a upper FET channel region 181 between upper source/drain region 180 and upper drain/source region 182 of a first upper FinFET of a first fin 102. A similar lower FinFET and upper FinFET may be formed associated with the second fin 102.

Fill material 190 may be an ILD that is formed over the upper source/drain regions and upon the gate spacer 150 to laterally surround the sacrificial gate structure. The ILD may include a dielectric material such as undoped silicon oxide, doped silicon oxide, silicon nitride, porous or non-porous organosilicate glass, porous or non-porous nitrogen-doped organosilicate glass, or a combination thereof. The ILD layer may be formed by CVD, PVD or spin coating. The thickness of the ILD layer may be selected so that an entirety of the top surface of the ILD layer is formed above the top surface of the sacrificial gate cap 142.

Figure 15:
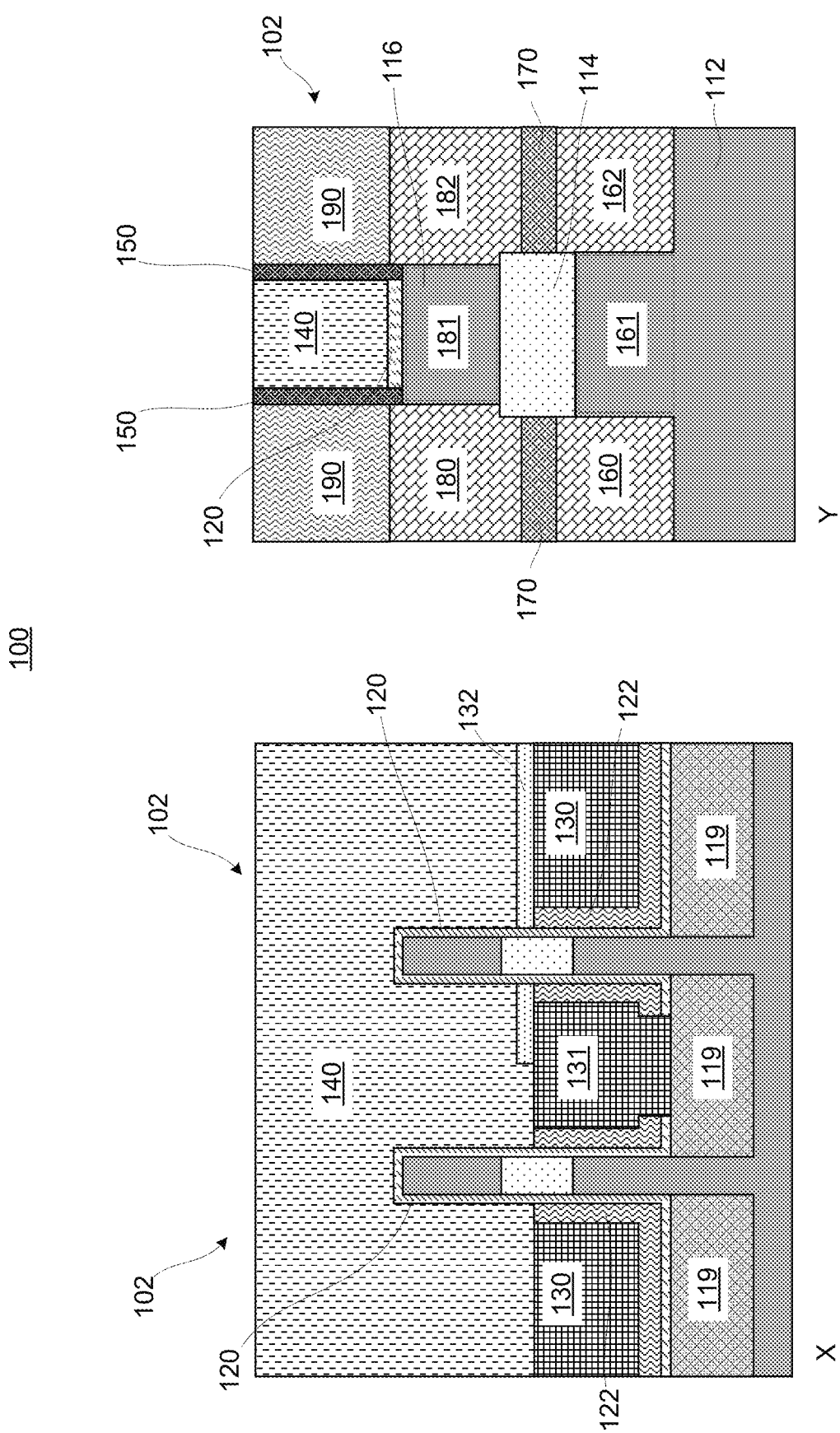

The ILD layer may be subsequently planarized, for example, by CMP and/or a recess etch using the sacrificial gate cap 142 as an etch stop. After the planarization, the ILD layer has a topmost surface coplanar with the top surface of the sacrificial gate cap 142. In some embodiments, as depicted in FIG. 15, the ILD layer may be subsequently planarized, for example, by CMP and/or a recess etch using the sacrificial gate 140 as an etch stop. After the planarization, the ILD layer has a topmost surface coplanar with the top surface of the sacrificial gate 140.

Figure 16:
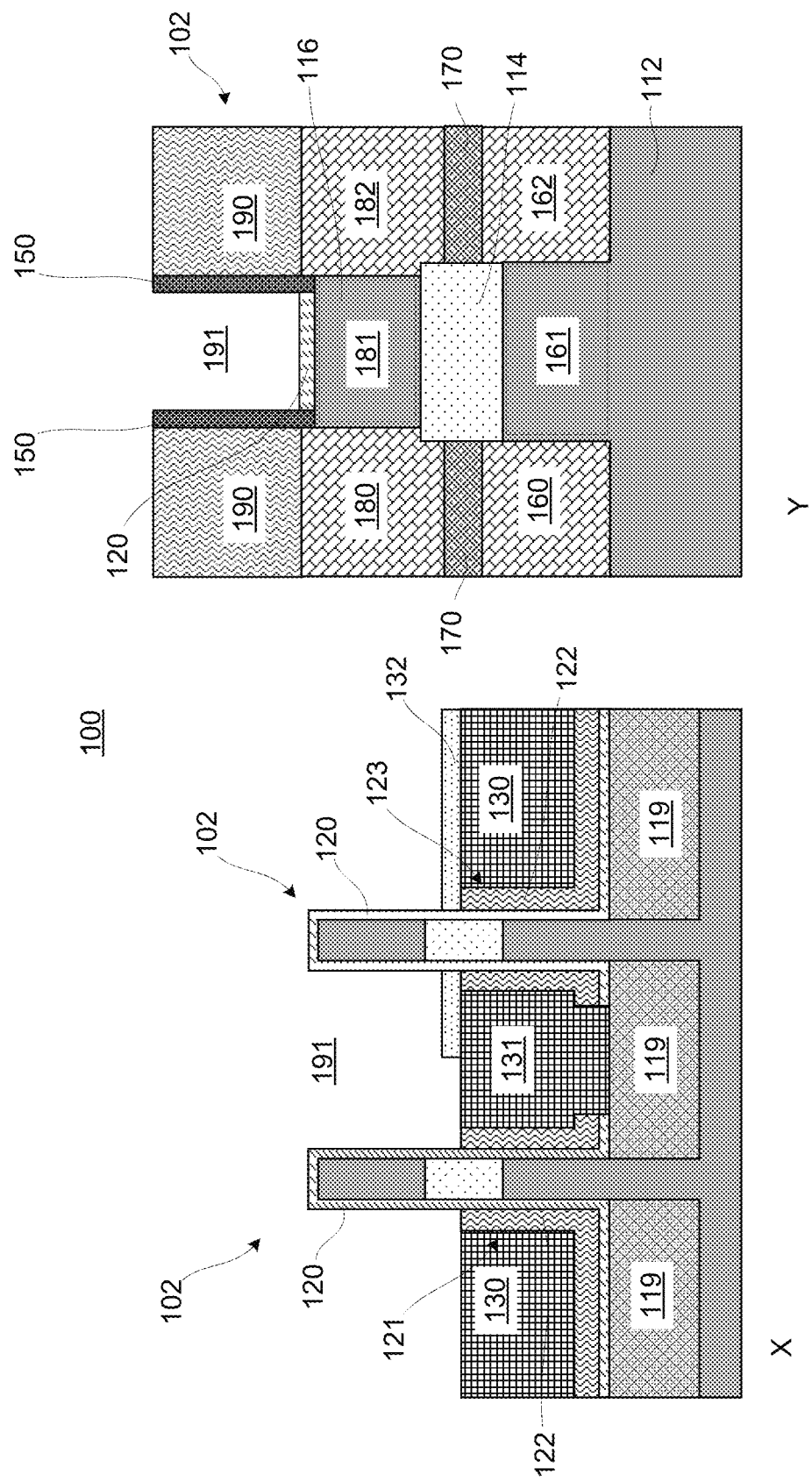

FIG. 16 depicts a cross-sectional view of a semiconductor device 100 shown after respective fabrication operations, in accordance with one or more embodiments. At the present fabrication operations, a gate opening 191 is formed by removing sacrificial gate 140. The sacrificial gate 140 may be removed selectively to the semiconductor materials of the fins 102, gate dielectric 120, isolation layer 132, gate spacer 150, and fill material 190 by at least one etch. The at least one etch can be a dry etch and/or a wet chemical etch. The gate opening 191 is thus formed by a volume from which the sacrificial gate 140 is removed and is laterally confined by inner sidewalls of gate spacer 150. The gate cavity 191 may expose the gate dielectric 120 upon each fin 102, the top surface of lower gate 121, top surface portions of fill region 130, 131, and the isolation layer 132.

Figure 17:
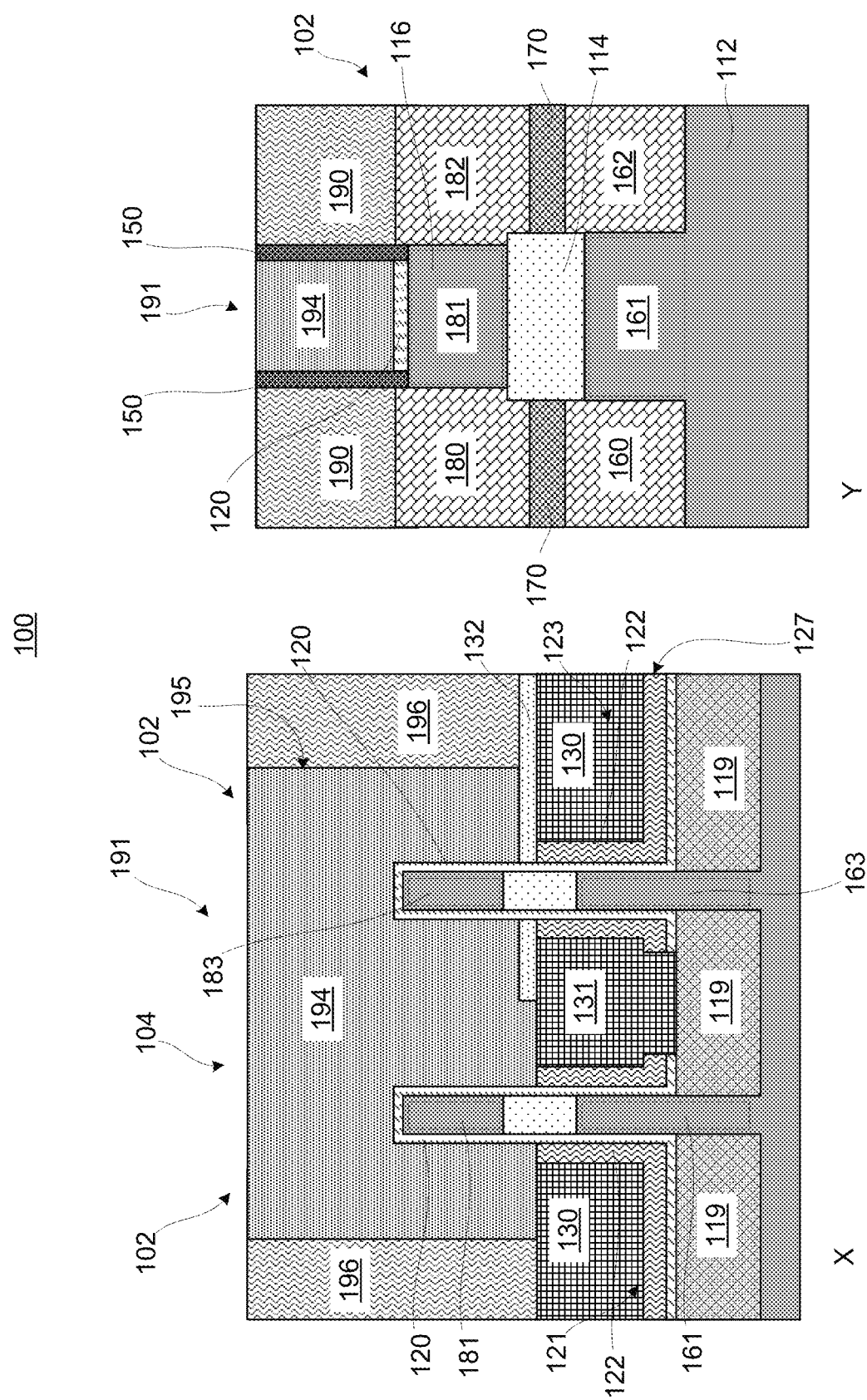

FIG. 17 depicts a cross-sectional view of a semiconductor device 100 shown after respective fabrication operations, in accordance with one or more embodiments. At the present fabrication operations, a replacement gate structure 194 is formed within the gate opening 191, the replacement gate structure is patterned (if needed), and fill material 196 is formed. The replacement gate structure 194 may include a gate dielectric layer portion (not shown), a work function metal layer portion (not shown), a gate conductor layer portion, a gate cap, or the like.

In some embodiments, a gate dielectric layer is formed over sidewalls and a bottom surface of the gate opening 191 and the topmost surface of the fill material 190. The gate dielectric layer may be formed by conformally depositing a dielectric material by CVD or atomic layer deposition (ALD) over the sidewalls and the bottom surface of the gate opening 191 42 and the topmost surface of the fill material 190. In one embodiment, the gate dielectric layer is composed of a high-k material having a dielectric constant greater than silicon oxide. Exemplary high-k materials include, but are not limited to, HfO2, ZrO2, La2O3, Al2O3, TiO2, SrTiO3, LaAlO3, Y2O3, HfOxNy, ZrOxNy, La2OxNy, Al2OxNy, TiOxNy, SrTiOxNy, LaAlOxNy, Y2OxNy, SiON, SiNx, a silicate thereof, and an alloy thereof. Each value of x is independently from 0.5 to 3 and each value of y is independently from 0 to 2. The gate dielectric layer may have a thickness from 0.9 nm to 10 nm, with a thickness ranging from 1.0 nm to 3 nm being more typical. In some embodiments, where the upper FinFET is to share a gate with the lower FinFET, the gate dielectric may not be formed.

Subsequently, a work function metal layer may by conformally deposited. In one embodiment and when the fins 102 are provided for n-type FinFETs, the work function metal layer may include a first metal that effectuates an n-type threshold voltage shift. As used herein, "threshold voltage" is the lowest attainable gate voltage that will turn on a semiconductor device, e.g., transistor, by making the channel of the device conductive. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. The work function metal layer may include TiAlC, TaAlC, TiAl, Ti, or Al. The work function of the work function metal layer may range from 4.1 eV to 4.3 eV. The work function metal layer may be formed by a suitable deposition process such as, for example, CVD, PVD or ALD. The work function metal layer that is formed may have a thickness ranging from 1 nm to 10 nm, although lesser and greater thicknesses can also be employed.

Next, a gate conductor layer may be formed over the work function metal layer. The gate conductor layer may include any conductive material including, for example, doped polysilicon, Al, Au, Ag, Cu or W. The gate conductor layer may be formed by a conventional deposition process such as, for example, CVD, PVD or ALD.

Portions of the work function metal layer, the gate conductor layer, the gate dielectric layer (not shown), and gate cap (if present) that are located above the topmost surface of the fill material 190 are removed by employing a planarization process, such as, for example, CMP. As such, the top surface of the replacement gate structure may be coplanar with the top surface of fill material 190, Next, the replacement gate structure may be patterned or otherwise cut. The replacement gate structure may be patterned by lithography and etching. The lithographic step includes applying a photoresist layer (not shown) atop the replacement gate structure and fill material 190, exposing the photoresist layer to a desired pattern of radiation, and developing the exposed photoresist layer utilizing a conventional resist developer. The etching process may be a dry etch and/or a wet chemical etch. The etching process transfers the pattern from the patterned photoresist layer to the replacement gate structure. The etching may be elective to the material(s) of isolation layer 132, isolation region 130, or the like. As depicted, the patterning of the replacement gate structure may define or otherwise form upper gate 104. After forming the upper gate 104, the patterned photoresist layer can be removed utilizing a conventional resist stripping process.

Subsequently, fill material 196 may be formed. Fill material 196 may be an ILD that is formed within the upper gate 104 cate cut region(s). The ILD may include a dielectric material such as undoped silicon oxide, doped silicon oxide, silicon nitride, porous or non-porous organosilicate glass, porous or non-porous nitrogen-doped organosilicate glass, or a combination thereof. The ILD layer may be formed by CVD, PVD or spin coating. The thickness of the ILD layer may be selected so that an entirety of the top surface of the ILD layer is formed above the top surface of the replacement gate structure. Fill material 196 may be subsequently planarized, for example, by CMP and/or a recess etch using the replacement gate structure as an etch stop. After the planarization, the ILD layer has a topmost surface coplanar with the top surface of the replacement gate structure and or fill material 190.

In an embodiment, as depicted, the replacement gate structure may include an end surface 195 that is inset from a side surface 127 of lower gate 123. As such, a lower gate 123 contact may be formed within fill material 196, through isolation layer 132, and through isolation region 130 and be in physical contact with the lower gate 123.

Semiconductor device 100 may undergo further fabrication stages, as are known in the art. For example, another ILD layer may be formed, S/D contact openings may be formed, gate contact openings may be formed, S/D region contacts may be formed, gate contacts may be formed, or the like.

For clarity, semiconductor device 100 may include an upper gate 104 that is the gate for two upper FinFETs associated with different fins 102. For example, upper gate 104 is over channel region 181 of a first upper FinFET and is over channel region 183 of a second upper FinFET. The upper gate 104 may be formed directly upon lower gate 121. Lower gate 121 is the gate associated with a lower FinFET below one of the upper FinFETs. An isolation layer 132 may separate the upper gate 104 from another lower gate 123. Lower gate 123 is the gate associated with a lower FinFET below the other of the upper FinFETs. For example, lower gate 121 is over channel region 161 of a first lower FinFET and a separate lower gate 123 is is over channel region 163 of a second lower FinFET.

Because the upper gate 104 contacts or is formed directly upon lower gate 121, a single effective gate may be shared by the upper FinFETs and one of the lower FinFETs, while the other lower FinFET is associated with a non-shared or distinct lower gate 123. In an alternative implementation, the isolation layer 132 may separate the upper gate 104 of both the upper FinFETs from each of the separated lower gates 121, 123 of the lower FinFETs.

The lower gate 121 and lower gate 123 may be associated with neighboring fins 102. The lower gate 121 may have a substantially vertical portion upon the lower channel region 161 and may have a substantially horizontal portion upon the STI region 119 that is between the neighboring fins 102. Similarly, the lower gate 123 may have a substantially vertical portion upon the lower channel region 163 and may have a substantially horizontal portion upon the STI region 119 that is between the neighboring fins 102. As such, the lower gate 121 and lower gate 123 combination may have a separated "U" shape, or the like, where a portion of the horizontal part of the "U" shape is removed while the vertical portion and horizontal portion of the lower gate 121, 123 remain. Fill region 131 material may generally fill the volume of the removed horizontal part of the "U" shape of the lower gate 121, 123 combination.

Figure 33:
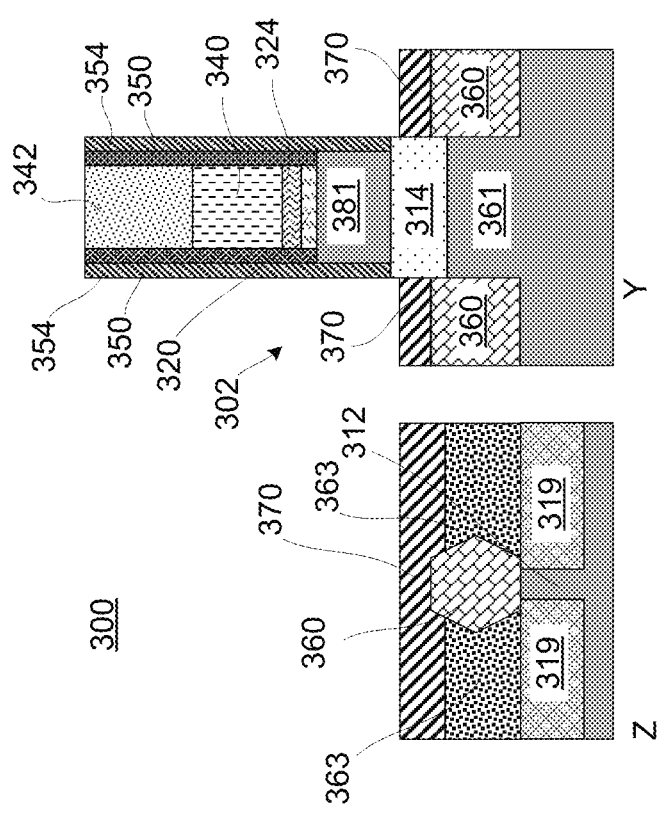

The respective end surfaces of upper channel region 181, 183 may be inset relative to the respective end surfaces of each of the other fin 102 materials (e.g., dielectric layer 114 portion and lower channel region 161, 163, or the like) due to utilizing a sacrificial spacer, similar to sacrificial spacer 354 shown in FIG. 33, to protect the end surfaces of the upper channel region 181, 183 from growing epitaxial material therefrom during the lower S/D region formation operations.

Figure 18:
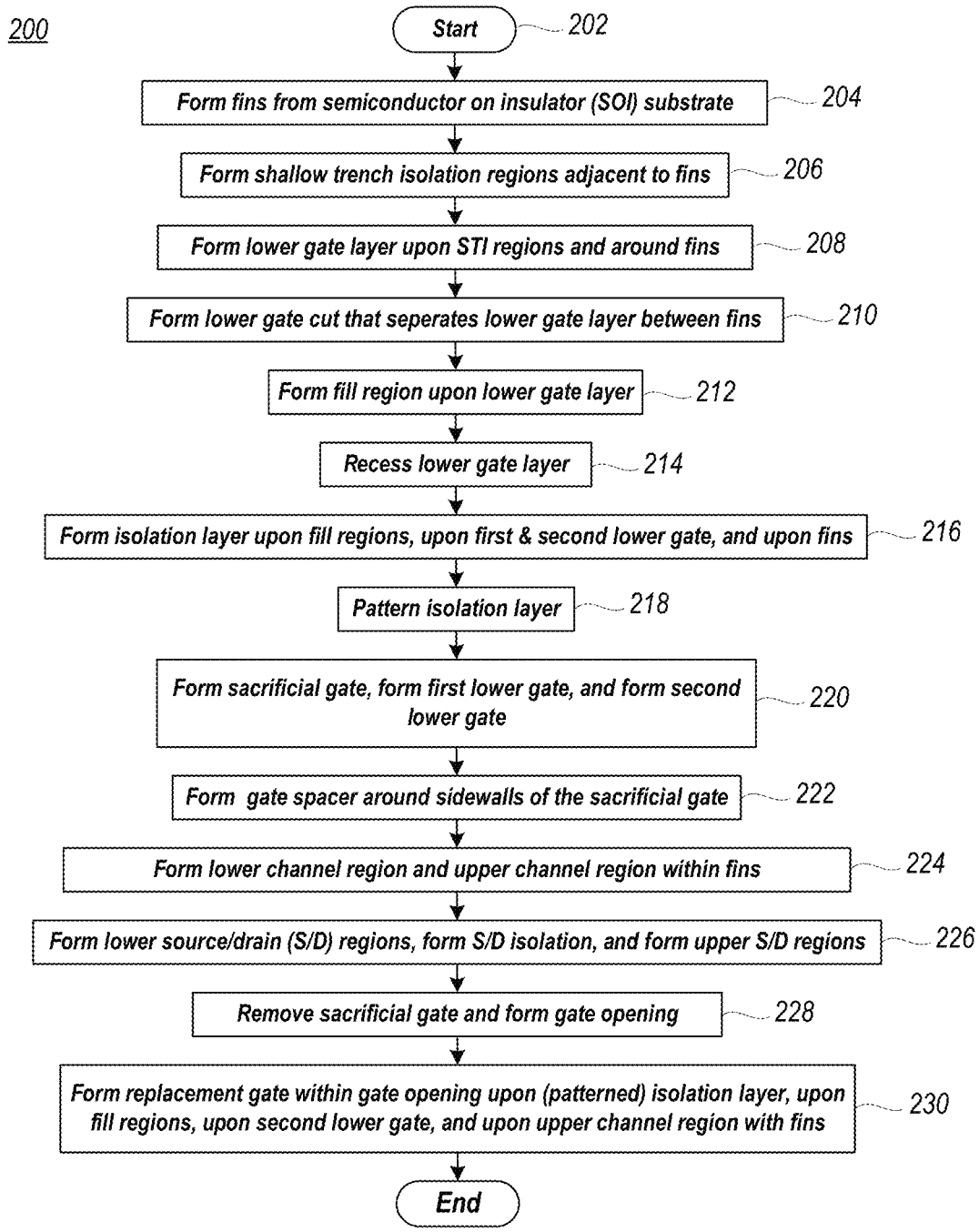
FIG. 18 depicts a flow diagram illustrating a semiconductor device fabrication method, in accordance with one or more embodiments.

FIG. 18 is a flow diagram illustrating a semiconductor device 100 fabrication method 200, in accordance with one or more embodiments. Method 200 begins with forming fins 102 from substrate 110 (block 204). For example, a first fin 102 and a second fin 102 (i.e., a fin pair) may be formed upon or within substrate 110.

Method 200 may continue with forming STI region(s) 119 adjacent to fins 102 (block 206). For example, STI region 119 material may be formed around the fins 102.

Method 200 may continue with forming gate dielectric layer 120 upon the STI region(s) and upon and around fins 102 and with forming a lower gate layer, such as work function layer 122 upon the gate dielectric layer 120 (block 208). Method 200 may continue with forming a lower gate cut region that separates the gate layer into two electrically and/or physically distinct layers (block 210).

Method 200 may continue with forming fill region(s) 130, 131 upon the lower gate layer (block 212) and removing the lower gate layer above the top surface of the fill regions 130, 131 (block 214). Method 200 may continue with forming isolation layer 132 and may optionally continue with patterning the isolation layer 132 (block 218) according to whether a top FinFET should or should not share a gate with a bottom FinFET that are both integrate to the same FinFET fin 102.

Method 200 may continue with forming a sacrificial gate structure by forming one or more sacrificial gate structure layers and with forming a first lower gate 121 and forming a second lower gate 123 (block 220). The sacrificial gate structure may be formed and the first lower gate 121 and second lower gate 123 may be formed by patterning the sacrificial gate structure layers and the lower gate layers associated with each of the first lower gate 121 and second lower gate 123.

Method 200 may continue with forming gate spacer 150 around the sacrificial gate structure (block 222). Method 200 may continue with forming a lower channel region 161, 162 and with forming an upper channel region 181, 183 within fin 102, respectively, by recessing each fin 102 outside the footprint of the gate spacer 150 (block 224). Method 200 may continue with removing the sacrificial gate structure and forming gate opening 191 (block 228). The gate opening 191 generally exposes the isolation layer 132 and/or exposes the upper surface of lower gate(s) 121, 123, as desired. Method 200 may continue with forming a replacement gate structure within the gate opening 191 upon the isolation layer 132 and/or the upper surface of lower gate(s) 121, 123, as desired.

Figure 19:
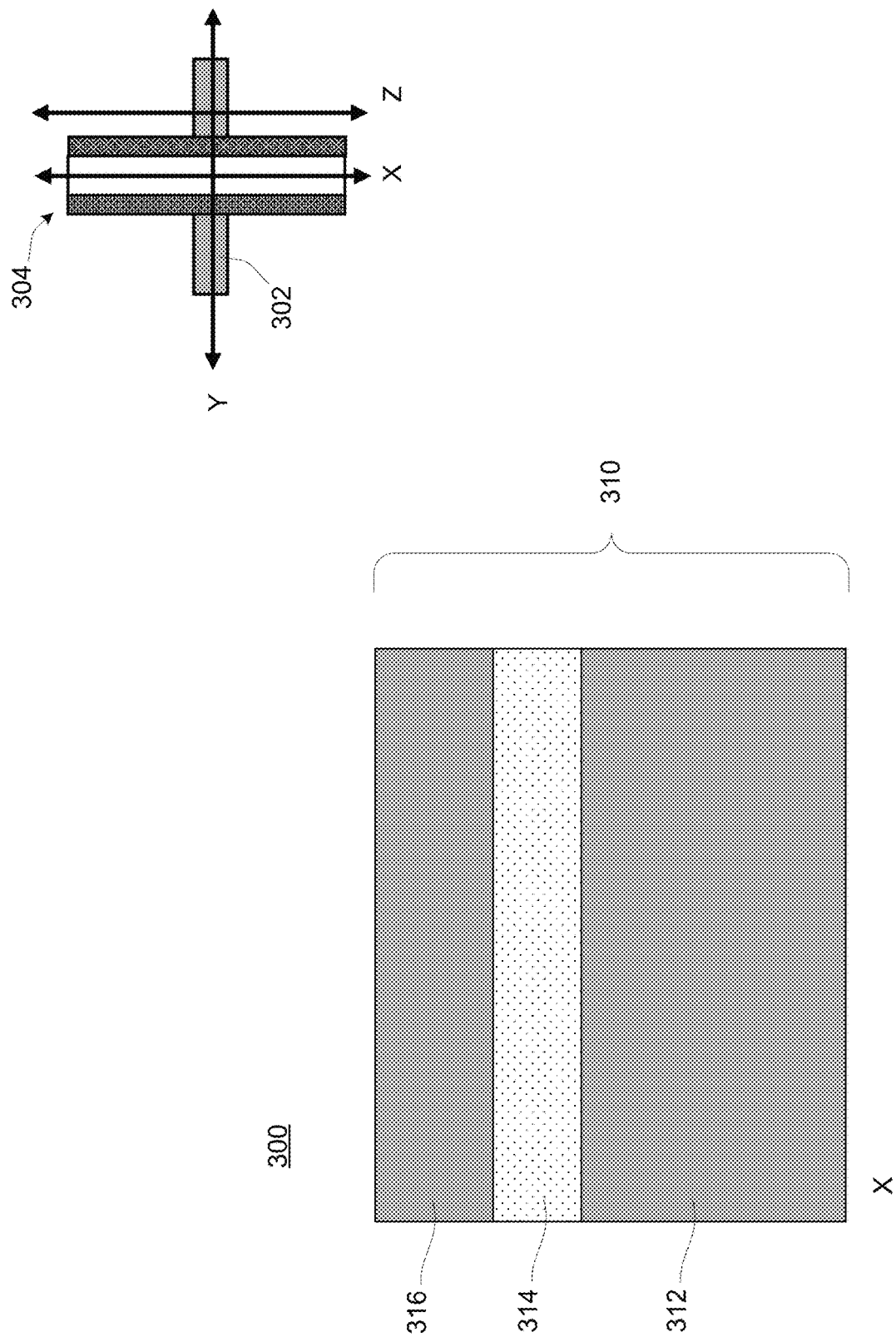

FIG. 19 depicts a cross-sectional view of a semiconductor device 300 shown after respective fabrication operations, in accordance with one or more embodiments. At the present fabrication operations, a substrate 310 is formed or otherwise provided. Substrate 310 may be a semiconductor on insulator (SOI) substrate, or the like. Substrate 310 may include a first semiconductor layer 312, a dielectric layer 314, and a second semiconductor layer 316. The first semiconductor layer 312 and the second semiconductor layer 316 are used to form semiconductor fins for a stacked fin CMOS device, as described in more detail below. The dielectric layer 314 serves as an insulator between the first semiconductor layer 312 and the second semiconductor layer 316.

The first semiconductor layer 312 may include a semiconducting material such as, for example, Si, SiC, SiGe, SiGeC, GaAs, InAs, InP as well as other III/V or II/VI compound semiconductors. In one embodiment, the first semiconductor layer 312 is composed of a single crystalline semiconductor material, such as, for example, single crystalline silicon. The first semiconductor layer 312 may be doped with p-type dopants or n-type dopants. Examples of p-type dopants for a silicon containing semiconductor material include, but are not limited to, boron, aluminum, gallium and indium. Examples of n-type dopants for a silicon containing semiconductor material, include but are not limited to, antimony, arsenic and phosphorous. The thickness of the first semiconductor layer 312 can be from 10 nm to 150 nm, although lesser and greater thicknesses can also be employed.

The dielectric layer 314 may include a dielectric material such as, for example, silicon oxide, silicon nitride, boron nitride, silicon oxynitride, or a combination thereof. In one embodiment, each of the dielectric layer 314 is composed of silicon oxide. The thickness of the dielectric layer 314 can be from about 20 nm to about 150 nm, although lesser and greater thicknesses can also be employed.

The second semiconductor layer 316 is comprised of any semiconducting material which may be the same as, or different from, that of the first semiconductor layer 312. Thus, the second semiconductor layer 316 may include, for example, Si, SiC, SiGe, SiGeC, GaAs, InAs, InP as well as other III/N or II/VI compound semiconductors. In one embodiment and when the first semiconductor layer 312 includes Si which is better suited for n-type FETs, the second semiconductor layer 316 may include SiGe which is better suited for p-type FETs. The second semiconductor layer 316 may be doped with dopants having a conductivity opposite to that of the first semiconductor layer 312. The thickness of the second semiconductor layer 316 can be from about 5 nm to about 150 nm, although lesser and greater thicknesses can also be employed.

The second semiconductor layer 316 may have a crystallographic orientation which is the same as, or different from, that of the first semiconductor layer 312. In one embodiment, the second semiconductor layer 316 has a crystal orientation different from that of the first semiconductor layer 312, which allows for fabricating FinFETs on a crystallographic orientation that provides optimal performance for each type of devices (i.e., p-type FinFETs and n-type FinFETs). For example, n-type FinFETs have an optimal performance when fabricated on a (100) crystallographic surface, while p-type Fin FETs have an optimal performance when fabricated on a (110) crystallographic surface.

The substrate 310 may be formed using process for providing an SOI wafer known in the art. For example, a layer transfer process can be used in which wafer bonding is employed. In the layer transfer process, two semiconductor wafers are bonded together. The two wafers used in fabricating the substrate 310 may include two SOI wafers, wherein one of the wafers includes a handle substrate (not shown), a handle dielectric layer (not shown) and the first semiconductor layer 312 and the other wafer includes the dielectric layer 314 and the second semiconductor layer 316. At least one of the wafer can be subjected to hydrogen implantation to provide a H2 implant region which can be used to split a portion of at least one of the wafers during bonding.

FIG. 19 also depicts a top view of semiconductor structure 300 and associated cross-sectional planes. For example, cross-sectional plane X is defined between the length of a fin 102 and cross-sectional plane Y is defined between the length of upper gate 104.

Figure 20:
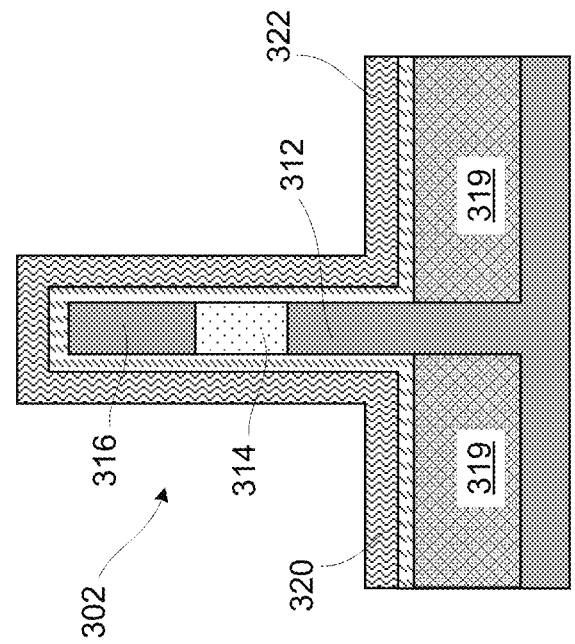

FIG. 20 depicts a cross-sectional view of a semiconductor device 300 shown after respective fabrication operations, in accordance with one or more embodiments. At the present fabrication operations, a fin stack is formed. The fin stack, which may be referred herein as fin 302, includes, from bottom to top, a first semiconductor fin formed of a portion of first semiconductor layer 312, a dielectric fin portion formed of a portion of dielectric layer 314, and a second semiconductor fin formed of a portion of second semiconductor layer 316. As used herein, a "fin" is a structure that has a first pair of sidewalls along a lengthwise direction that is longer than a second pair of sidewalls along a widthwise direction. For example, and as shown in top view depicted in FIG. 19, each of the first semiconductor 112 fin portion, the dielectric 114 fin portion, and the second semiconductor 116 fin portion can have a length along the lengthwise direction and has a width along the widthwise direction. The length is greater than the width. In one embodiment, the width can be from 5 nm to 50 nm, the length can be from 10 nm to 50 p.m.

Fin 302 may be formed by lithography and etching. The lithographic step includes applying a photoresist layer (not shown) atop the second semiconductor layer 316, exposing the photoresist layer to a desired pattern of radiation, and developing the exposed photoresist layer utilizing a conventional resist developer. The etching process may be a dry etch and/or a wet chemical etch. The etching process transfers the pattern from the patterned photoresist layer to the stack of the second semiconductor layer 316, the dielectric 314 and the first semiconductor layer 312. Each remaining portion of the first semiconductor layer 312 constitutes the first semiconductor fin portion, each remaining portion of the dielectric layer 314 constitutes the dielectric fin portion, and each remaining portion of the second semiconductor layer 316 constitutes the second semiconductor fin portion. After forming the fin 302, the patterned photoresist layer 318 can be removed utilizing a conventional resist stripping process such as, for example, ashing. In some embodiments, a sidewall image transfer process as known in the art may be used in providing the fin 302.

STI regions 319, or portion(s) thereof, may be formed by depositing STI material(s), such as a dielectric known in the art, upon the horizontal surfaces of semiconductor layer 312 and upon and between first semiconductor portions of the fin 102. The STI regions 119 may be formed by depositing the STI material by for example, PVD, CVD, ALD, or the like. As is known in the art, STI regions 319 may, at least partially, electrically isolate neighboring FinFET components or features. Exemplary STI region 319 material(s) may be a thin layer of conformal SiN and SiO2 over fill.

Figure 21:
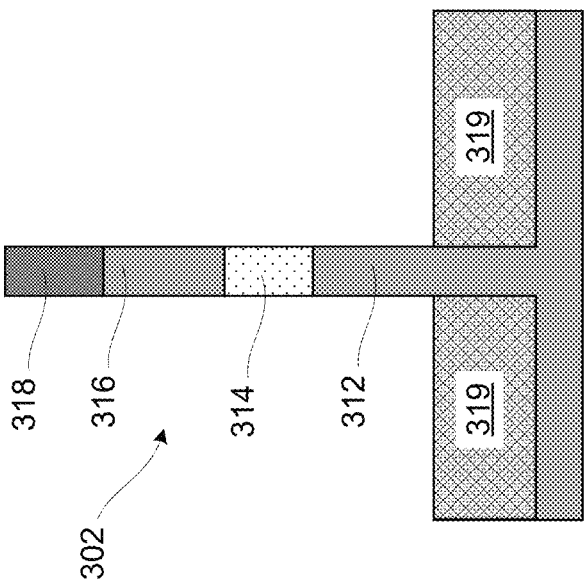
Figure 25:
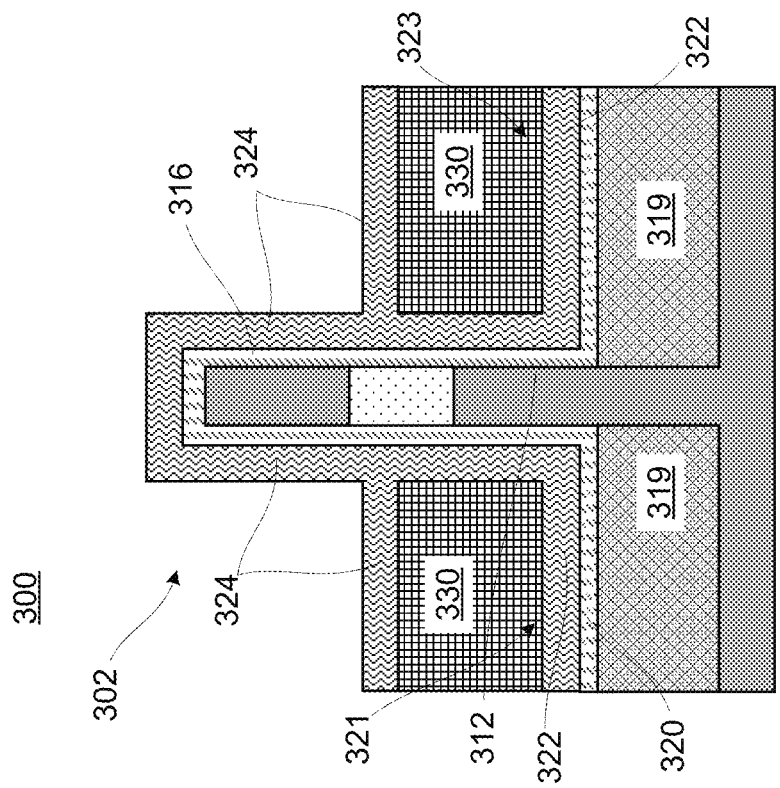

FIG. 21 depicts a cross-sectional view of a semiconductor device 300 shown after respective fabrication operations, in accordance with one or more embodiments. At the present fabrication operations, lower gate layer(s) are formed.

A gate dielectric layer 320 is formed upon STI regions 319 and upon and around fin 302. The gate dielectric layer 320 may be formed by conformally depositing a dielectric material by CVD or atomic layer deposition (ALD). In one embodiment, the gate dielectric layer 320 is composed of a high-k material having a dielectric constant greater than silicon oxide. Exemplary high-k materials include, but are not limited to, HfO2, ZrO2, La2O3, Al2O3, TiO2, SrTiO3, LaAlO3, Y2O3, HfOxNy, ZrOxNy, La2OxNy, Al2OxNy, TiOxNy, SrTiOxNy, LaAlOxNy, Y2OxNy, SiON, SiNx, a silicate thereof, and an alloy thereof. Each value of x is independently from 0.5 to 3 and each value of y is independently from 0 to 2. The gate dielectric layer 320 may have a thickness from 0.9 nm to 10 nm, with a thickness ranging from 1.0 nm to 3 nm being more typical.

Subsequently, a lower work function metal layer 322 is conformally deposited over the gate dielectric layer 320. In one embodiment and when the first semiconductor fin portion(s) are provided for n-type FinFETs, the lower work function metal layer 322 may include a first metal that effectuates an n-type threshold voltage shift. As used herein, "threshold voltage" is the lowest attainable gate voltage that will turn on a semiconductor device, e.g., transistor, by making the channel of the device conductive. The lower work function metal layer 322 may include TiAlC, TaAlC, TiAl, Ti, or Al. The work function of the lower work function metal layer 322 may range from 4.1 eV to 4.3 eV. The lower work function metal layer 322 may be formed by a suitable deposition process such as, for example, CVD, PVD or ALD. The lower work function metal layer 322 that is formed may have a thickness ranging from 1 nm to 10 nm, although lesser and greater thicknesses can also be employed.

FIG. 21 depicts a cross-sectional view of a semiconductor device 300 shown after respective fabrication operations, in accordance with one or more embodiments. At the present fabrication operations, fill regions are formed.

Fill region 330 may be an interlevel dielectric (ILD) layer formed upon lower work function metal layer 322. The ILD layer may include a dielectric material such as undoped silicon oxide, doped silicon oxide, silicon nitride, porous or non-porous organosilicate glass, porous or non-porous nitrogen-doped organosilicate glass, or a combination thereof. The ILD layer may be formed by CVD, PVD or spin coating. The thickness of the ILD layer may be selected so that an entirety of the top surface of the ILD layer is formed above the top surface of the work function metal layer 322. The ILD layer may be subsequently recessed, for example, by CMP and/or a recess etch. After the planarization, the ILD layer has a topmost surface between the top and bottom surfaces of the portion of dielectric layer 314 of fin 302.

FIG. 23 depicts a cross-sectional view of a semiconductor device 300 shown after respective fabrication operations, in accordance with one or more embodiments. At the present fabrication operations, work function metal layer 322 material above fill region 330 is removed and lower gate 321 and lower gate 323 are further partially formed.

Removal of the work function metal layer 322 material may be completed by known etching techniques. The etching process may be a dry etch and/or a wet chemical etch. The etching process may utilize the top surfaces of fill region 330 as an etch stop. The removal of work function metal layer 322 material above the top surface of fill region 330 may effectively separate the work function metal layer 322 into two physically and electrically separate or isolated portions. One portion of the work function metal layer 322 portion may be associated with the first lower gate 321 and the other work function metal layer 322 portion may be associated with the second lower gate 323.

Figure 24:
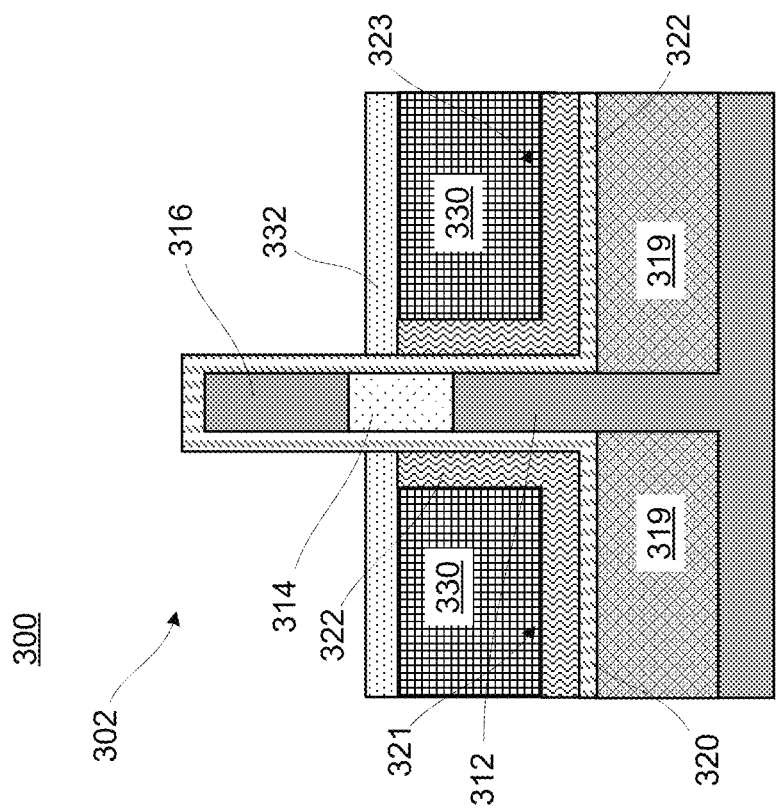

FIG. 24 depicts a cross-sectional view of a semiconductor device 300 shown after respective fabrication operations, in accordance with one or more embodiments. At the present fabrication operations, isolation layer 332 is formed upon the upper surface of the lower gates 321, 323 and upon the upper surface of fill region 330.

Isolation layer 332 may at least partially electrically isolate a top FET from a bottom FET with different polarities and being associated with the same fin 102. The isolation layer 332 may be formed by conformally depositing a dielectric material by CVD or atomic layer deposition (ALD). In one embodiment, the isolation layer 132 is composed of a dielectric material. Exemplary dielectric materials include, but are not limited to SiN, SiBCN, SiO2, AlOx etc., a silicate thereof, and an alloy thereof. The isolation layer 332 may have a thickness from 5 nm to 30 nm, with a thickness ranging from 10 nm to 20 nm being more typical.

FIG. 21 depicts a cross-sectional view of a semiconductor device 300 shown after respective fabrication operations, in accordance with one or more embodiments. At the present fabrication operations, sacrificial upper gate layer(s) are formed.

A sacrificial gate layer 324 is conformally deposited over the isolation layer 332 (if present) or upon the fill region 330, the lower gates 321, 323, and upon gate dielectric layer 320, as depicted. The sacrificial gate layer 324 may include TiAlC, TaAlC, TiAl, Ti, TiN, or Al. Alternatively, the sacrificial gate layer 324 may include a dielectric material such as, for example, silicon oxide, silicon nitride, boron nitride, silicon oxynitride, or a combination thereof. In one embodiment, each of the sacrificial gate layer 324 is composed of silicon oxide. The sacrificial gate layer 324 may be formed by a suitable deposition process such as, for example, CVD, PVD or ALD. The sacrificial gate layer 324 that is formed may have a thickness ranging from 1 nm to 10 nm, although lesser and greater thicknesses can also be employed.

Figure 26:
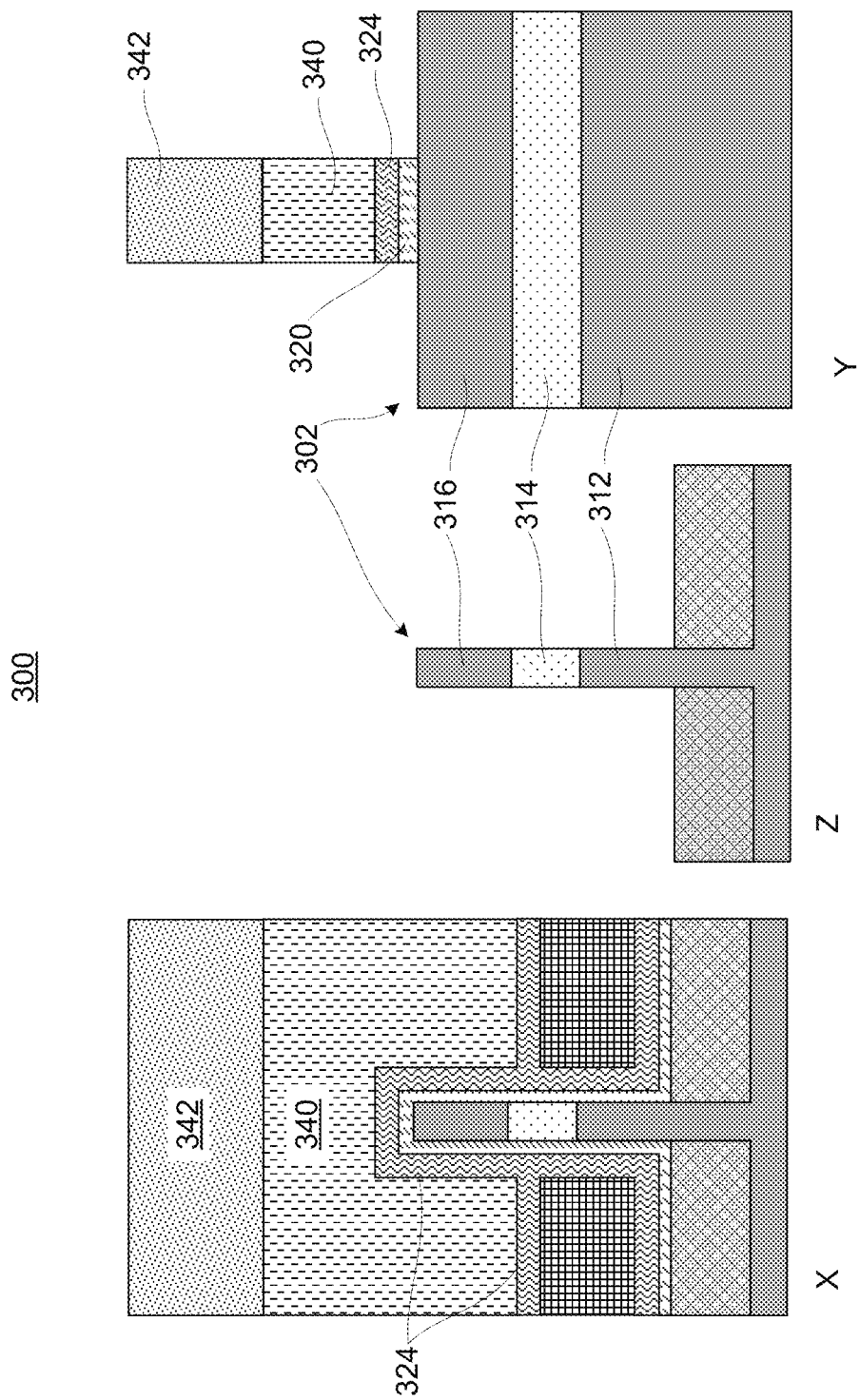

FIG. 26 depicts a cross-sectional view of a semiconductor device 300 shown after respective fabrication operations, in accordance with one or more embodiments. At the present fabrication operations, sacrificial gate layer 340 and sacrificial gate cap layer 342 are formed, a sacrificial gate structure is formed therefrom, and lower gates 321, 322 are formed.

In some embodiments, a sacrificial gate dielectric layer may first be formed upon the sacrificial gate layer 324. Next, the sacrificial gate layer 340 and the sacrificial gate cap layer 342 may be formed upon the sacrificial gate dielectric layer. In some embodiments, as depicted, the sacrificial gate dielectric layer can be omitted. When present, the sacrificial gate dielectric layer includes a dielectric material such as an oxide or a nitride. In one embodiment, the sacrificial gate dielectric layer may include silicon oxide, silicon nitride, or silicon oxynitride. The sacrificial gate dielectric layer that is formed may have a thickness from 1 nm to 10 nm, although lesser and greater thicknesses can also be employed.

The sacrificial gate layer 340 may include a semiconductor material such as polysilicon or a silicon-containing semiconductor alloy such as a silicon-germanium alloy. The sacrificial gate layer may be formed using chemical vapor deposition (CVD) or plasma enhanced chemical vapor deposition (PECVD). The sacrificial gate layer that is formed may have a thickness from 20 nm to 300 nm, although lesser and greater thicknesses can also be employed.

The sacrificial gate cap layer 342 may include a dielectric material such as an oxide, a nitride or an oxynitride. In one embodiment, the sacrificial gate cap layer 342 is comprised of silicon nitride. The sacrificial gate cap layer can be formed utilizing a conventional deposition process including, for example, CVD and PECVD. The sacrificial gate cap layer that is formed may have a thickness from 10 nm to 200 nm, although lesser and greater thicknesses can also be employed.

The sacrificial gate structure may be formed by lithography and by etching. Specifically, a photoresist layer (not shown) is applied over the topmost surface of the sacrificial gate cap layer 342 and is lithographically patterned by lithographic exposure and development. The pattern in the photoresist layer is transferred into the sacrificial gate material stack by an etch, which can be an anisotropic etch such as RIE. The remaining portions of the material stack after the etch may effectively form the sacrificial gate structure. The patterned photoresist layer may be subsequently removed. The sacrificial gate structure may include a portion of gate dielectric 320, a portion of the sacrificial layer 324, a portion of the sacrificial gate 340, and the gate cap 342. In some embodiments, the sacrificial gate cap 342 may be omitted. The width of the sacrificial gate structure is exemplarity depicted.

The lower gate 321, 323 may be formed by lithography and by etching. Specifically, the photoresist layer (not shown) is applied over the topmost surface of the work function metal layer 322 of the lower gate 321, 323 and is lithographically patterned by lithographic exposure and development. The pattern in the photoresist layer is transferred into the lower gate 321, 323 by an etch, which can be an anisotropic etch such as RIE. The remaining portions of the lower gate 321, 323 after the etch may effectively form the lower gates 321, 323, respectively. The patterned photoresist layer may be subsequently removed. In some embodiments, lower gate 321, 323 may have a substantially similar width relative to the sacrificial gate structure there above. Each lower gate 321, 323 stack may consist of a portion of the gate dielectric layer 320 and a portion of the work function layer 322 thereupon. The lower gate 321, 323 may have a substantially similar width and may be vertically in-line relative to the sacrificial gate structure there above. For clarity, the lower gate 321, 323 stack and the sacrificial gate structure stack may include a gate dielectric 320 material portion formed of the same gate dielectric layer.

Figure 27:
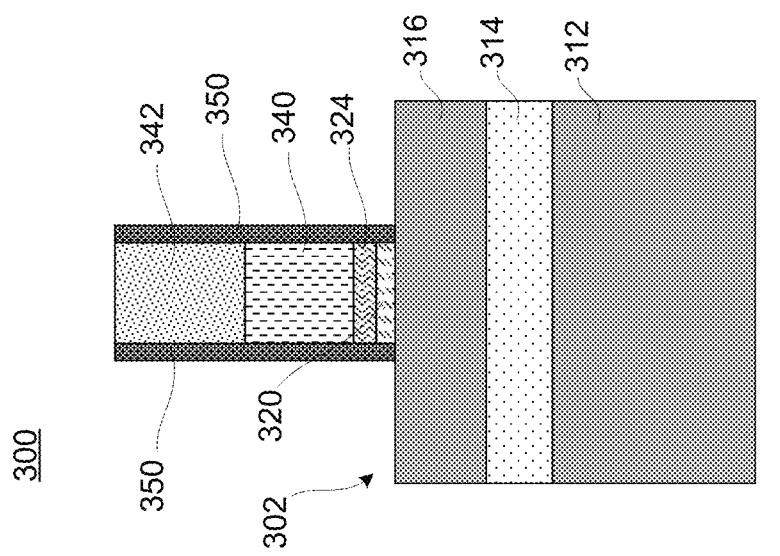

FIG. 27 depicts a cross-sectional view of a semiconductor device 300 shown after respective fabrication operations, in accordance with one or more embodiments. At the present fabrication operations, gate spacer 350 is formed around the sacrificial gate structure.

The gate spacer 350 may include a dielectric material such as, for example, an oxide, a nitride, an oxynitride, or any combination thereof. For example, the gate spacer 350 may be composed of silicon nitride, silicon boron carbon nitride, or silicon carbon oxynitride. The gate spacer 350 can be formed by first providing a conformal gate spacer material layer (not shown) on exposed surfaces of the sacrificial gate structure and then etching the conformal gate spacer material layer to remove horizontal portions of the conformal gate spacer material layer. The conformal gate spacer material layer can be provided by a deposition process including, for example, CVD, PECVD, or physical vapor deposition (PVD). The etching of the conformal gate spacer material layer may be performed by a dry etch process such as, for example, RIE. The remaining portions of the conformal gate spacer material layer may constitute the gate spacer(s) 350. The width of each gate spacer 150, as measured at the vertical base of the gate spacer 350 directly upon the gate structure can be from 5 nm to 100 nm, although lesser and greater widths can also be employed.

Figure 28:
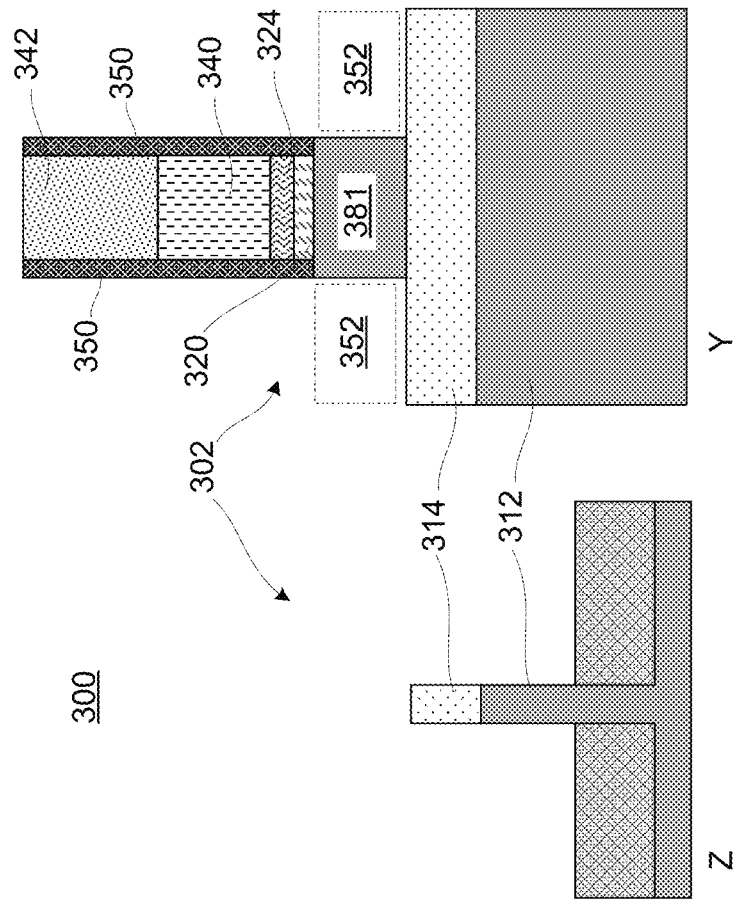

FIG. 28 depicts a cross-sectional view of a semiconductor device 300 shown after respective fabrication operations, in accordance with one or more embodiments. At the present fabrication operations, fin 302 is partially recessed outside the footprint of the gate spacer 350.

The fin 302 may be recessed outside the footprint of gate spacer 350 by etching and utilizing the top surface(s) of dielectric layer 314 as an etch stop. The removal of portions of the second semiconductor layer 316 may form fin opening 352 outside the footprint of the gate spacer 350. The end surface(s) of the second semiconductor layer 316 portion the fin 302 may be coplanar with the sidewalls of the gate spacer 150.

Figure 29:
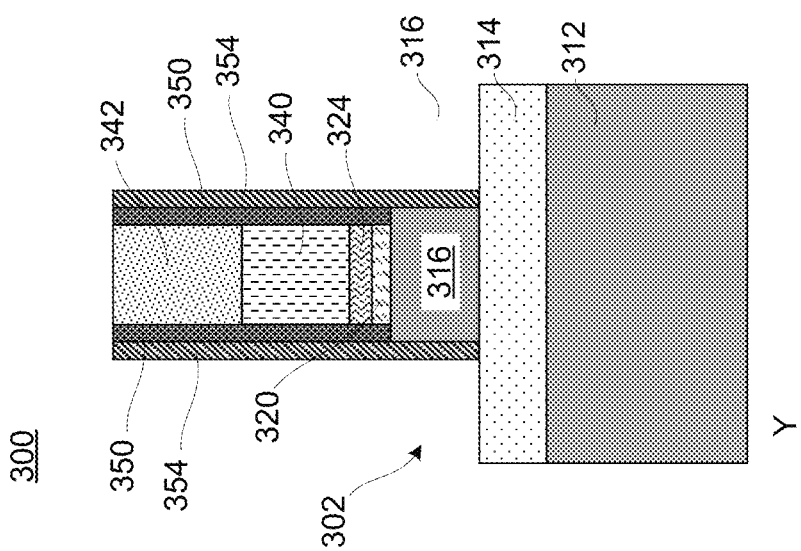

FIG. 29 depicts a cross-sectional view of a semiconductor device 300 shown after respective fabrication operations, in accordance with one or more embodiments. At the present fabrication operations, gate spacer 354 is formed.

The gate spacer 354 may include a dielectric material such as, for example, an oxide, a nitride, an oxynitride, or any combination thereof. For example, the gate spacer 354 may be composed of silicon nitride, silicon boron carbon nitride, or silicon carbon oxynitride. The gate spacer 354 can be formed by first providing a conformal gate spacer material layer (not shown) on exposed surfaces of the sacrificial gate structure and then etching the conformal gate spacer material layer to remove horizontal portions of the conformal gate spacer material layer. The conformal gate spacer material layer can be provided by a deposition process including, for example, CVD, PECVD, or physical vapor deposition (PVD). The etching of the conformal gate spacer material layer may be performed by a dry etch process such as, for example, RIE. The remaining portions of the conformal gate spacer material layer may constitute the gate spacer(s) 354. The width of each gate spacer 354, as measured at the vertical base of the gate spacer 354 directly upon the gate spacer 350 can be from 5 nm to 100 nm, although lesser and greater widths can also be employed. The gate spacer 354 may protect the end surfaces of the semiconductor layer 316 portion the fin 302 from epitaxial material growth thereupon associated with the formation of the lower source/drain regions.

Figure 30:
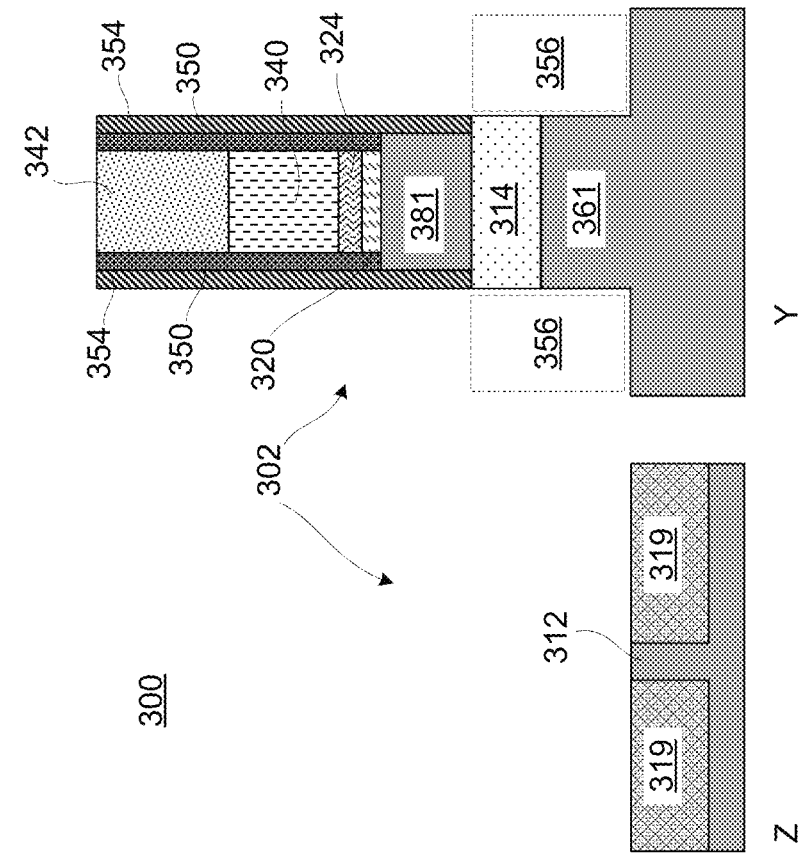

FIG. 30 depicts a cross-sectional view of a semiconductor device 300 shown after respective fabrication operations, in accordance with one or more embodiments. At the present fabrication operations, fin 302 is further recessed outside the footprint of the gate spacer 354.

The fin 302 may be recessed outside the footprint of gate spacer 354 by etching and utilizing the top surface(s) of STI region 319 as an etch stop. The removal of portions of the dielectric layer 314 and the first semiconductor layer 312 may form fin opening 356 outside the footprint of the gate spacer 354. The end surface(s) of the dielectric layer 314 portion and the first semiconductor layer 312 portion the fin 302 may be coplanar with the sidewalls of the gate spacer 354.

FIG. 31 depicts a cross-sectional view of a semiconductor device 300 shown after respective fabrication operations, in accordance with one or more embodiments. At the present fabrication operations, lower source/drain region 360 is formed, lower drain/source region 362 is formed.

Lower source/drain region 360 and lower drain/source region 362 (herein collectively referred to as lower source/drain regions) are formed upon and adjacent to the recessed first semiconductor fin portion retained from semiconductor layer 312. In some embodiments, the lower source/drain regions may be formed by epitaxially growing source/drain (S/D) material from one or more exposed semiconductor layer 312 surface(s). Exemplary lower source/drain regions materials may be but are not limited to: Si, Ge, SiGe, SiC, or the like.

FIG. 32 depicts a cross-sectional view of a semiconductor device 300 shown after respective fabrication operations, in accordance with one or more embodiments. At the present fabrication operations, lower S/D contact sacrificial material 363 is formed.

S/D contact sacrificial material 363 may be formed upon STI region 319 and upon the lower source/drain regions. S/D contact sacrificial material 363 may be formed by depositing a dielectric material, materials, or layers of material(s), by PVD, CVD, ALD, or the like. Exemplary S/D contact sacrificial material 363 materials may be SiO$_2$, a combination of a SiN liner and SiO$_2$ liner, or the like. The S/D contact sacrificial material 363 material thickness may be chosen so that the S/D contact sacrificial material 363 has a top surface that is coplanar, substantially coplanar, or below the respective top or bottom surfaces of the lower source/drain regions.

FIG. 33 depicts a cross-sectional view of a semiconductor device 300 shown after respective fabrication operations, in accordance with one or more embodiments. At the present fabrication operations, S/D isolation layer 370 is formed.

S/D isolation layer 170 may be formed upon the lower source/drain regions and upon S/D contact sacrificial material 363. S/D isolation layer 170 may be formed by depositing a dielectric material, materials, or layers of material(s), by PVD, CVD, ALD, or the like. Exemplary S/D isolation layer 370 materials may be SiO$_2$, a combination of a SiN liner and SiO$_2$ liner, or the like. In some embodiments, the S/D isolation layer 370 material is chosen such that the material may electrically isolate, adequately electrically isolate, or the like, the lower source/drain regions from the upper source/drain regions. The S/D isolation layer 370 material thickness may be chosen so that the S/D isolation layer 370 material layer has a top surface and bottom surface that is coplanar, substantially coplanar, or between the respective top or bottom surfaces of the portion of dielectric layer 314 of fin 302.

Figure 34:
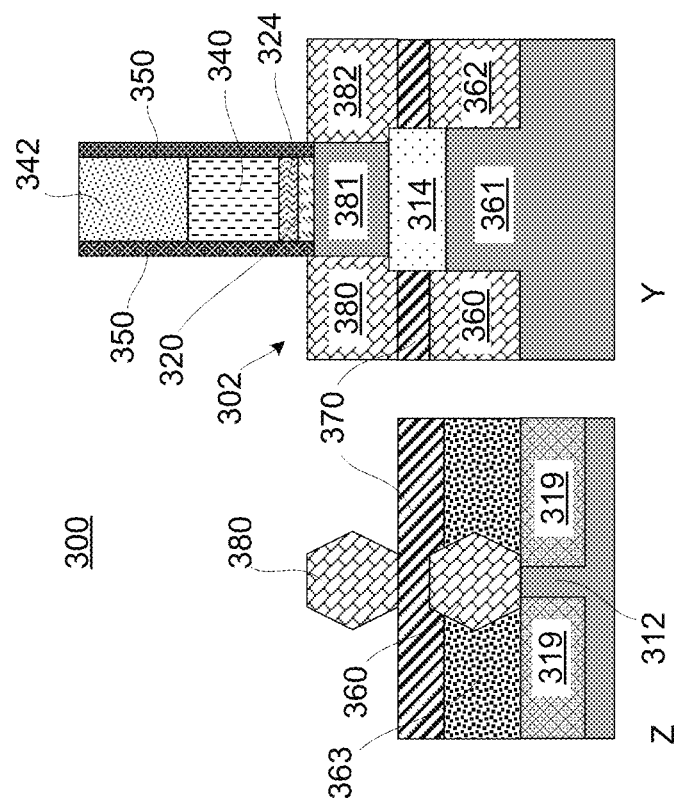

FIG. 34 depicts a cross-sectional view of a semiconductor device 300 shown after respective fabrication operations, in accordance with one or more embodiments. At the present fabrication operations, gate spacer 354 is removed, upper source/drain region 380 is formed and upper drain/source region 382 is formed.

Removal gate spacer 354 may be completed by known etching techniques. The etching process may be a dry etch and/or a wet chemical etch. Removal of gate spacer 354 may expose at least the end surfaces of channel region 381 and gate spacer 350. Upper source/drain region 380 and upper drain/source region 382 (herein collectively referred to as upper source/drain regions) are formed upon and adjacent to the channel region 381. In some embodiments, the upper source/drain regions may be formed by epitaxially growing source/drain (S/D) material from one or more exposed channel region 381 surface(s). Exemplary upper source/drain regions materials may be but are not limited to: Si, Ge, SiGe, SiC, or the like.

For clarity, the semiconductor fin portion retained from semiconductor layer 312 may serve as a lower FET channel region 361 between lower source/drain region 360 and lower drain/source region 362 of a first lower FinFET of fin 102. Similarly, the semiconductor fin portion retained from semiconductor layer 316 may serve as a upper FET channel region 381 between upper source/drain region 380 and upper drain/source region 382 of a first upper FinFET of the same fin 102.

Figure 35:
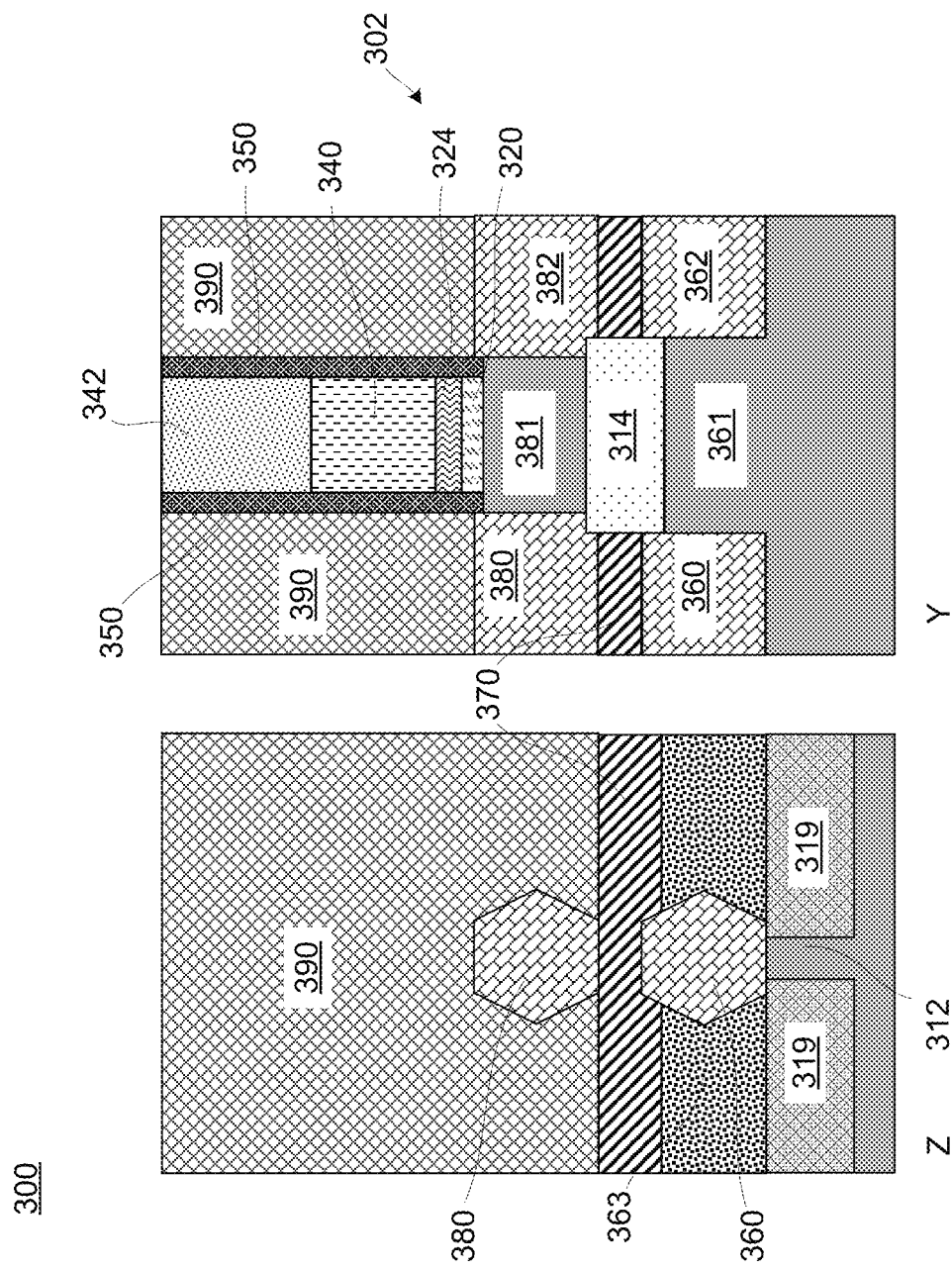

FIG. 35 depicts a cross-sectional view of a semiconductor device 300 shown after respective fabrication operations, in accordance with one or more embodiments. At the present fabrication operations, fill material 390 is formed.

Fill material 390 may be an ILD that is formed over the upper source/drain regions and upon the gate spacer 350 to laterally surround the sacrificial gate structure. The ILD may include a dielectric material such as undoped silicon oxide, doped silicon oxide, silicon nitride, porous or non-porous organosilicate glass, porous or non-porous nitrogen-doped organosilicate glass, or a combination thereof. The ILD layer may be formed by CVD, PVD or spin coating. The thickness of the ILD layer may be selected so that an entirety of the top surface of the ILD layer is formed above the top surface of the sacrificial gate cap 342.

Figure 36:
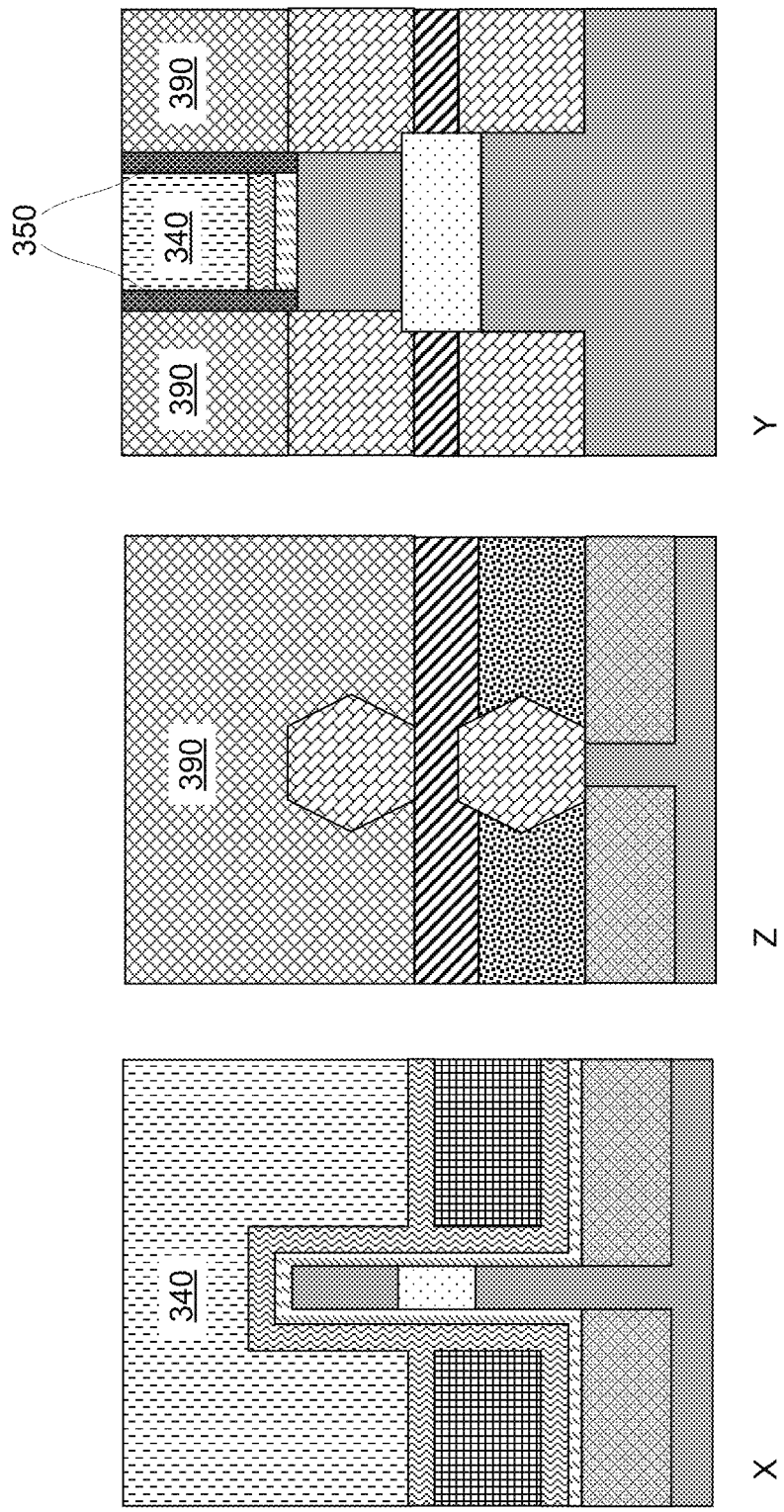

The ILD layer may be subsequently planarized, for example, by CMP and/or a recess etch using the sacrificial gate cap 340 as an etch stop. After the planarization, the ILD layer has a topmost surface coplanar with the top surface of the sacrificial gate cap 342. In some embodiments, as depicted in FIG. 36, the ILD layer may be subsequently planarized, for example, by CMP and/or a recess etch using the sacrificial gate 340 as an etch stop. After the planarization, the ILD layer has a topmost surface coplanar with the top surface of the sacrificial gate 340.

Figure 37:
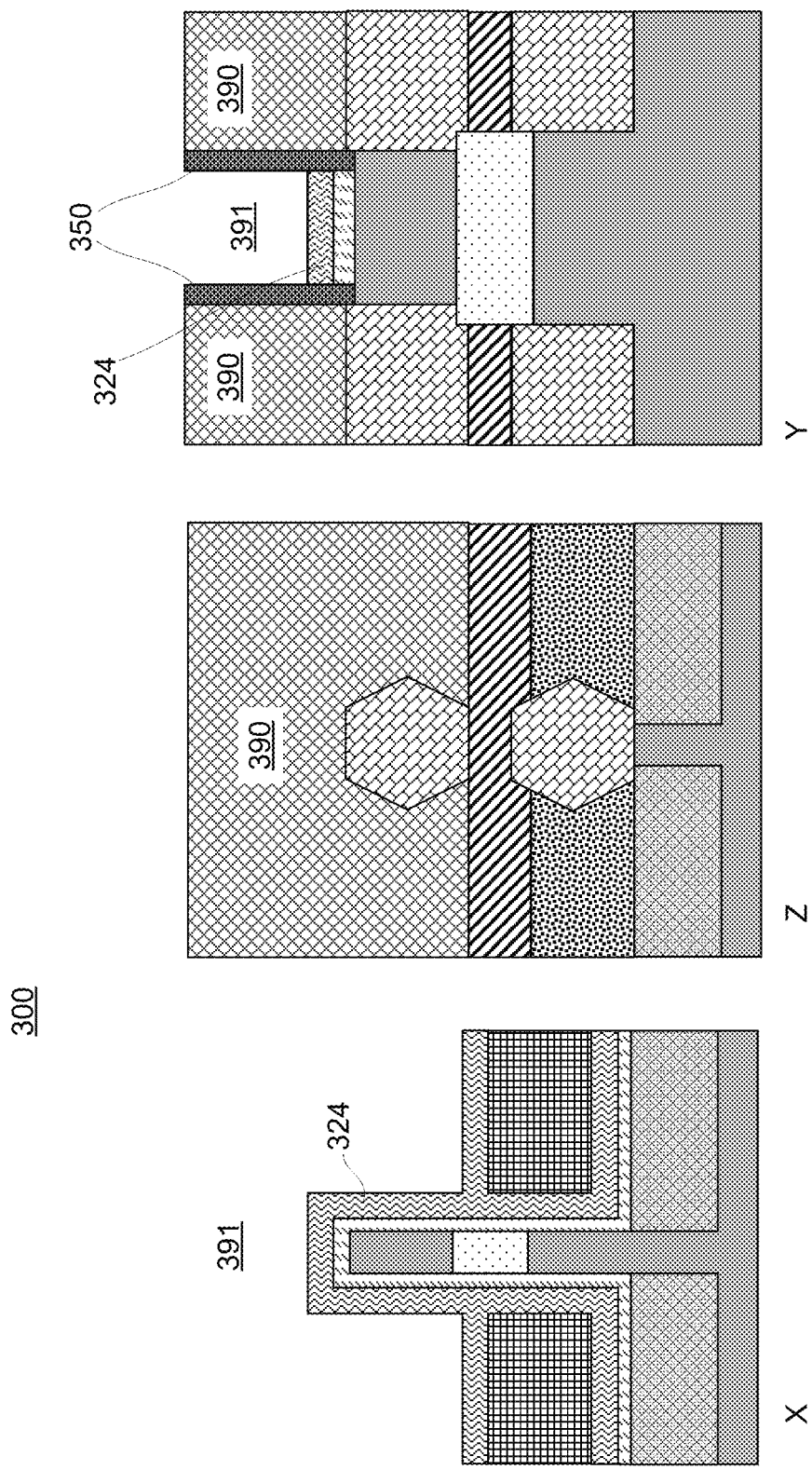

FIG. 37 depicts a cross-sectional view of a semiconductor device 300 shown after respective fabrication operations, in accordance with one or more embodiments. At the present fabrication operations, a gate opening 391 is formed by removing sacrificial gate 340. The sacrificial gate 340 may be removed selectively to the sacrificial gate layer 324, gate spacer 350, and fill material 390 by at least one etch. The at least one etch can be a dry etch and/or a wet chemical etch. The gate opening 391 is thus formed by a volume from which the sacrificial gate 340 is removed and is laterally confined by inner sidewalls of gate spacer 350. The gate cavity 391 may expose the sacrificial gate layer 324 upon each fin 302.

Figure 38:
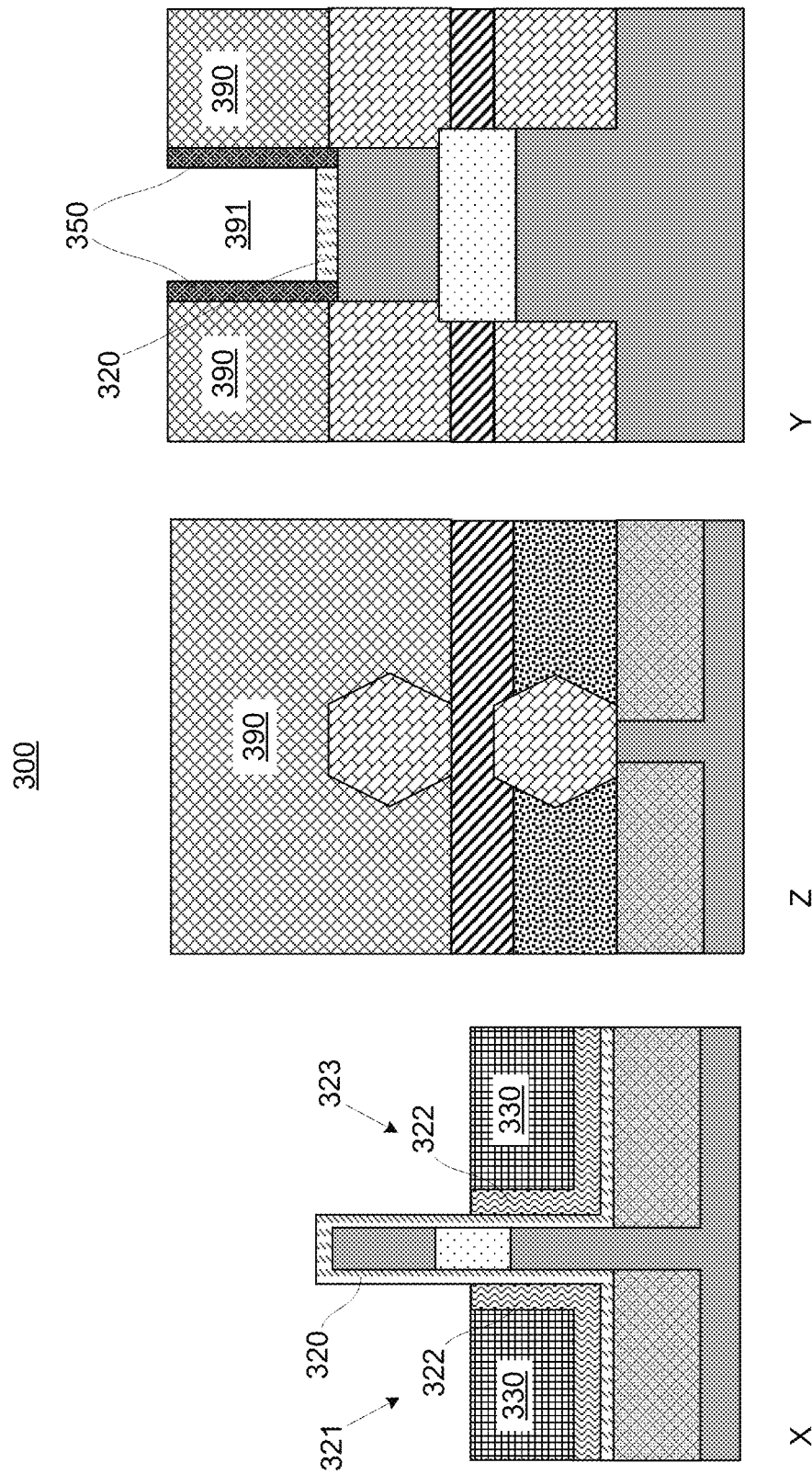

FIG. 38 depicts a cross-sectional view of a semiconductor device 300 shown after respective fabrication operations, in accordance with one or more embodiments. At the present fabrication operations, gate opening 191 is enlarged by removing sacrificial gate layer 324. The sacrificial gate layer 324 may be removed selectively to the semiconductor materials of gate dielectric layer 320, isolation layer 332 (if present), lower gate 321, lower gate 323, and fill regions 330, gate spacer 350, and fill material 390 by at least one etch. The at least one etch can be a dry etch and/or a wet chemical etch. The gate opening 391 is thus formed by a volume from which the sacrificial gate 140 and sacrificial gate layer 324 is removed and is laterally confined by inner sidewalls of gate spacer 150. The gate cavity 391 may expose the gate dielectric 320 upon fin 302, the top surface of lower gate 321, 323, top surface portions of fill region 330, or the isolation layer 332 (if present).

Figure 39:
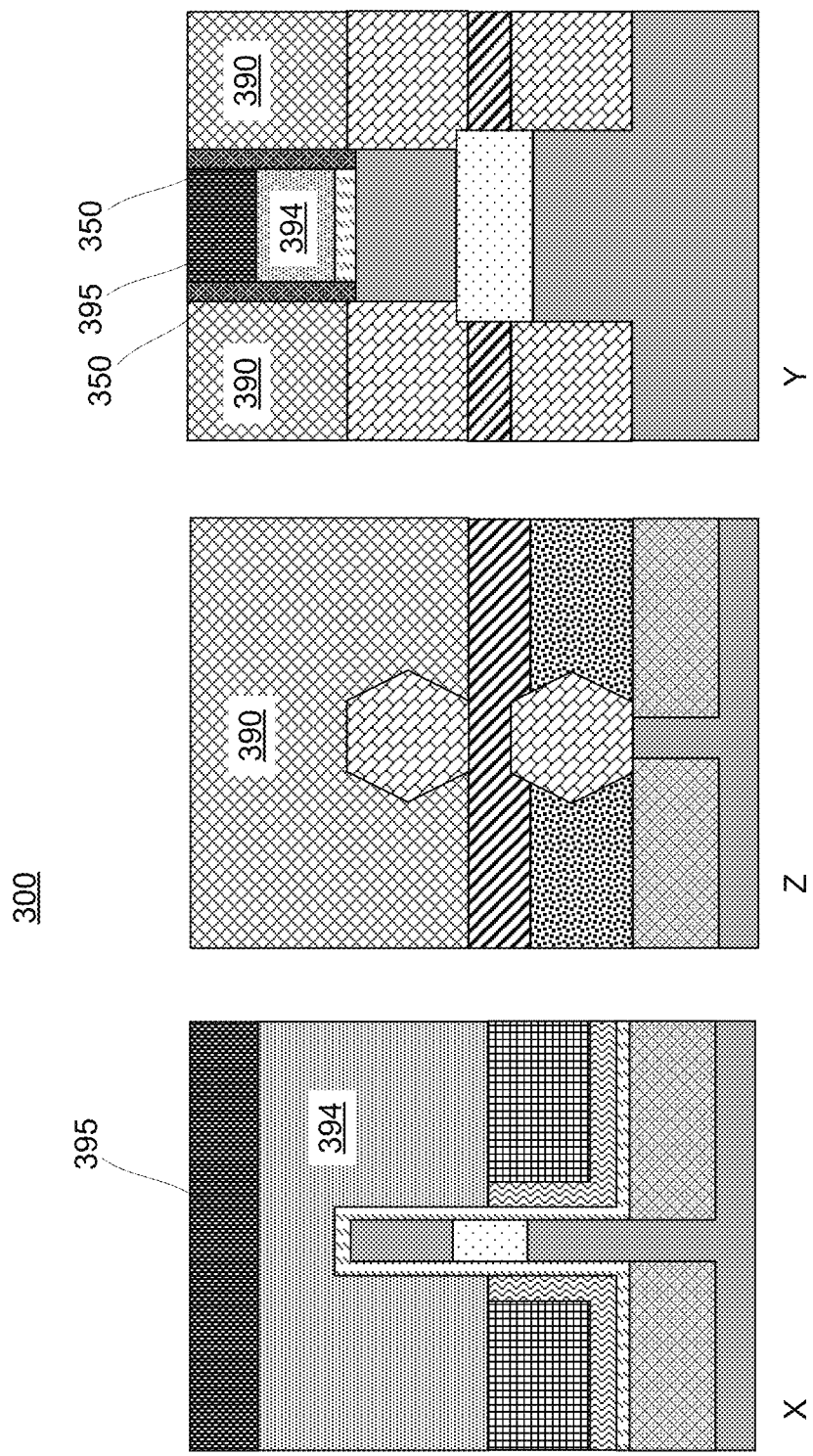

FIG. 39 depicts a cross-sectional view of a semiconductor device 300 shown after respective fabrication operations, in accordance with one or more embodiments. At the present fabrication operations, a replacement gate structure is formed within the gate opening 391, and the replacement gate structure is patterned (if needed). The replacement gate structure may include a gate dielectric layer portion (not shown), a work function metal layer portion (not shown), a gate conductor layer portion 394, a gate cap 395, or the like.

In some embodiments, a gate dielectric layer is formed over sidewalls and a bottom surface of the gate opening 391 and the topmost surface of the fill material 390. The gate dielectric layer may be formed by conformally depositing a dielectric material by CVD or atomic layer deposition (ALD) over the sidewalls and the bottom surface of the gate opening 391 and the topmost surface of the fill material 390. In one embodiment, the gate dielectric layer is composed of a high-k material having a dielectric constant greater than silicon oxide. Exemplary high-k materials include, but are not limited to, HfO2, ZrO2, La2O3, Al2O3, TiO2, SrTiO3, LaAlO3, Y2O3, HfOxNy, ZrOxNy, La2OxNy, Al2OxNy, TiOxNy, SrTiOxNy, LaAlOxNy, Y2OxNy, SiON, SiNx, a silicate thereof, and an alloy thereof. Each value of x is independently from 0.5 to 3 and each value of y is independently from 0 to 2. The gate dielectric layer may have a thickness from 0.9 nm to 10 nm, with a thickness ranging from 1.0 nm to 3 nm being more typical. In some embodiments, where the upper FinFET is to share a gate with the lower FinFET within the same fin 302, the gate dielectric layer may not be formed.

Subsequently, a work function metal layer may by conformally deposited. In one embodiment and when the fin 302 is provided for n-type FinFETs, the work function metal layer may include a first metal that effectuates an n-type threshold voltage shift. The work function of the work function metal layer may range from 4.1 eV to 4.3 eV. The work function metal layer may be formed by a suitable deposition process such as, for example, CVD, PVD or ALD. The work function metal layer that is formed may have a thickness ranging from 1 nm to 10 nm, although lesser and greater thicknesses can also be employed.

Next, a gate conductor 394 may be formed over the work function metal layer. The gate conductor 394 may include any conductive material including, for example, doped polysilicon, Al, Au, Ag, Cu or W. The gate conductor layer may be formed by a conventional deposition process such as, for example, CVD, PVD or ALD. Next, a gate cap 395 may be formed over the work gate conductor layer. The gate conductor cap 395 may include any dielectric material such as SiN, SiO, or the like. The gate conductor cap 395 may be formed by a conventional deposition process such as, for example, CVD, PVD or ALD.

Portions of the work function metal layer, the gate conductor 394, the gate dielectric layer (not shown), and gate cap 395 that are located above the topmost surface of the fill material 390 are removed by employing a planarization process, such as, for example, CMP. As such, the top surface of the replacement gate structure may be coplanar with the top surface of fill material 390.

Next, the replacement gate structure may be patterned or otherwise cut. The replacement gate structure may be patterned by lithography and etching. The lithographic step includes applying a photoresist layer (not shown) atop the replacement gate structure and fill material 190, exposing the photoresist layer to a desired pattern of radiation, and developing the exposed photoresist layer utilizing a conventional resist developer. The etching process may be a dry etch and/or a wet chemical etch. The etching process transfers the pattern from the patterned photoresist layer to the replacement gate structure. The etching may be elective to the material(s) of isolation layer 332 (if present), isolation regions 330, or the like. After forming the upper gate 104, the patterned photoresist layer can be removed utilizing a conventional resist stripping process.

Figure 40:
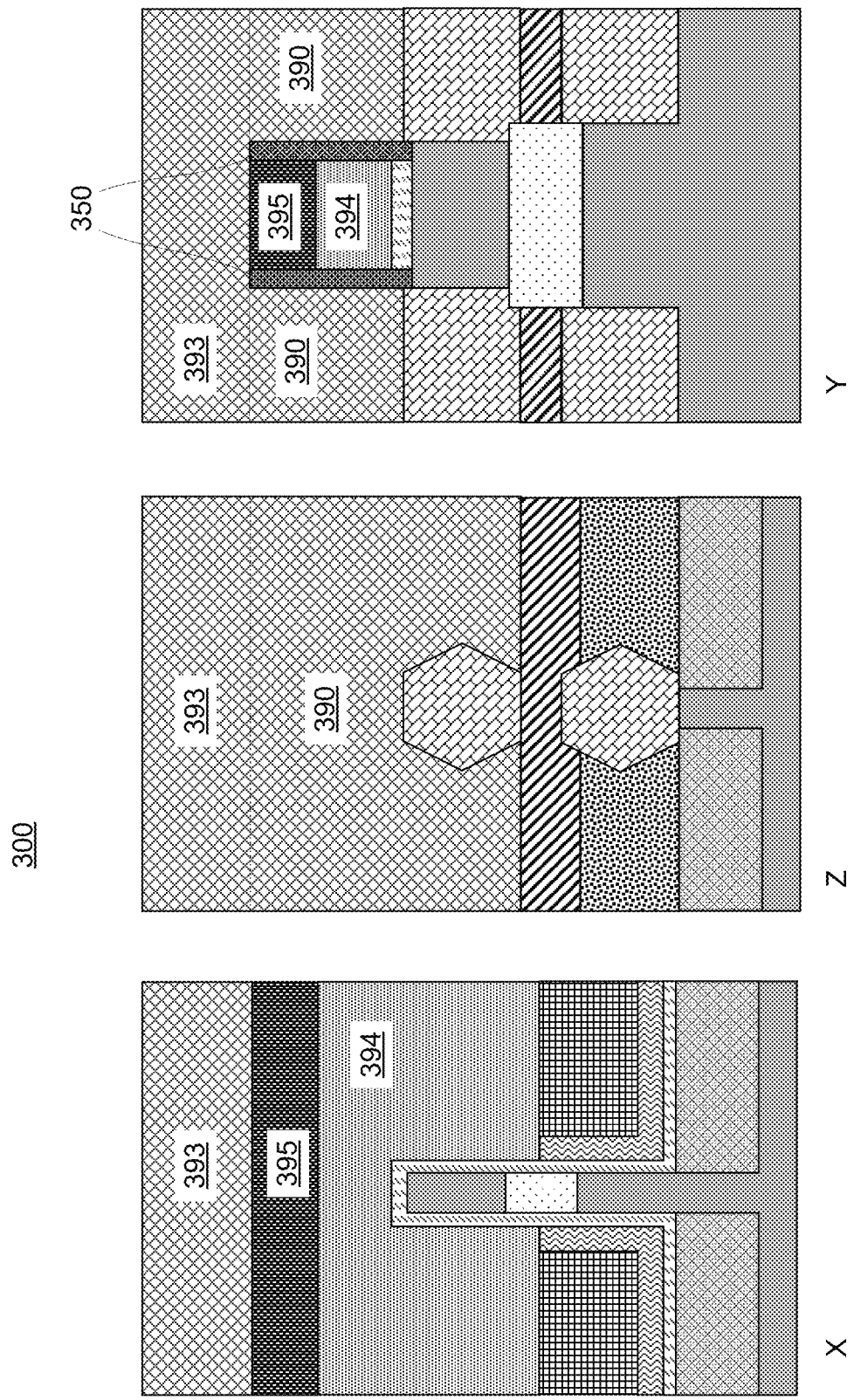

FIG. 40 depicts a cross-sectional view of a semiconductor device 300 shown after respective fabrication operations, in accordance with one or more embodiments. At the present fabrication operations, fill material 393 is formed.

Figure 41:
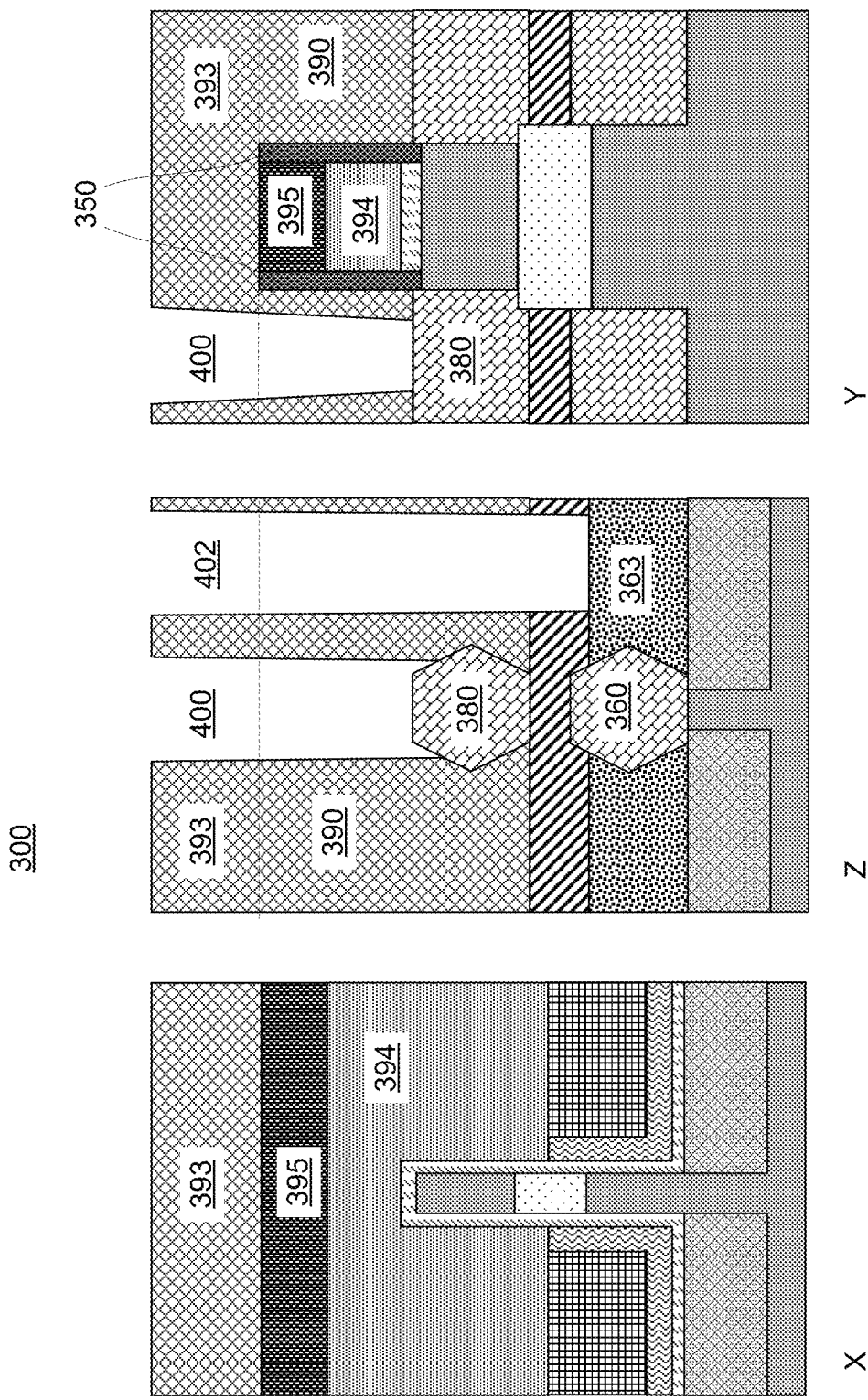

Fill material 393 may be an ILD that is formed over the fill material 390, over the replacement gate structure, and over the gate spacer 350. The ILD may include a dielectric material such as undoped silicon oxide, doped silicon oxide, silicon nitride, porous or non-porous organosilicate glass, porous or non-porous nitrogen-doped organosilicate glass, or a combination thereof. The ILD layer may be formed by CVD, PVD or spin coating. The ILD layer may be subsequently planarized, for example, by CMP and/or a recess etch FIG. 41 depicts a cross-sectional view of a semiconductor device 300 shown after respective fabrication operations, in accordance with one or more embodiments. At the present fabrication operations, upper S/D contact opening 400 is formed and lower S/D contact opening 402 is partially formed.

Upper S/D contact opening 400 may be formed by removing fill material 391 and fill material 390 above each of the upper source/drain regions, respectively. Upper S/D contact opening 400 may be removed by known patterning, lithography, etching, etc. techniques. Upper S/D contact opening 400 may expose at least a portion of the underlying upper source/drain region 380 or upper drain/source region 382, respectively.

Lower S/D contact opening 402 may be formed by removing fill material 391 and fill material 390 above lower S/D contact sacrificial material 363, respectively. Lower S/D contact opening 402 may be removed by known patterning, lithography, etching, etc. techniques. Lower S/D contact opening 402 may expose at least a portion of the underlying lower S/D contact sacrificial material 363 that contacts lower S/D region 360, and that contacts lower S/D region 362, respectively.

Figure 42:
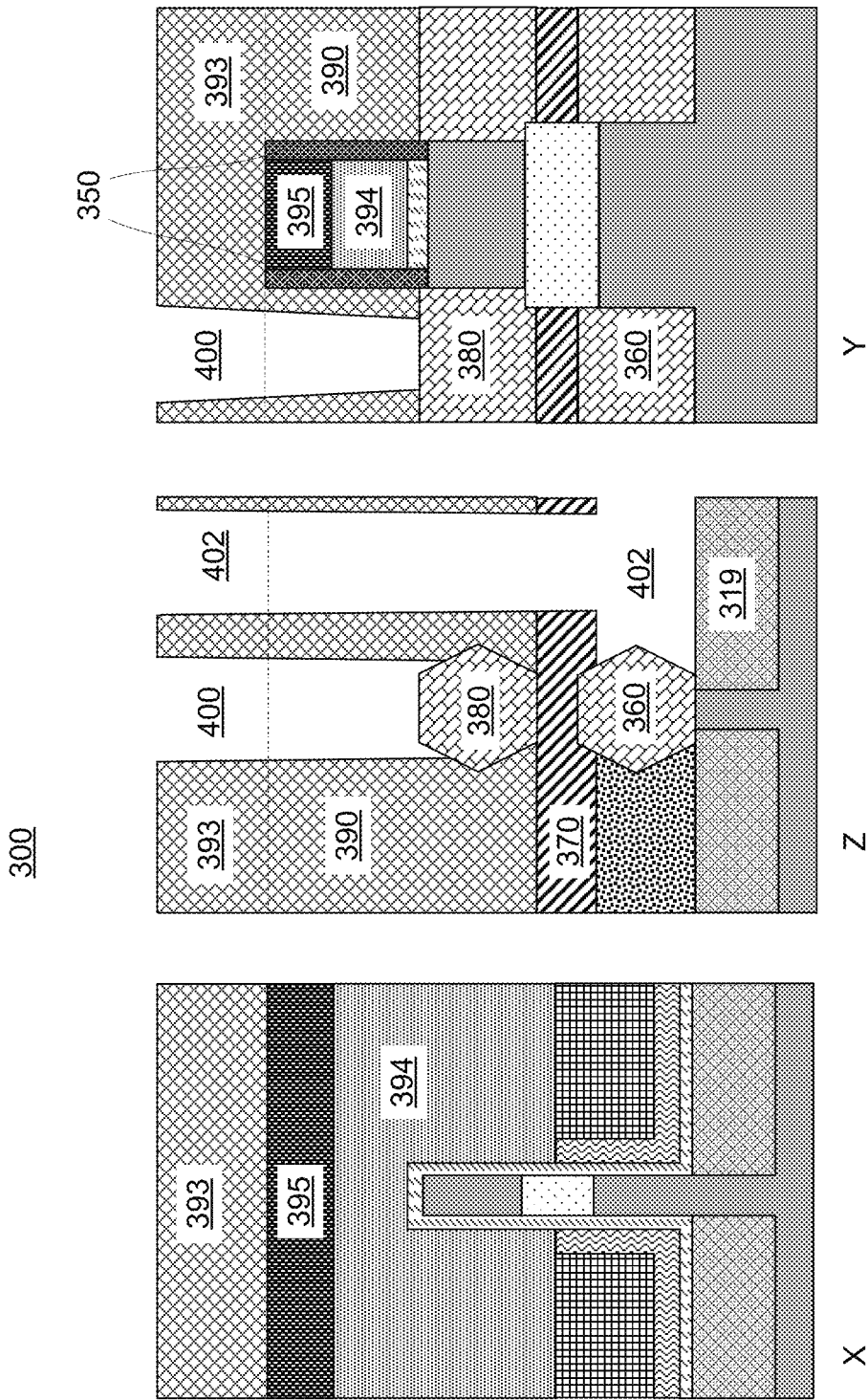

FIG. 42 depicts a cross-sectional view of a semiconductor device 300 shown after respective fabrication operations, in accordance with one or more embodiments. At the present fabrication operations, a lower S/D contact opening 402 is formed removing lower S/D contact sacrificial material 363 and exposing a portion of lower S/D region 360 or lower S/D region 362, respectively.

Lower S/D contact opening 402 may be formed by removing lower S/D contact sacrificial material 363 and exposing a side surface of a portion of lower S/D region 360 or a side surface of a portion of lower S/D region 362, respectively. Removal of lower S/D contact sacrificial material 363 may be accomplished utilizing known etching, etc. techniques. As such, lower S/D contact opening 402 may expose at least a side surface of a portion of the lower S/D region 360, or a side surface of a portion of the lower S/D region 362, respectively.

Figure 43:
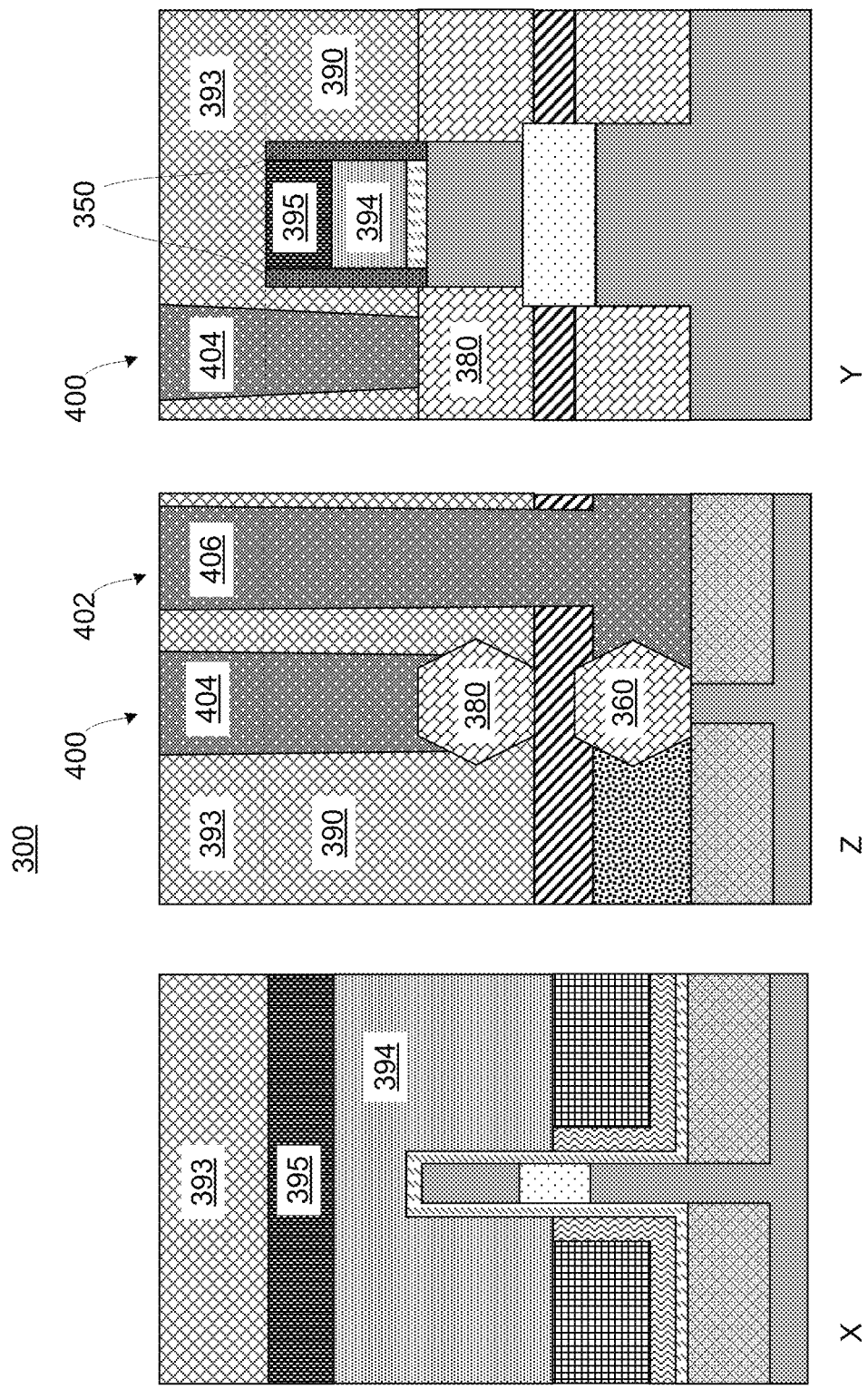

FIG. 43 depicts a cross-sectional view of a semiconductor device 300 shown after respective fabrication operations, in accordance with one or more embodiments. At the present fabrication operations, upper S/D contact 404 and lower S/D contact 406 are formed.

Upper S/D contact 404 and lower S/D contact 406 may be formed by depositing a conductive material within S/D contact openings 400, 402. Exemplary upper S/D contact 404 and lower S/D contact 406 materials may include a silicide liner, such as Ti, Ni, NiPt, etc, followed by adhesion metal liner, such as TiN, TaN, TiC, etc, followed by conductive low resistance metal fill, such as W, Co, Ru, Cu, etc. After metal deposition, a contact metal CMP process can be used to remove excessive contact metals that are deposited over fill material 393.

Figure 44:
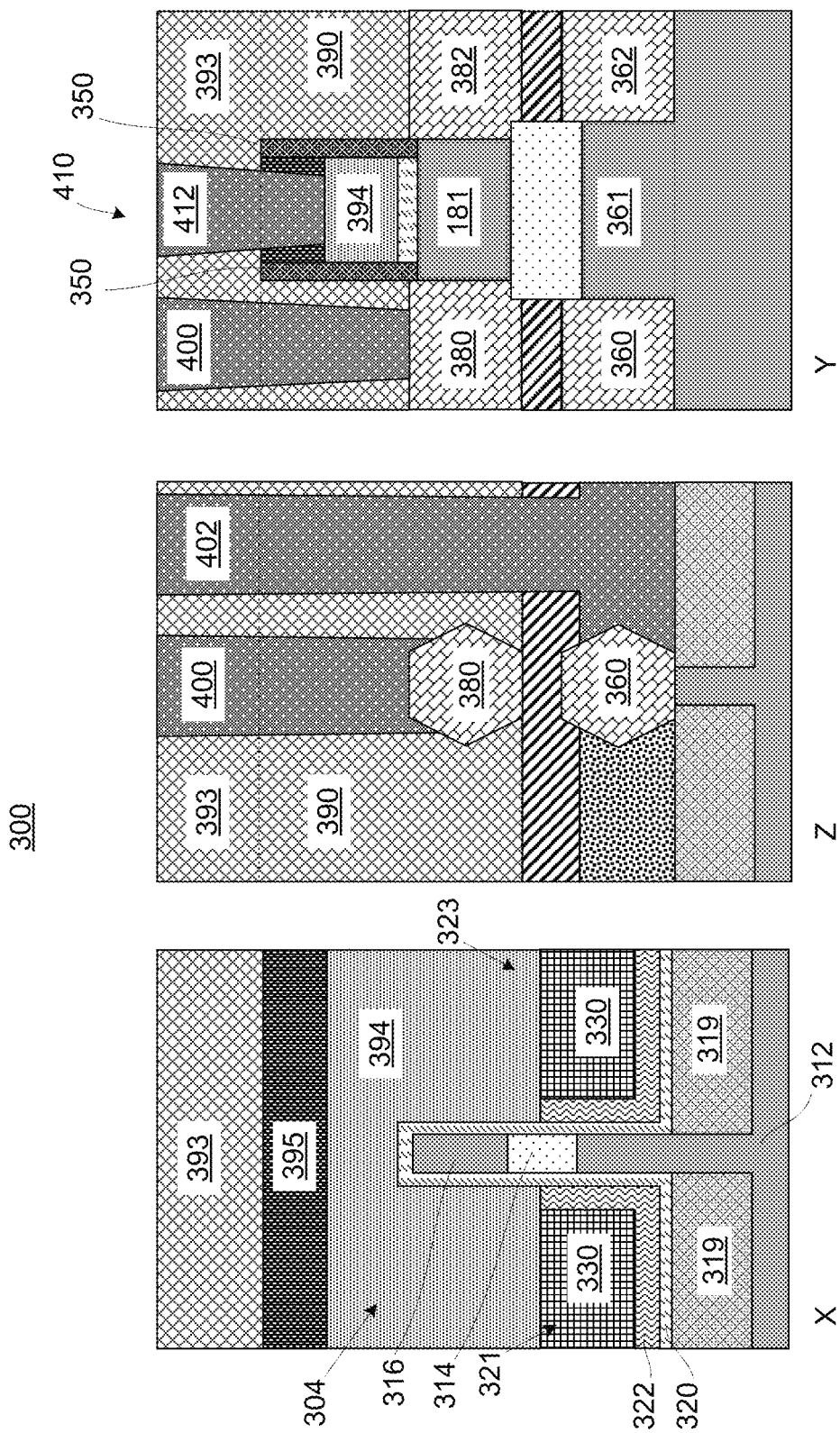

FIG. 44 depicts a cross-sectional view of a semiconductor device 300 shown after respective fabrication operations, in accordance with one or more embodiments. At the present fabrication operations, a gate contact opening 410 is formed and a gate contact 412 is formed therein.

Gate contact opening 410 may be formed by removing a portion of fill material 393 and at least a portion of gate cap 395 between spacers 350 to expose a portion of gate conductor 394. Removal of fill material 393 and at least a portion of gate cap 395 may be accomplished utilizing known etching, etc. techniques. As such, gate contact opening 410 may expose at least a portion of the top surface of gate conductor 394.

Gate contact 412 may be formed by depositing a conductive material within gate contact opening 410. Exemplary upper gate contact 412 materials may include a silicide liner, such as Ti, Ni, NiPt, etc, followed by adhesion metal liner, such as TiN, TaN, TiC, etc, followed by conductive low resistance metal fill, such as W, Co, Ru, Cu, etc. After metal deposition, a contact metal CMP process can be used to remove excessive contact metals that are deposited over fill material 393.

For clarity, as depicted in FIG. 44, semiconductor device 300 may include an gate 304 that is the gate for an upper FinFET and an lower FinFET associated with the same fin 302. For example, upper gate 304 includes gate conductor 394 that is over channel region 381 of a upper FinFET. The gate conductor 394 may be formed directly upon lower gate 321, 323. Lower gate 321, 323 is the gate associated with a lower FinFET below the upper FinFET in the same fin 302. Because the gate conductor 394 contacts or is formed directly upon lower gate 321, 323, a single effective gate 304 may be shared by the upper FinFET and the lower FinFET of the same fin 302.

Figure 45:
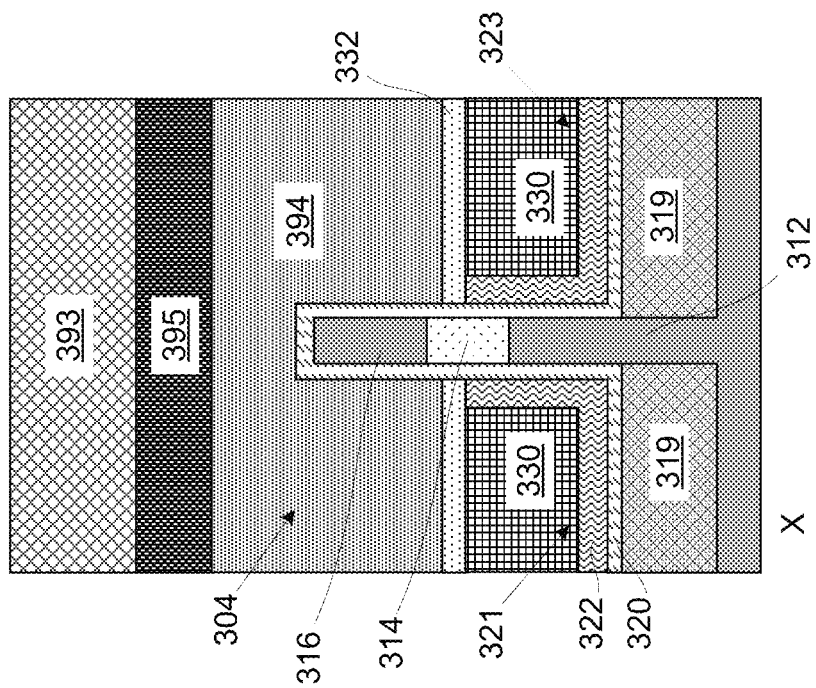

Alternatively, as depicted in FIG. 45, semiconductor device 300 may include an gate 304 that is the gate for an upper FinFET but is separated from a gate of lower FinFET associated with the same fin 302. For example, upper gate 304 includes gate conductor 394 that is over channel region 381 of a upper FinFET. The gate conductor 394 may be formed directly upon isolation layer 332. Lower gate 321, 323 is the gate associated with a lower FinFET below the upper FinFET in the same fin 302. Because the gate conductor 394 is isolated or physically separated from lower gates 321, 323, there are different or separate gates that are not shared by the upper FinFET and the lower FinFET of the same fin 302. In such embodiments, semiconductor device 300 may undergo further fabrication operations, such as formation of a lower gate contact 321, 323 contact, or the like.

The lower gate 321 and lower gate 321 may be associated with that same fin 302. The lower gate 321 may have a substantially vertical portion on one side of fin 302 upon the lower channel region 361 and may have a substantially horizontal portion upon the STI region 319 on one side of the fin 302. Similarly, the lower gate 323 may have a substantially vertical portion upon the other side of fin 302 upon the lower channel region 163 and may have a substantially horizontal portion upon the STI region 119 on the other side of the fin 302. As such, the lower gate 321 and lower gate 323 may have a separated "L" shape and backwards "L" shape, or the like, respectively.

Figure 46:
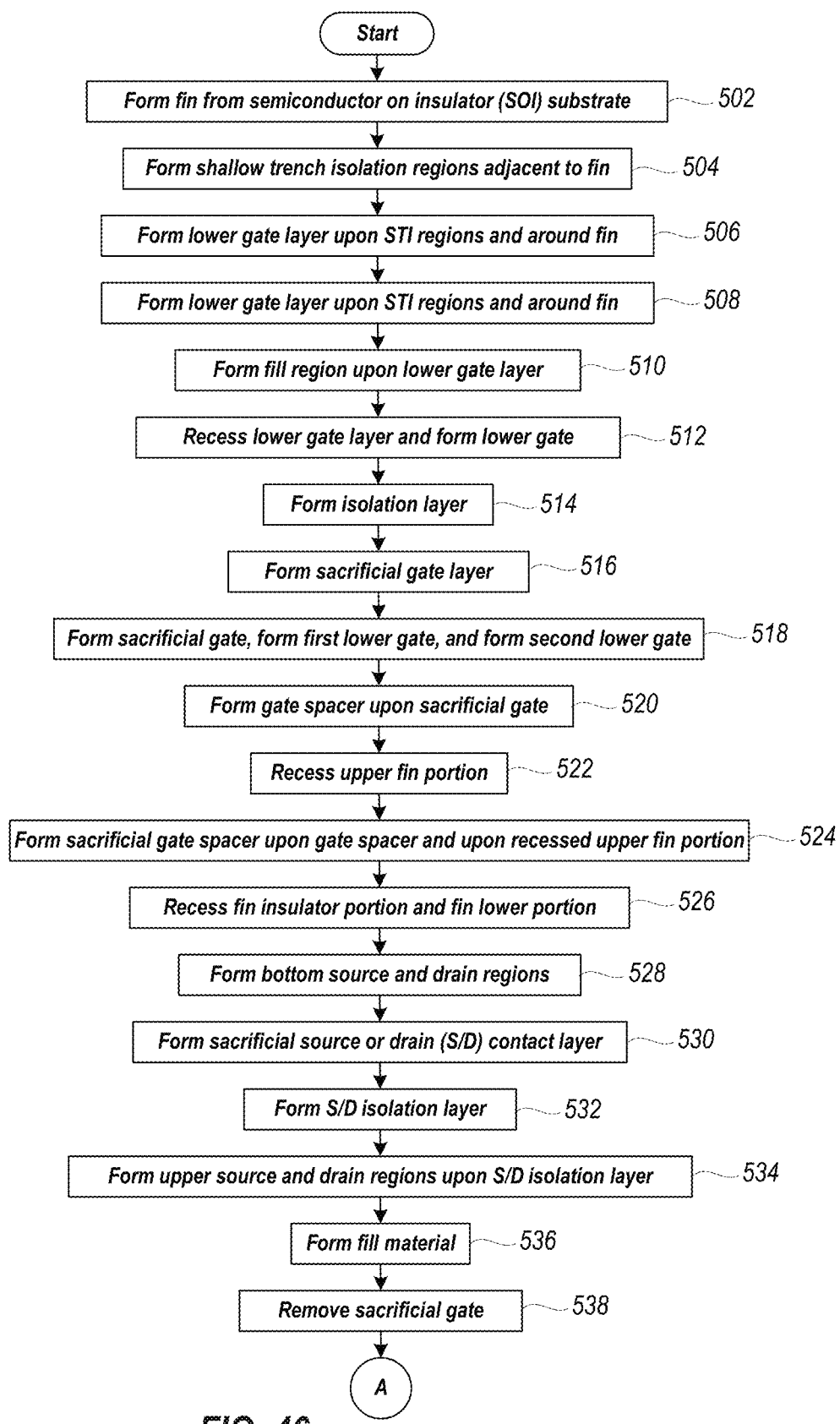
FIG. 46 and FIG. 47 depict a flow diagram illustrating a semiconductor device fabrication method, in accordance with one or more embodiments.
Figure 47:
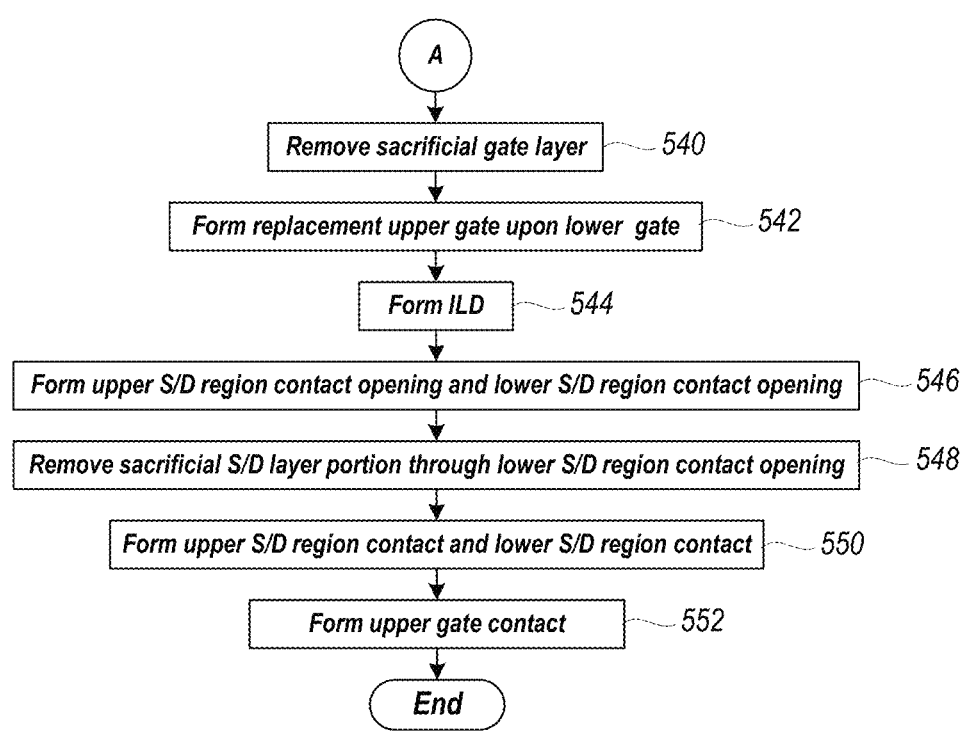

FIG. 46 is a flow diagram illustrating a semiconductor device 300 fabrication method 500, in accordance with one or more embodiments. Method 500 begins with forming a fin 302 from substrate 310 (block 502). Method 500 may continue with forming STI region(s) 319 adjacent to fin 310 (block 504). Method 200 may continue with forming gate dielectric layer 320 upon the STI region(s) and upon and around fin 302 and with forming a lower gate layer, such as work function layer 322 upon the gate dielectric layer 320 (block 506).

Method 500 may continue with forming fill region(s) 330 upon the lower gate layer (block 510) and removing the lower gate layer above the top surface of the fill region 330 (block 512). The removal of the lower gate layer above the top surface of the fill region 330 may partially form lower gate 321 and lower gate 323. Method 500 may continue with forming isolation layer 332 (block 514) according to whether a top FinFET should or should not share a gate with a bottom FinFET that are associated with the same FinFET fin 302.

Method 500 may continue with forming sacrificial gate layer 324 upon the isolation layer 332, if formed, or upon the partially formed lower gate 321, 323 and upon fill region 330 if isolation layer 332 is not formed (block 518).

Method 500 may continue with forming a sacrificial gate structure upon the sacrificial gate layer 324 (block 518) by forming one or more sacrificial gate structure layers. The patterning of the sacrificial gate structure layer(s) may further pattern the partially formed lower gate(s) 321, 323 to subsequently form the lower gate(s) 321, 323. The sacrificial gate structure layers may be patterned simultaneously with or separate from the patterning of the lower gate 321 and lower gate 323.

Method 500 may continue with forming gate spacer 350 around the sacrificial gate structure (block 520). Method 500 may continue with forming upper channel region 316 within fin 102 by recessing fin 302 layer 316 outside the footprint of the gate spacer 350 (block 522). Method 500 may continue with forming sacrificial spacer 354 upon gate spacer 350 and the end surfaces of the upper channel region 316 (block 524).

Method 500 may continue with forming channel region 316 portion within fin 302 and with forming lower channel region 361 by recessing fin 302 layer 316 and fin 302 layer 312 outside the footprint of the sacrificial spacer 354 (block 526).

Method 500 may continue with forming lower source/drain region 360 and lower drain/source region 362 such that the lower source/drain region 360 and lower drain/source region 362 are in physical contact with the lower channel region 261 (block 528). Method 500 may continue with forming sacrificial S/D contact layer 363 upon STI region 319 and upon the lower drain/source region 362 (block 530).

Method 500 may continue with removing forming S/D isolation layer 370 upon the lower S/D regions and upon the end surfaces of the dielectric portion 314 of fin 302 (block 532). Method 500 may continue with removing the sacrificial gate spacer 354 to expose the end surfaces of upper channel region 381 and with forming upper source/drain region 380 and upper drain/source region 382 therefrom and upon the S/D isolation layer 370 (block 534).

Method 500 may continue with forming fill material 390 upon the upper S/D regions, upon the S/D isolation layer 370, and upon the gate spacer 350 (block 536). Method 500 may continue with removing the sacrificial gate structure and forming gate opening 191 (block 391). The gate opening 391 generally exposes the sacrificial gate layer 324.

Method 500 may continue with removing the sacrificial gate layer 324 above the top surface of fill region 330 thereby exposing a respective top surface of the lower gate 321 and of the lower gate 323 (if isolation layer 332 is not present) or thereby exposing a top surface of the isolation layer 332 (block 540). Method 500 may continue with forming a replacement gate structure within the gate opening 391 upon the isolation layer 332 or the upper surface of lower gate(s) 321, 323, as desired (block 542).

Method 500 may continue with forming fill material 393 upon fill material 390 and upon the replacement gate structure (block 544). Method 500 may continue with forming upper source/drain region 380 opening 400, with forming upper drain/source region 382 opening 400, with forming lower source/drain region 360 opening 402, and/or with forming lower drain/source region 362 opening 402 (block 546).

Method 500 may continue with removing at least a portion of the lower S/D contact sacrificial material 363 thereby exposing a portion of the lower source/drain region 360 and/or lower drain/source region 362 via the appropriate opening 402 (block 548). Method 500 may continue with forming an upper S/D region contact 404 within the opening 400 and with forming a lower S/D region contact 406 within the opening 402 (block 550). Method 500 may similarly continue with forming replacement gate structure opening 410 thereby exposing a portion of the replacement gate structure (e.g., the gate conductor layer portion 394) and with forming a gate contact 412 within the opening 410.

The method flow diagrams depicted herein are exemplary. There can be many variations to the diagrams or operations described therein without departing from the spirit of the embodiments. For instance, the operations can be performed in a differing order, or operations can be added, deleted or modified. All of these variations are considered a part of applicable claimed embodiments.

The descriptions of the various embodiments of the present invention have been presented for purposes of illustration but are not intended to be exhaustive or limited to the embodiments described. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

What is claimed is:

1. A semiconductor device comprising:
   a first fin comprising a first bottom channel portion, a first top channel portion, and a first channel isolator between the first bottom channel portion and the first top channel portion;
   a second fin comprising a second bottom channel portion, a second top channel portion, and a second channel isolator in direct contact with the second bottom channel portion and in direct contact with the second top channel portion;
   a first lower gate comprising a first vertical portion upon the first bottom channel portion and upon the first channel isolator;
   a second lower gate comprising a second vertical portion upon the second bottom channel portion and upon the second channel isolator;
   an isolation layer in direct contact with the second lower gate and upon the second channel isolator; and
   an upper gate in direct contact with the first lower gate, upon the first channel isolator, upon the first top channel portion, in direct contact with the isolation layer, and upon the second top channel portion.

2. The semiconductor device of claim 1, further comprising a shallow trench isolation (STI) region in physical contact with the first bottom channel portion and with the second bottom channel portion.

3. The semiconductor device of claim 2, wherein the first lower gate further comprises a first horizontal portion upon the STI region that extends from a bottom of the first vertical portion and wherein the second lower gate further comprises a second horizontal portion upon the STI region that extends from a bottom of the second vertical portion.

4. The semiconductor device of claim 3, further comprising fill material upon the STI region between the first horizontal portion and the second horizontal portion.

5. The semiconductor device of claim 4, wherein a top surface of the fill material is coplanar with a top surface of the first vertical portion and is coplanar with a top surface of the second vertical portion.

6. The semiconductor device of claim 5, wherein isolation layer is further upon the top surface of the fill material.

7. The semiconductor device of claim 6, wherein the isolation layer physically separates the second lower gate from the upper gate.

8. The semiconductor device of claim 7, wherein the isolation layer is between an upper surface and lower surface of the first channel isolator and is between an upper surface and lower surface of the second channel isolator.

9. The semiconductor device of claim 8, wherein end surfaces of the first top channel portion are inset from end surfaces of the first channel isolator and are inset from end surfaces of the first bottom channel portion.

10. A semiconductor device comprising:
    a fin comprising a bottom channel portion, a top channel portion, and a channel isolator between the bottom channel portion and the top channel portion;
    a gate dielectric directly upon and continuously around the fin;
    a lower gate comprising a first vertical portion directly upon the gate dielectric, upon first respective sides of the bottom channel portion, and upon the channel isolator and a second vertical portion directly upon the gate dielectric, upon second respective sides of the bottom channel portion, and upon the channel isolator;
    an isolation layer directly upon the lower gate directly upon the gate dielectric, and upon the channel isolator; and
    an upper gate directly upon isolation layer, directly upon the gate dielectric, upon the channel isolator, and upon the top channel portion.

11. The semiconductor device of claim 10, further comprising a first shallow trench isolation (STI) region in direct contact with the first side of the bottom channel portion and a second STI region in direct contact with the second side of the bottom channel portion.

12. The semiconductor device of claim 11, wherein the lower gate further comprises a first horizontal portion upon the first STI region that extends from a bottom of the first vertical portion and a second horizontal portion upon the second STI region that extends from a bottom of the second vertical portion.

13. The semiconductor device of claim 12, further comprising first dielectric fill material directly upon the first STI region, directly upon the first horizontal portion, and the directly upon the isolation layer and second fill material directly upon the second STI region, directly upon the second horizontal portion, and directly upon the isolation layer.

14. The semiconductor device of claim 13, wherein a top surface of the first fill material is coplanar with a top surface of the second fill material, is coplanar with a top surface of the first vertical portion, and is coplanar with a top surface of the second vertical portion.

15. The semiconductor device of claim 14, wherein isolation layer is further directly upon the top surface of the first fill material and directly the top surface of the second fill material.

16. The semiconductor device of claim 15, wherein the isolation layer physically separates the lower gate from the upper gate.

17. The semiconductor device of claim 10, wherein the isolation layer is substantially horizontal and between an upper surface and lower surface of the channel isolator.

18. The semiconductor device of claim 17, wherein end surfaces of the top channel portion are inset from end surfaces of the channel isolator and are inset from end surfaces of the bottom channel portion.

19. A semiconductor device fabrication method comprising:
- forming a first fin comprising a first bottom channel portion, a first top channel portion, and a first channel isolator between the first bottom channel portion and the first top channel portion;
- forming a second fin comprising a second bottom channel portion, a second top channel portion, and a second channel isolator between the second bottom channel portion and the second top channel portion;
- forming a shallow trench isolation region between the first fin and the second fin;
- forming a lower gate layer upon the first fin, upon the shallow trench isolation region, and upon the second fin;
- separating the lower gate layer and forming a first lower gate comprising a first vertical portion upon the first bottom channel portion and a first horizontal portion upon the shallow trench isolation region and forming a second lower gate comprising a second vertical portion upon the second bottom channel portion and a second horizontal portion upon the shallow trench isolation region;
- forming fill material upon the shallow trench isolation layer between the first lower gate and the second lower gate;
- forming an isolation layer upon the second lower gate and upon the fill material;
- forming an upper gate upon the first lower gate, upon the first top channel portion, upon the isolation layer, and upon the second top channel portion.

20. The semiconductor device fabrication method of claim 19, wherein the isolation layer physically separates the second lower gate from the upper gate.

* * * * *